(12) United States Patent
Kageyama

(10) Patent No.: US 8,542,852 B2
(45) Date of Patent: Sep. 24, 2013

(54) ELECTRO-MECHANICAL TRANSDUCER, AN ELECTRO-MECHANICAL CONVERTER, AND MANUFACTURING METHODS OF THE SAME

(75) Inventor: Kensuke Kageyama, Kita-ku (JP)

(73) Assignee: National University Corporation Saitama University, Saitama-shi (JP)

( * ) Notice: Subject to any disclaimer, the term of this patent is extended or adjusted under 35 U.S.C. 154(b) by 380 days.

(21) Appl. No.: 12/936,770

(22) PCT Filed: Apr. 7, 2009

(86) PCT No.: PCT/JP2009/057145
§ 371 (c)(1),
(2), (4) Date: Jan. 7, 2011

(87) PCT Pub. No.: WO2009/125773
PCT Pub. Date: Oct. 15, 2009

(65) Prior Publication Data
US 2011/0108838 A1    May 12, 2011

(30) Foreign Application Priority Data

Apr. 7, 2008  (JP) ................. 2008-099674
Oct. 21, 2008 (JP) ................. 2008-271288

(51) Int. Cl.
*H04R 25/00* (2006.01)

(52) U.S. Cl.
USPC ............ 381/191; 381/173; 381/178; 381/355

(58) Field of Classification Search
USPC ................. 381/113, 122, 173, 178, 191, 355
See application file for complete search history.

(56) References Cited

U.S. PATENT DOCUMENTS 6,806,593 B2 * 10/2004 Tai et al. ............... 307/400
7,003,127 B1    2/2006 Sjursen et al.
8,265,287 B2 *  9/2012 Kageyama ................. 381/59
2003/0035558 A1* 2/2003 Kawamura et al. ........ 381/113
2009/0202083 A1 8/2009 Kageyama

FOREIGN PATENT DOCUMENTS

| JP | 43 26262 | 11/1968 |
| JP | 4-336799 A | 11/1992 |
| JP | 2000 13894 | 1/2000 |
| JP | 2002 534933 | 10/2002 |
| JP | 2007 298297 | 11/2007 |

OTHER PUBLICATIONS

Office Action issued Oct. 9, 2012 in Japanese Patent Application No. 2010-507250 (with English-language translation).
International Search Report issued Jul. 7, 2009 in PCT/JP09/057145 filed Apr. 7, 2009.
International Preliminary Report issued Nov. 30, 2010 in PCT/JP09/057145 filed Apr. 7, 2009.

* cited by examiner

*Primary Examiner* — Matthew E Warren
(74) *Attorney, Agent, or Firm* — Oblon, Spivak, McClelland, Maier & Neustadt, L.L.P.

(57) ABSTRACT

An electro-mechanical transducer contains a vibrating electrode (15b), a vibrating-electrode-insulating film (15a) disposed at a bottom surface of the vibrating electrode (15b), an electret layer (13) facing to the vibrating electrode (15b), an electret-insulating layer (14e) joined to a top surface of the electret layer (13), and a back electrode 17 in contact with a bottom surface of the electret layer (13). A microgap between ten nanometers and 100 micrometers is established between the vibrating-electrode-insulating film (15a) and electret-insulating layer (14e). A central line average roughness Ra of the vibrating electrode (15b), including a bending, is 1/10 or less of a gap width measured between the bottom surface of the vibrating electrode (15b) and the top surface of the electret layer (13).

14 Claims, 45 Drawing Sheets

FIG. 11
(a) 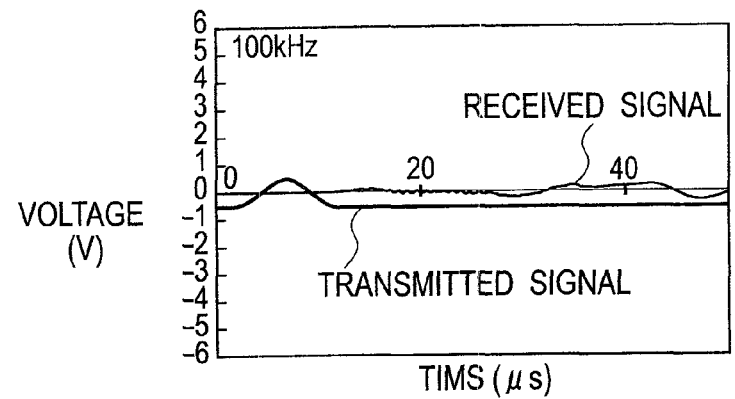
(b) 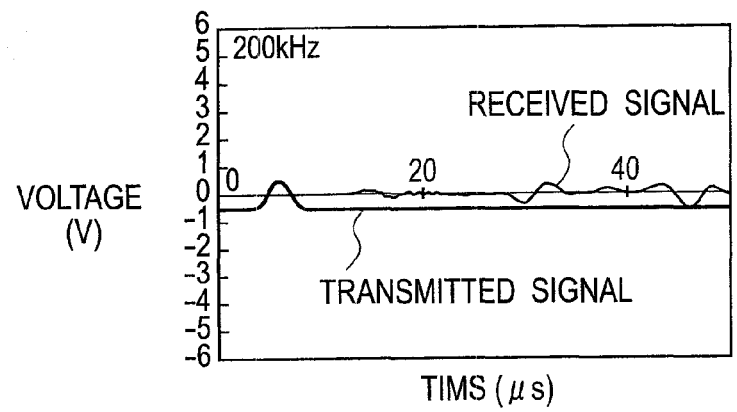
(c) 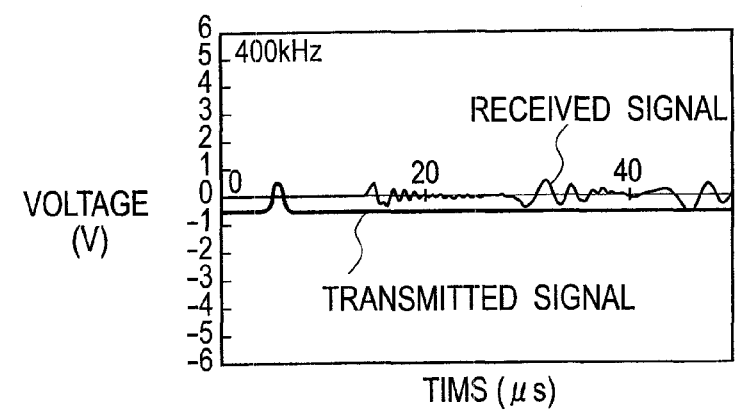
(d) 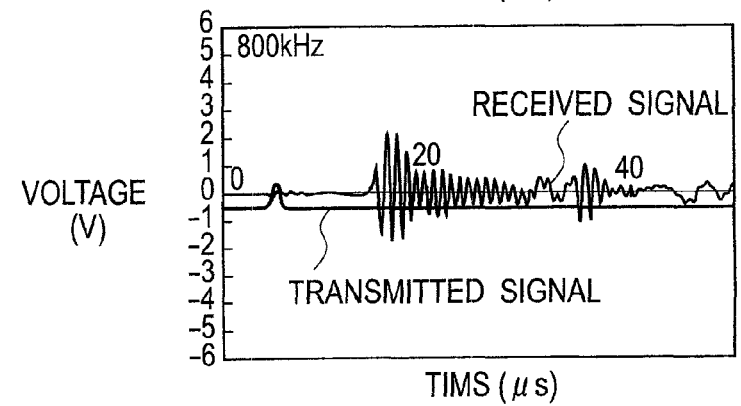

FIG.16
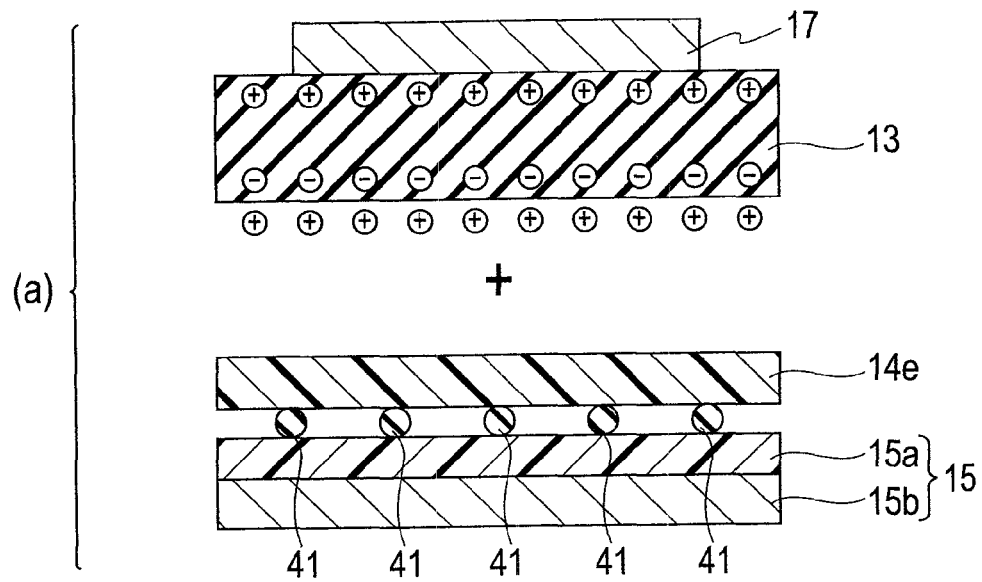
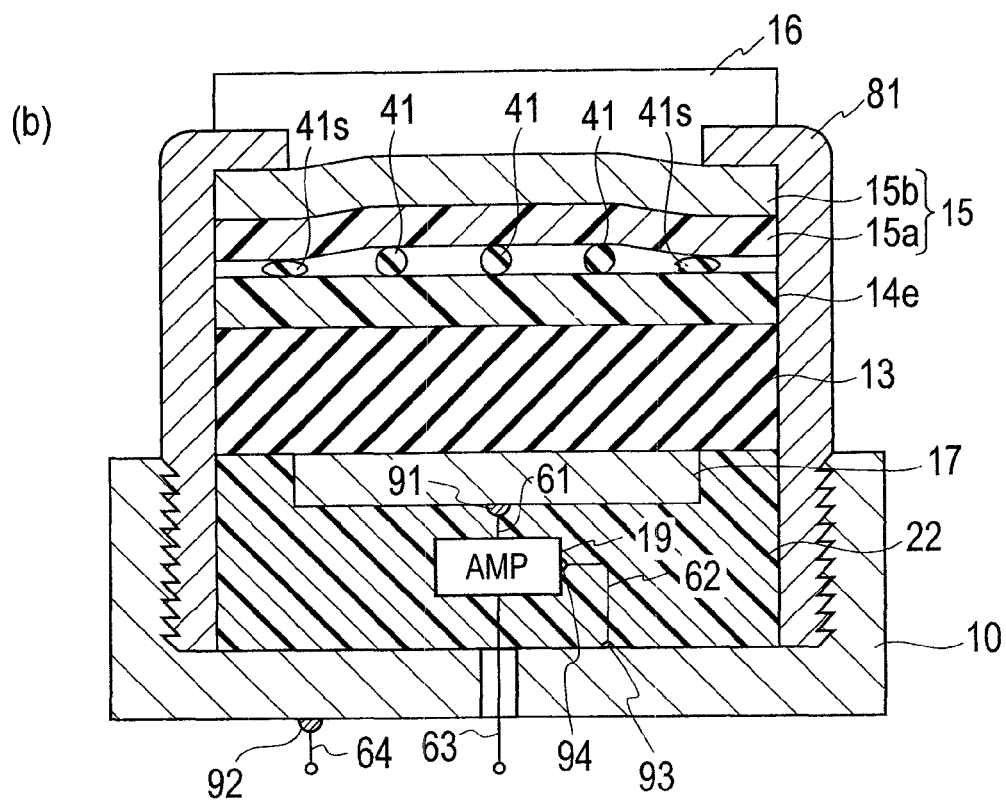

FIG. 40
(a) 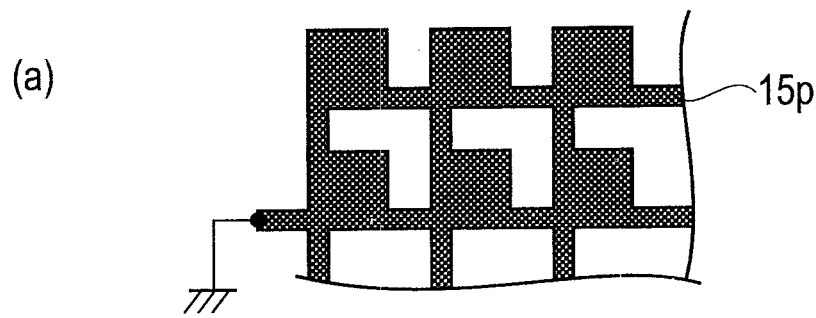
(b) 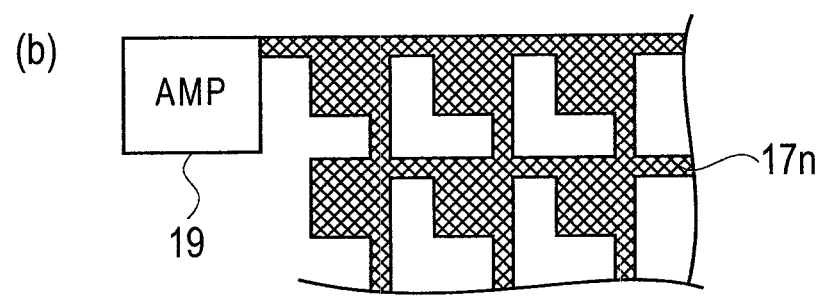
(c) 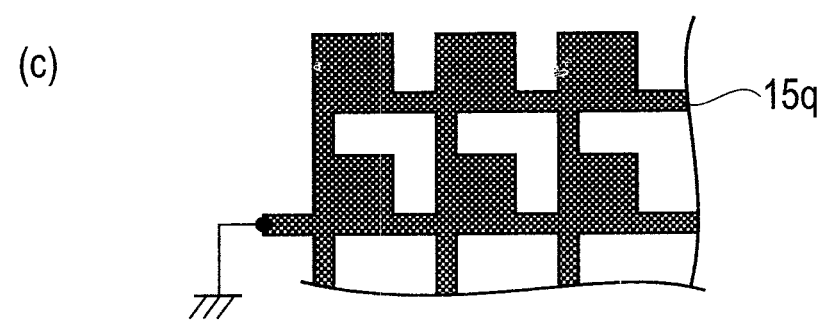

ELECTRO-MECHANICAL TRANSDUCER, AN ELECTRO-MECHANICAL CONVERTER, AND MANUFACTURING METHODS OF THE SAME

FIELD OF THE INVENTION

The present invention pertains to electro-mechanical transducers and electro-mechanical converters, which convert mechanical vibrations into electric signals, and manufacturing methods of the electro-mechanical transducers and the electro-mechanical converters.

DESCRIPTION OF THE RELATED ART

In a mobile telephone and the like, microphones are required to be miniaturized for the sake of space-saving design. Also, as a pickup microphone for acoustic equipment, a small microphone that can be easily incorporated into musical instrument, such as a guitar and the like, is required. In particular, in order to make the mobile telephone or the like waterproof, there is the demand for a miniaturized waterproof microphone.

A certain kind of polymers, such as polycarbonate and the like, has a property that, when a high electric field is applied from outside, charges induced on a surface are quasi-permanently held. O. Heaviside coined the term "electret" for material in a state in which the charges are quasi-permanently maintained. As compared with a dynamic microphone having a structure in which a coil (voice coil) merged with a vibrating plate is driven by a magnetic field, an electret condenser microphone (ECM) is designed such that the electret is arranged close to and in parallel with the vibrating plate. And, when the vibrating plate is driven by sound, because the distance from the electret is varied, the charged states of the electret are changed, and sound signals can be extracted as oscillating electric signals. However, since the oscillating electric signals are very small, the oscillating electric signals are amplified by a field effect transistor that is buried in a microphone unit.

In order to improve the performance of ECMs, the amount of electret charges (polarization) on the polymer film is required to be increased. However, in a method of using corona discharge and converting the polymer films into the electret films, the amount of remnant polarization has a limit of about 30 $\mu C/m^2$. Also, the gap space between the electrodes of the ECM is required to be very clean. Thus, the manufacturing of the ECM is required to be carried out in clean environments such as a clean room.

On the other hand, as ferroelectric materials, there is material having the amount of remnant polarization, which is equal to or greater than 10,000 times of that of the electret film. However, in order to use as the electret film, there are a problem of a necessity of removing the influence of charged particles adsorbed on the surface of the electret film, and other problems.

In view of the miniaturization of microphones, a miniaturization architecture in which the microphone is directly mounted on a semiconductor substrate (silicon substrate) is tried. For example, an architecture that encompasses a lower electrode and an extraction wiring, which are made of conductive films, is proposed (see Patent Document 1). In the proposed architecture, a membrane area, from which a part of a semiconductor substrate is selectively removed, is defined in the center of the semiconductor substrate, and the lower electrode is allocated in the inside of the membrane area so that parasitic capacitances can be reduced, thereby achieving a high performance ECM (see Patent Document 1). In the ECM proposed in Patent Document 1, the outer edges of a silicon nitride film, a silicon oxide film and a silicon nitride film are aligned respectively to overlap with the area of the semiconductor substrate so that the resonant frequency characteristics of the vibrating plate can be controlled.

On the other hand, an architecture, in which a PP film or a PTFE film is stretched and foamed so as to generate bubbles in the PP film or the PTFE film, is known. After bubbles are generated, discharge is excited in the insides of independent bubbles so as to implement an electret by the PP film or the PTFE film, and this electret is used for a flexible microphone in the pickup of the acoustic equipment.

[Patent Document 1] JP-P 2006-074102A

SUMMARY OF THE INVENTION

The method recited in Patent Document 1, by which the ECM is directly fabricated on the semiconductor substrate, embraces the problems such that the span of the bending of the membrane area, which is allocated in the area where the semiconductor substrate is selectively removed, becomes 1/10 or more of an air gap, and because the dielectric breakdown strength of air is low, the ECM cannot endure stronger sound pressures. In particular, since the silicon substrate is weak against impact pressures, a buffer layer is required even if the size of the silicon microphone itself is small.

Although the architecture using the porous film may improve the waterproof behavior, since the porous film attenuates the sound, the sensitivity of the ECM is decreased. Also, as for the architecture in which a film is changed into the electret, by using discharges in the insides of the bubbles in the porous PP film or PTFE film, when a temperature exceeds 100° C., because the electret is deteriorated, the available temperature range is narrow.

On the other hand, although PZT is being tried to be incorporated in a piezoelectric probe, because PZT can be used only at the resonant frequency, the operation of PZT in a wide frequency band is difficult.

In view of the above-mentioned problems, an object of the present invention is to provide an electro-mechanical transducer and an electro-mechanical converter, both of which are flexible, having high degrees of freedom in geometrical deformations, a high sensitivity and can withstand stronger sound pressures, and further, can be used in wide frequency bands, and to provide manufacturing methods of the electro-mechanical transducer and the electro-mechanical converter.

In order to achieve the above object, a first aspect of the present invention inheres in an electro-mechanical transducer encompassing (a) a vibrating electrode having a flat vibration surface under no load condition, (b) a vibrating-plate-insulating layer disposed at a bottom surface of said vibrating electrode, (c) an electret layer facing to the vibrating electrode, and (d) a back electrode in contact with a bottom surface of the electret layer, (e) wherein a microgap between ten nanometers and 100 micrometers is established between the vibrating-plate-insulating layer and the electret layer, and a central line average roughness Ra of the vibrating electrode, including a bending under a loaded condition, is 1/10 or less of a gap width measured between the bottom surface of the vibrating electrode and a top surface of the electret layer.

A second aspect of the present invention inheres in an electro-mechanical transducer encompassing (a) a vibrating electrode having a flat vibration surface under no load condition, (b) an electret layer facing to the vibrating electrode, (c) an electret-insulating layer joined to a top surface of the electret layer, and (d) a back electrode in contact with a bottom surface of the electret layer, (e) wherein a microgap between ten nanometers and 100 micrometers is established between the vibrating electrode and the electret-insulating layer, and a central line average roughness Ra of the vibrating electrode, including a bending under a loaded condition, is 1/10 or less of a gap width measured between a bottom surface of the vibrating electrode and the top surface of the electret layer.

A third aspect of the present invention inheres in an electro-mechanical transducer encompassing (a) a vibrating electrode having a flat vibration surface under no load condition, (b) a vibrating-plate-insulating layer disposed at a bottom surface of the vibrating electrode, (c) an electret layer facing to the vibrating electrode, (d) an electret-insulating layer joined to a top surface of the electret layer, (e) and a back electrode in contact with a bottom surface of the electret layer, (f) wherein a microgap between ten nanometers and 100 micrometers is tri established between the vibrating-plate-insulating layer and the electret-insulating layer, and a central line average roughness Ra of the vibrating electrode, including a bending under a loaded condition, is 1/10 or less of a gap width measured between the bottom surface of the vibrating electrode and the top surface of the electret layer.

A fourth aspect of the present invention inheres in a manufacturing method of an electro-mechanical transducer, encompassing (a) laminating a vibrating electrode on a vibrating-plate-insulating layer and implementing a vibrating plate, (b) reversing the vibrating plate, and providing a spacer on the vibrating-plate-insulating layer, (c) stacking an electret-insulating layer on the vibrating-plate-insulating layer through the spacer, (d) preparing an electret layer provided with a back electrode, and (e) mating the electret-insulating layer with the electret layer, by installing the electret layer provided with the back electrode, and a structure in which an electret-insulating layer is stacked through the spacer on the vibrating plate, into a receptacle.

A fifth aspect of the present invention inheres in a film-shaped electro-mechanical converter, encompassing a vibrating electrode; an electret layer facing to the vibrating electrode, establishing an element-install cavity between the vibrating electrode and the electret layer; a back electrode in contact with a bottom surface of the electret layer; at least one gap-insulating layer dividing an inside of the element-install cavity into upper and the lower directions so as to establish a plurality of microgaps in the inside the element-install cavity, each of the microgaps having an interval between ten nanometers and 40 micrometers, and the microgaps are stacked in the inside of the element-install cavity; and an amplifier electrically connected between the vibrating electrode and the back electrode. In film-shaped electro-mechanical converter according to the fifth aspect of the present invention, effective surface roughness of each of surfaces defining the plurality of microgaps is 1/10 or less of a gap width measured in the element-install cavity.

A sixth aspect of the present invention inheres in an electro-mechanical converter, encompassing (a) a board mounting an amplifying circuit, (b) a film-shaped lower element having: a lower vibrating electrode, at least a part of the lower vibrating electrode is in contact with a bottom surface of the board and the lower vibrating electrode is electrically connected to the amplifier; a lower electret layer facing to the lower vibrating electrode establishing a lower element-install cavity between the lower electret layer and the lower vibrating electrode; a lower back electrode in contact with a bottom surface of the lower electret layer, and at least one lower gap-insulating layer configured to divide an inside of the lower element-install cavity into upper and a lower directions so as to establish a plurality of lower microgaps in the inside of the lower element-install cavity, each of the lower microgaps having an interval between ten nanometers and 40 micrometers, and (c) a film-shaped upper element having: an upper back electrode, at least a part of the upper back electrode is in contact with a top surface of the board and the upper back electrode is electrically connected to the amplifying circuit; an upper electret layer in contact with a top surface of the upper back electrode; an upper vibrating electrode facing to the upper electret layer establishing an upper element-install cavity between the upper vibrating electrode and the upper electret layer; and at least one upper gap-insulating layer configured to divide an inside of the upper element-install cavity into upper and a lower directions so as to establish a plurality of upper microgaps in the inside of the upper element-install cavity, each of the upper microgaps having an interval between ten nanometers and 40 micrometers. In the electro-mechanical converter according to the sixth aspect of the present invention, effective surface roughness of each of surfaces defining the lower and upper microgaps is 1/10 or less of a gap width measured in the corresponding lower and upper element-install cavities, respectively.

A seventh aspect of the present invention inheres in a film-shaped electro-mechanical converter, encompassing (a) a common back electrode connected to an amplifying circuit, (b) a lower element having; a lower electret layer in contact with a bottom surface of the common back electrode; a lower vibrating electrode facing to the lower electret layer establishing a lower element-install cavity between the lower vibrating electrode and the lower electret layer; and at least one lower gap-insulating layer configured to divide an inside of the lower element-install cavity into upper and a lower directions so as to establish a plurality of lower microgaps in the inside of the lower element-install cavity, each of the lower microgaps having an interval between ten nanometers and 40 micrometers, and (c) an upper element having: an upper electret layer in contact with a top surface of the common back electrode; an upper vibrating electrode facing to the upper electret layer establishing an upper element-install cavity between the upper vibrating electrode and the upper electret layer; and at least one upper gap-insulating layer configured to divide an inside of the upper element-install cavity into upper and a lower directions so as to establish a plurality of upper microgaps in the inside of the upper element-install cavity, each of the upper microgaps having an interval between ten nanometers and 40 micrometers. In the film-shaped electro-mechanical converter according to the seventh aspect of the present invention, effective surface roughness of each of surfaces defining the lower and upper microgaps is 1/10 or less of a gap width measured in the corresponding lower and upper element-install cavities, respectively.

A eighth aspect of the present invention inheres in a film-shaped electro-mechanical converter having a plurality of elements being on a common spacer film, each of the elements encompassing a vibrating electrode; an electret layer facing to the vibrating electrode establishing an element-install cavity between the electret layer and the vibrating electrode; a back electrode in contact with a bottom surface of the electret layer; and at least one gap-insulating layer configured to divide an inside of the element-install cavity into upper and a lower directions so as to establish a plurality of microgaps in the inside of the element-install cavity, each of the microgaps having an interval between ten nanometers and 100 micrometers. In the film-shaped electro-mechanical converter according to the eighth aspect of the present invention, the plurality of elements are connected to each other so that the vibrating electrodes of the respective elements have a common potential, and that the back electrodes of the respective elements have a common potential, and the back electrodes are connected to a common amplifying circuit. And further, in each of the elements of the film-shaped electro-mechanical converter according to the eighth aspect of the present invention, effective surface roughness of each of surfaces defining the plurality of microgaps is 1/10 or less of a gap width measured in the element-install cavity.

A ninth aspect of the present invention inheres in a film-shaped electro-mechanical converter, encompassing an inner electrode films connected to an amplifying circuit, the inner electrode films having a plurality of empty areas being arrayed in a shape of a matrix; a lower electret layer in contact with a bottom surface of the inner electrode films; a lower outer electrode film facing to the lower electret layer establishing a lower element-install cavity between the lower outer electrode film and the lower electret layer, having a pattern of empty areas differing from a planer pattern of the inner electrode films; at least one lower gap-insulating layer configured to divide an inside of the lower element-install cavity into upper and a lower directions so as to establish a plurality of lower microgaps in the inside of the lower element-install cavity, each of lower microgaps having an interval between ten nanometers and 40 micrometers; an upper electret layer in contact with a top surface of the inner electrode films; an upper outer electrode film facing to the upper electret layer establishing an upper element-install cavity between the upper outer electrode film and the upper electret layer, having a pattern of empty areas differing from a planer pattern of the inner electrode films; and at least one upper gap-insulating layer configured to divide an inside of the upper element-install cavity into upper and a lower directions so as to establish a plurality of upper microgaps in the inside of the upper element-install cavity, each of the upper microgaps having an interval between ten nanometers and 40 micrometers. In the film-shaped electro-mechanical converter according to the ninth aspect of the present invention, wherein effective surface roughness of each of surfaces defining the lower and upper microgaps is 1/10 or less of a gap width measured in the corresponding lower and upper element-install cavities, respectively.

A tenth aspect of the present invention inheres in a film-shaped electro-mechanical converter, encompassing a plurality of vertical signal lines running in a vertical direction; a plurality of vertical selection signal wirings which are insulated from the plurality of vertical signal lines and run in a direction orthogonal to the plurality of vertical signal lines; a spacer film provided above the plurality of vertical signal lines and the plurality of vertical selection signal wirings, a plurality of penetration holes are arrayed at positions inside a pattern of grids implemented by the plurality of vertical signal lines and the plurality of vertical selection signal wirings, respectively; a common electret layer disposed on an entire surface of a sensor array area, being contact with a top surface of the spacer film; a plurality of back electrodes arrayed independently of each other, being contact with a part of a bottom surface of the electret layer, in the inside of the penetration holes, respectively; a plurality of amplifying circuits arrayed in the inside of the penetration holes, independently from each other, being connected to one of the back electrodes, one of the plurality of vertical signal lines, and one of the plurality of vertical selection signal wirings, respectively; a vibrating electrode facing to the electret layer, in such a way that element-install cavity independent of each other are arrayed, above each of the penetration holes; and at least one gap-insulating layer configured to divide an inside of each of the element-install cavity into upper and a lower directions so as to establish a plurality of microgaps in the inside of each of the element-install cavity, each of the microgaps having an interval between ten nanometers and 40 micrometers. In the film-shaped electro-mechanical converter according to the tenth aspect of the present invention, effective surface roughness of each of surfaces defining each of the plurality of microgaps is 1/10 or less of a gap width measured in the element-install cavity.

BRIEF DESCRIPTION OF THE DRAWINGS

FIG. 11 is a view representing a result when the sine wave signal (a single wave) is supplied to one of the electro-mechanical transducers according to the second comparison-example in FIG. 8 and then the transmission/reception is carried out;

FIG. 16 is a schematic process-flow-sectional view illustrating a manufacturing method of the electro-mechanical transducer (hydrophone) according to the second embodiment of the present invention;

FIG. 40 is a schematic plan view illustrating patterns of an inner electrode film and outer electrode films in the film-shaped electro-mechanical converter according to the eleventh embodiment;

DETAILED DESCRIPTION OF THE EMBODIMENTS

Figure 1:
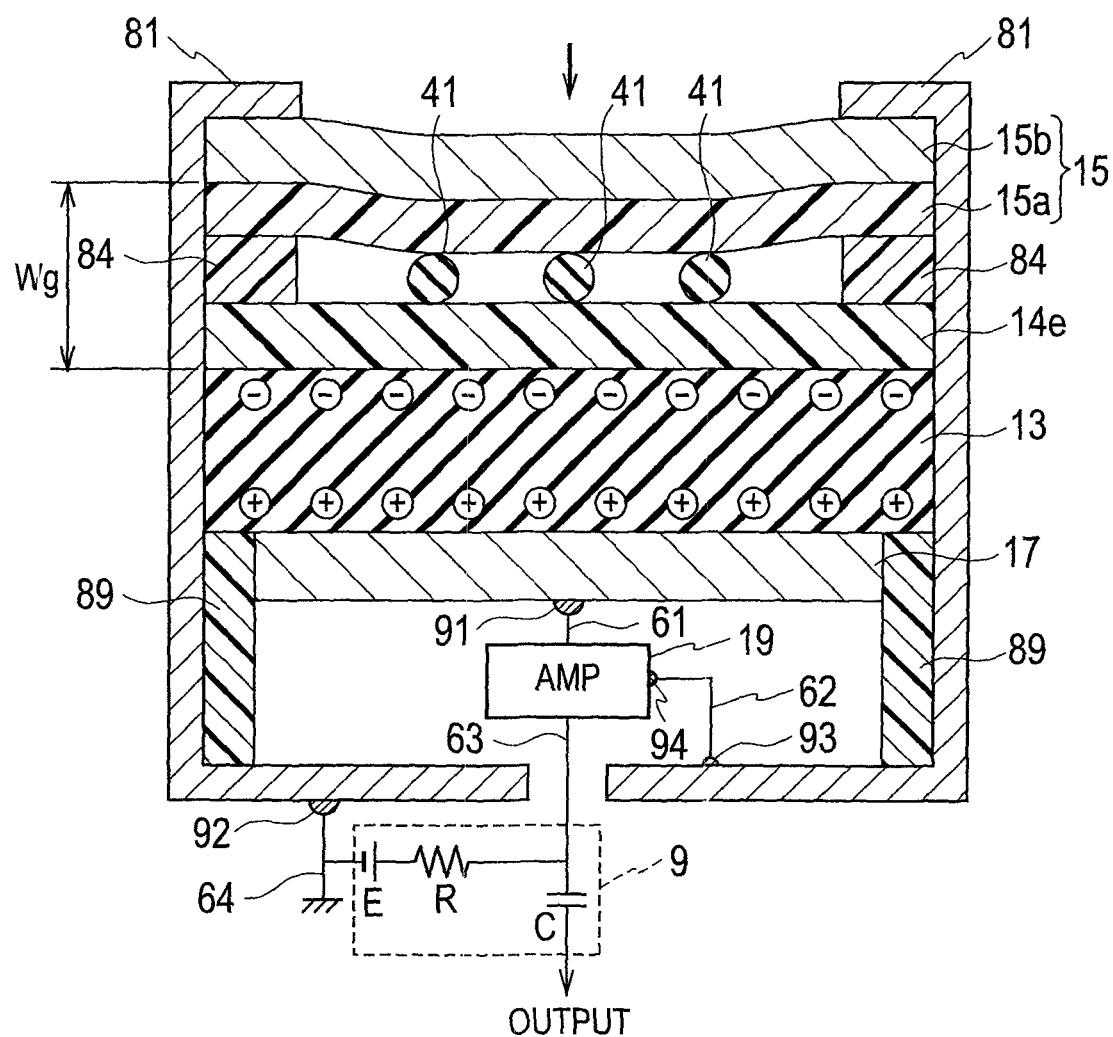
FIG. 1 is a schematic sectional view illustrating a rough configuration of an electro-mechanical transducer (ultrasonic probe) according to a first embodiment of the present invention.

The first to thirteenth embodiments of the present invention will be described below with reference to the drawings. In the following notifications on the drawings, the same or similar reference numerals are assigned to the same or similar parts and elements. However, the drawings are only diagrammatic.

Then, attention should be paid to the fact that the relations between thicknesses and planer dimensions, the ratios between thicknesses of respective layers, and the like differ from the actual values. Also, the thicknesses, dimensions and the like of the respective layers, which are exemplified and described in the first to thirteenth embodiments, should not be limitedly construed, and the specific thicknesses and dimensions should be judged by considering the following explanations. In particular, attention should be paid to the fact that the thicknesses, dimensions and the like can be determined to various values, on the basis of design schemes, requested properties and detailed requested particulars. Also, naturally, the portion in which the relations and ratios between the mutual dimensions are different is included even between the mutual drawings.

Also, the first to thirteenth embodiments, which will be described below, only exemplify the apparatuses and methods to specify the technical idea of the present invention. As for the technical idea of the present invention, the material qualities, shapes, structures, arrangements and the like of the configuration parts are not limited to the followings. Various changes can be added to the technical idea of the present invention, within the technical scopes prescribed by Claims.

First Embodiment

As illustrated in FIG. 1, an electro-mechanical transducer according to a first embodiment of the present invention is a ultrasonic probe encompassing a vibrating plate 15 that has a flat vibration surface under no load condition; an electret layer 13 in which polarization directions are aligned, defined by a flat first principal surface facing to the vibration surface of the vibrating plate 15 and a second principal surface facing in parallel to the first principal surface; a back electrode 17 in contact with the second principal surface of the electret layer 13; and amplifying means (19, 9) connected between the vibrating plate 15 and the back electrode 17. The back electrode 17 and the electret layer 13 may be metallurgically joined or may be adhered by an adhesive agent and the like, or may be merely brought into contact by a mechanical pressure. Although the illustrations on a plan view or a bird's eye view are omitted, each of the vibrating plate 15, the electret layer 13 and the back electrode 17 in the ultrasonic probe illustrated in FIG. 1 has a shape of a circular disk whose radius is between, for example, three millimeters and 40 millimeters. The vibrating plate 15 contains a vibrating electrode 15b made of conductor and a vibrating-electrode-insulating film 15a on the bottom surface of the vibrating electrode 15b, as illustrated in FIG. 1. Although the illustration is omitted, in the vibrating plate 15, as necessary, a matching layer made of insulating layer may be formed on the top surface of the vibrating electrode 15b so that the matching characteristics of the acoustic impedance with a medium can be improved.

Under no load condition, the first principal surface of the electret layer 13 faces in parallel to the vibration surface of the vibrating plate 15. Here, the amplifying means (19, 9) contains an amplifying circuit 19 connected to the back electrode 17 and an additional circuit 9 connected to the amplifier (FET) 19. FIG. 1 shows a receiver-side-ultrasonic probe, in which the additional circuit 9 encompasses a direct current power supply E whose one terminal is grounded; a buffer resistor R connected between the direct current power supply E and the amplifier (FET) 19; and a coupling capacitor C having one electrode connected to a connection node between the buffer resistor R and the amplifier (FET) 19 and the other electrode serving as an output terminal. External circuitry (illustration is omitted) is connected to the output terminal of the coupling capacitor C serving as the output terminal of the amplifying means (19, 9). Then, the external circuitry carries out signal processes necessary for an external communication unit and an external recording/storage unit that are connected to the microphone. The amplifying means (19, 9) in the electro-mechanical transducer according to the first embodiment of the present invention measures the charges induced on the electret layer 13, in association with the displacement of the vibration surface of the vibrating plate 15, because the amplifier (FET) 19 amplifies the potential across the back electrode 17 and the vibrating plate 15. On the other hand, in a transmitter-side-ultrasonic probe, an additional circuit 9 encompasses a direct current power supply E whose one terminal is grounded; a buffer resistor R connected between the direct current power supply E and the amplifier (FET) 19; and a coupling capacitor C having one electrode connected to the connection node between the buffer resistor R and the amplifier (FET) 19 and the other electrode serving as the input terminal. An external circuitry (illustration is omitted) is connected to the input terminal of the coupling capacitor C serving as the input terminal of the amplifying means (19, 9), and an input signal is supplied from the external circuitry, and the input signal amplified by the amplifier (FET) 19 is applied across the back electrode 17 and the vibrating plate 15.

A macroscopic "gap width $W_g$" is defined between the vibrating electrode 15b and the electret layer 13. The $W_g$ may be in a range between 0.1 micrometer and 100 micrometers. And a microgap that is defined as the microscopic air gap defined between the vibrating-electrode-insulating film 15a and an electret-insulating layer 14e, in which a gap width is between ten nanometers and 100 micrometers. In the microgap, because the dielectric breakdown strength of air in the gap is between five and 200 MV/m, the dielectric breakdown strength is improved as compared with the dielectric breakdown strength of the macroscopic gap. In the case of the macroscopic gap width $W_g$, the dielectric breakdown strength of air is about 3 MV/m. However, when insulating gas such as fluorine based gas and the like, other than air, is filled in the macroscopic gap width $W_g$, or alternatively, when the macroscopic gap width $W_g$ is evacuated to vacuum, the dielectric breakdown strength of the macroscopic gap width $W_g$ can be further improved. The vibrating electrode 15b is pulled and deformed by the electrostatic force between the electret layer 13 and the vibrating electrode 15b, and the deformation of the vibrating electrode 15b decreases the dielectric breakdown strength of the microgap. When the depth of concave and height of convex generated at the surface of the gap side of the vibrating electrode 15b in the deformed state is represented by a central line average roughness Ra, in order to obtain a high dielectric breakdown strength as mentioned above, the central line average roughness Ra must be $1/10$ or less of the gap width. The reason why Ra must be $1/10$ of the gap width will be described later by using FIGS. 12 and 13.

For the vibrating plate 15, any material may be used, in the condition that the bending is $1/10$ or less of the gap width $W_g$, as far as the vibrating electrode 15b is made to be superior in electrical conductivity and the vibrating-electrode-insulating film 15a is made to be superior in electrical insulation. The weight of the vibrating plate 15 is preferred to be light, in order to operate at higher frequencies, although the rigidity of the vibrating plate 15 is required to be high. Therefore, a material having a high value of specific rigidity ((elastic modulus)/density) is preferred to be used in one of the vibrating electrode 15b of the vibrating plate 15, the vibrating-electrode-insulating film 15a attached under the bottom surface of the vibrating electrode 15b, or the matching layer (whose illustration is omitted in FIG. 1) deposited on the top surface of the vibrating electrode 15b. For this reason, as for the vibrating plate 15, a configuration such that an aluminum layer, an aluminum alloy layer, a magnesium layer or a magnesium alloy layer is used as the vibrating electrode 15b, and an ethylene tetrafluoride-propylene hexafluoride copolymer resin (FEP resin) layer may be laminated to the vibrating electrode 15b as the vibrating-electrode-insulating film 15a can be employed. Or, a polyethylene telephthalate (PET) layer, a polyethylene naphthalate (PEN), an epoxy resin layer, a phenol resin layer and the like can be used as the vibrating-electrode-insulating film 15a, and an aluminum layer is deposited on the vibrating-electrode-insulating film 15a so as to implement the vibrating electrode 15b. Or, an alumina layer, a silicon nitride layer, a silicon carbide ceramics layer and the like can be used as the vibrating-electrode-insulating film 15a, and on the vibrating-electrode-insulating film 15a, an aluminum layer is deposited or a silver layer is burned so as to implement the vibrating electrode 15b. In addition, a silicon substrate joined with a FEP resin layer or a silica layer, or the like, which is used in the insulating layer of earlier electret microphones, can be used for the vibrating-electrode-insulating film 15a. However, in this case, the increase of the thickness is limited such that the bending is $1/10$ or less of the gap width. Thus, the present architecture greatly differs from the designing scheme of the earlier electret microphone. Also, the other resins superior in insulation such as silicon based resin, fluorine based resin, polyethylene based resin, polyester, polypropylene, polycarbonate, polystyrene, urethane, ABS, flexible vinyl chloride and the like can be used as material for the vibrating-electrode-insulating film 15a, and the vibrating electrode 15b is attached on the vibrating-electrode-insulating film 15a by joining, depositing or burning so as to implement the vibrating plate 15. In this case, the thickness of the vibrating electrode 15b or vibrating-electrode-insulating film 15a shall be increased to ensure the rigidity necessary for the vibrating plate 15.

For both of spacers 41 and the electret-insulating layer 14e, the material superior in electric insulation characteristics shall be used. Specifically, ceramics such as silica, alumina, silicon nitride, silicon carbide and the like, or alternatively, resins such as silicon based resin, fluorine based resin, polyethylene resin (including PET and the like), polyester, polypropylene, polycarbonate, polystyrene, urethane, ABS, flexible vinyl chloride and the like can be used. Also, for one or both of the spacers 41 and the electret-insulating layer 14e, the material whose elastic modulus is 2 GPa or less is used. However, when the vibrating-electrode-insulating film 15a exists on the side of the vibrating plate 15 and also the elastic modulus of the vibrating-electrode-insulating film 15a is 2 GPa or less, there is no limit for the elastic modulus of the spacers 41 and the electret-insulating layer 14e. As the material having the superior electric insulation characteristics and the elastic modulus of 2 GPa or less, specifically, there are resins such as silicon based resin, fluorine based resin, polyethylene based resin, polyester resin, polypropylene resin, polycarbonate resin, polystyrene resin, urethane resin, acrylonitrile butadiene styrene resin (ABS resin), the flexible vinyl chloride resin and the like.

As the spacers 41, other than the particles whose particle diameters are between ten nanometers and 100 micrometers as illustrated in FIG. 1, at the bottom surface of the vibrating-electrode-insulating film 15a, at the top surface of the electret-insulating layer 14e, or alternatively, when the vibrating-electrode-insulating film 15a is omitted, at the bottom surface of the vibrating electrode 15b, or when the electret-insulating layer 14e is omitted, at the top surface of the electret layer 13, micro protrusions, or bumps, may be formed by pulse laser irradiation, lithography, etching, press and the like so that the height of micro protrusions lies between ten nanometers and 100 micrometers. The micro protrusions may be formed at any one of surfaces of the bottom surface of the vibrating-electrode-insulating film 15a, the top surface of the electret-insulating layer 14e, the bottom surface of the vibrating electrode 15b, or the top surface of the electret layer 13, or alternatively, at both surfaces of any of combinations of the bottom surface of the vibrating-electrode-insulating film 15a, the top surface of the electret-insulating layer 14e, the bottom surface of the vibrating electrode 15b, or the top surface of the electret layer 13, facing to each other. Each of the particles and the protrusions can serve as supporting members between the vibrating-electrode-insulating film 15a and the electret-insulating layer 14e, between the vibrating electrode 15b and the electret-insulating layer 14e when the vibrating-electrode-insulating film 15a is omitted, between the vibrating-electrode-insulating film 15a and the electret layer 13 when the electret-insulating layer 14e is omitted, or between the vibrating electrode 15b and the electret layer 13 when both of the vibrating-electrode-insulating film 15a and the electret-insulating layer 14e are omitted, and by these supporting members, the microgap is established. As far as the microgap can be formed, although the spacers 41 may be formed into any of arbitrary geometry, the curvatures of the contact points of the protrusions are desired to be great. Also, when a layer having an appropriate surface roughness, such that maximum height ($R_{max}$) lies between ten nanometers and 100 micrometers is stacked, the microgap can be established without using the spacers 41.

The vibrating-electrode-insulating film 15a and the electret-insulating layer 14e are the layers of insulators as mentioned above, namely, the protrusions between ten nanometers and 100 micrometers are formed at the surface, or alternatively, the particles whose particle diameters are between ten nanometers and 100 micrometers are adhered on the surface. As necessary, a plurality of insulating layers can be laminated so as to increase the number of the microgap layers. Or, only at a limited area of the surface of the insulating layer, the protrusions are selectively formed or the particles are selectively adhered, and the remaining area is tightly adhered to, or dried and brought into contact with the facing insulating layer, where the microgap is established by the surface roughness. As far as the gap width is 100 micrometers or less, by increasing the lamination number of the insulating films, the acoustic damping characteristics can be improved. Also, as the insulating layer is made thicker, because the gap width becomes wider, the drop in the dielectric breakdown strength of the microgap, which is caused by the bending of the vibrating electrode 15b, can be protected. However, the increase in the gap width leads to the drop in the electric field strength inside the gap. For this reason, the optimum number of the laminations shall be determined on the basis of the thickness of the insulating layer, the structure of the microgap and the like.

The electret layer 13 must have a surface potential that can establish electric fields between 5 and 200 MV/m across the gap. As the typical examples of the electret layer 13, the following two schemes can be employed:
  (a) Insulating layer electrified by corona discharge, such as the electret layer 13, in which the charges are generated on the fluorine based resin or silica surface by corona discharge.
  (b) Ferroelectric layer electrified by heating:
    As the ferroelectric layer, it is possible to employ single-crystalline ferroelectric material, polycrystalline ferroelectric material, or a crystalline ferroelectric polymer.

As the ferroelectric material, it is possible to use perovskite compound, tungsten bronze structure compound, bismuth based layered structure compound, wurtzite structure crystal, zinc oxide, quartz crystal, Rochelle salt and the like. For example, the ferroelectric material such as lead-zirconium-titanate (PZT), $LiNbO_3$, polyvinylidene difluoride (PVDF) and the like, in which the polarization directions are oriented along one direction, is heated so that the polarization is temporally reduced by pyroelectric effect, and the surface charges are consequently removed, and the ferroelectric material is again cooled to room temperature, and the electret layer 13 is consequently implemented by the ferroelectric material.

The thickness of the electret layer 13 can be selected as, for example, about 20 to 400 micrometers, and the thickness of the back electrode 17 can be selected as, for example, about ten micrometers to 100 micrometers, and the thickness of the vibrating plate 15 can be selected as, for example, about ten micrometers to 100 micrometers. However, the specific thicknesses and radiuses of the vibrating plate 15, the electret layer 13 and the back electrode 17 may be determined on the basis of design schemes, requested performances and detailed requested particulars.

A bottom plate of a receptacle 81 implemented by a metallic circular disk having an interconnect opening is connected to a bottom end surface of a holder 89. The conductive (metallic) receptacle 81 may be implemented by a receptacle body and a bottom plate connected to the receptacle body through soldering and the like. The ground wiring from the amplifying circuit 19 is connected to the bottom plate of the receptacle 81 through soldering. The amplifying circuit 19 is electrically connected to the back electrode 17 through a solder 91 fused around the center of the back electrode 17. Although a through hole (illustration is omitted) penetrating through the back electrode 17 and the electret layer 13 are formed in the back electrode 17 and the electret layer 13, the through hole is sealed by using the soldering and the like so that (as necessary), gas (insulating gas) having a high insulating characteristics can be filled in the gap space between the electret layer 13 and the vibrating plate 15. As the insulating gas, it is possible to employ nitrogen, sulfur hexafluoride and the like. In addition to the insulating gas, even if the insulating fluid such as silicon oil and the like can be filled in the gap space between the electret layer 13 and the vibrating plate 15, so as to increase the dielectric breakdown strength, which makes the generation of the discharge difficult. As a result, amount of charges on the surface of the electret layer 13 that is induced by discharging can be decreased, thereby improving the sensitivity. Instead of filling the insulating gas or insulating fluid, even if the gap space between the electret layer 13 and the vibrating plate 15 is evacuated to establish vacuum, the sensitivity can be improved.

By the way, each of the vibrating plate 15, the electret layer 13 and the back electrode 17 is not required to have the shape of the circular disk, and the vibrating plate 15, the electret layer 13 and the back electrode 17 may have another geometrical shape, such as an ellipse, a rectangle or the like. In this case, naturally, the other members such as the conductive (metallic) receptacle 81 and the like shall be designed so as to agree with the geometrical shapes of the vibrating plate 15, the electret layer 13 and the back electrode 17.

—Dielectric Breakdown Strength of Air in Micro Gap—

When a potential difference is established across two electrodes sandwiching an air gap in between, under atmospheric pressure, it is known that the dielectric breakdown strength of air increases as the inter-electrode distance between two electrodes decreases, and the maximum value can be established at an inter-electrode distance between about one micrometer and two micrometers. However, as the curvature of the protrusion at the surface of the electrode becomes higher, the electric field is concentrated at the protruded portion, and the dielectric breakdown strength is decreased. Thus, when size of concave/convex structure at the electrode surface is represented by the central line average roughness Ra, Ra must be 1/10 or less of the gap width, and it is desired to be 1/100 or less, which will be described later by using FIGS. 12 and 13.

In any of the earlier electret microphones, the vibrating electrode 15b is greatly deformed by the electrostatic force between the electret layer 13 and the vibrating electrode 15b, where the central line average roughness Ra of the surface of the vibrating electrode 15b indicates the value that includes the deformation caused by the bending of the vibrating electrode 15b. Thus, the central line average roughness Ra of the vibrating electrode 15b of the earlier electret microphone exceeds 1/10 of the gap width $W_g$ (the topology of the earlier electret microphone corresponds to the configuration in which both of the vibrating-electrode-insulating film 15a and the electret-insulating layer 14e are omitted in FIG. 1, and the gap width $W_g$ is defined as the distance between the electret layer 13 and the vibrating electrode 15b).

In the electro-mechanical transducer according to the first embodiment of the present invention, the width of the microgap between the vibrating-electrode-insulating film 15a and the electret-insulating layer 14e determines the dielectric breakdown strength of air. In the configuration of the electro-mechanical transducer according to the first embodiment, the insertion of the vibrating-electrode-insulating film 15a and the electret-insulating layer 14e enlarges the gap width $W_g$, and can decrease the central line average roughness Ra (that includes a deformation caused by the bending of the vibrating electrode 15b through the spacers 41) of the bottom surface of the vibrating-electrode-insulating film 15a (or, the bottom surface of the vibrating electrode 15b in a case when the vibrating-electrode-insulating film 15a is omitted) to be 1/10 or less of the gap width $W_g$. Also, the surface roughness of the top surface of the electret-insulating layer 14e (or, the top surface of the electret layer 13, in a case when the electret-insulating layer 14e is omitted) similarly has influence on the dielectric breakdown strength of air in the gap. Also, Ra of the top surface of the electret-insulating layer 14e must be 1/10 or less of the gap width, and it is desired to be 1/100 or less.

—Reception Sensitivity—

When the electro-mechanical transducer according to the first embodiment of the present invention is used as an ultrasonic probe, the bending of the vibrating plate 15 and the deformation of the contact point in the microgap cause the vibrating plate 15 to be vibrated so that the acoustic wave (ultrasonic wave) can be transmitted or received. When the vibrating plate 15 of the ultrasonic probe is vibrated by the acoustic wave (ultrasonic wave), in accordance with the principle similar to an electret condenser microphone, the change in the capacitance of the gap results in the change in the potential difference across the electrodes, and an output $\Delta V_{out}$ is obtained as described by the following equation;

$$\Delta V_{out} = \Delta W_g E_g \tag{1}$$

$$E_g = V_e/W_g \tag{2}$$

$E_g$ is the electric field strength in the gap, and $\Delta W_g$ is the amplitude of the vibrating plate 15, which is the summation of the amplitudes of the vibration caused by the bending and the vibration caused by the deformation of the contact point, $W_g$ is the width of the entire gap, and $V_e$ is the magnitude of the surface potential of the electret layer 13. At this time, the vibrating plate 15 is pulled from the electret layer 13 by the electrostatic force $\pi_e$, with $q_d$ as unit charge:

$$\sigma_e = q_d E_g = \in_g E_g^2 \tag{3}$$

Where, $\in_g$ is the dielectric constant of the entire gap that includes the insulating layer. Attention should be paid to a fact that each of the protrusions (including the particles) in the microgap portion serves as a fulcrum, and therefore, with the electrostatic force $\sigma_e$, when the vibrating plate 15 is pulled to the gap side by the electrostatic force between the electret layer 13 and the vibrating plate 15, the vibrating plate 15 is statically bent, supported by the fulcrums. That is, the rigidity of the vibrating plate 15, the contact point density and the arrangement of the contact points in the microgap portion shall be designed in such a way that Ra of the surface at the gap side of the vibrating electrode 15b in the statically deformed state becomes 1/10 or less of the gap width. Also, when the bending causes the two layers, implementing the microgap, mutually contact at a position different from the protrusions, the number of the contact points will increase, which severely reduces the contact rigidity. Thus, the contact of the two layers at the position different from the protrusions must be avoided, by increasing the rigidity of the vibrating plate 15, or alternatively, by increasing the height or density of the protrusion.

—Vibration Caused by Bending of Vibration Plate—

The vibration caused by the bending of the vibrating plate is similarly generated even in the earlier electret microphone. Also, even if an assumable maximum sound pressure causes the bending, the vibrating plate shall be designed such the two layers implementing the microgap will not be brought into contact with each other at the position except the protrusions.

Vibration Caused by Deformation of Micro Gap Portion—

Figure 2:
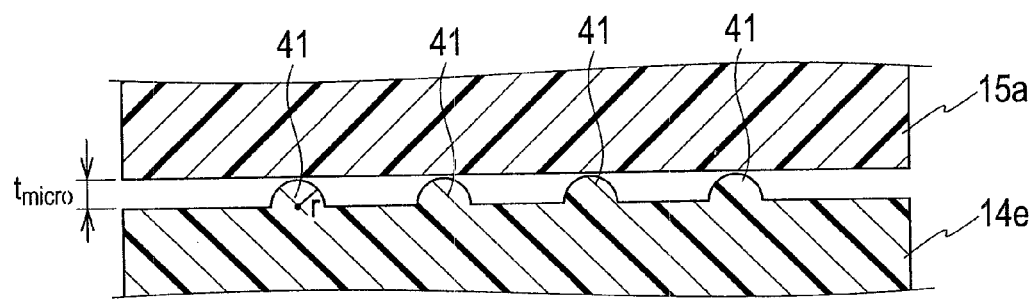
FIG. 2 is a schematic sectional view explaining vibrations caused by a deformation of a microgap in the electro-mechanical transducer according to the first embodiment of the present invention.

The structure illustrated in FIG. 1 is illustrated as an example, and the microgap can be achieved without using the particles as the spacers 41. For example, as illustrated in FIG. 2, the microgap can be formed through a dry contact, in a condition that the bottom surface of the vibrating-electrode-insulating film 15a is very smooth, and that the top surface of the electret-insulating layer 14e has micro protrusions of a constant radius r, the micro protrusions are in dry contact with the bottom surface of the vibrating-electrode-insulating film 15a. For providing the micro protrusions of the constant radius r as illustrated in FIG. 2, a local thermal deformation may be generated when a pulse laser is irradiated to the bottom surface of the vibrating-electrode-insulating film 15a, or the precipitation of oligomers or the self-organization of polymers may be carried out by heating the entire film implementing the vibrating-electrode-insulating film 15a, or the micro protrusions may be formed by machining the vibrating-electrode-insulating film 15a such as a press working.

In a model in which the bottom surface of the vibrating-electrode-insulating film 15a has the micro protrusions of the constant radius r as illustrated in FIG. 2, a contact pressure $\sigma$ is equal to $\sigma_e$ and represented by the following equation:

$$\sigma = \sigma_e = (4/3) n S' r^{1/2} W^{3/2} \tag{4}$$

$$1/S' = ((1-v_d^2)/S_d) + ((1-v_g^2)/S_g) \tag{5}$$

Here, n represents the surface density of the protrusions, and w represents the displacement in the vibrating-electrode-insulating film 15a caused by the surface pressure, $v_d$ and the $v_g$ indicate Poisson ratios of the vibrating-electrode-insulating film 15a and the electret-insulating layer 14e, respectively, and $S_d$ and $S_g$ indicate the storage elastic moduli of the vibrating-electrode-insulating film 15a and the electret-insulating layer 14e, respectively. Here, the storage elastic modulus indicates the elastic modulus with respect to the elastic deformation in an acoustic frequency band (between 20 Hz and 10 GHz) received by the receiver-side-ultrasonic probe. Then, as the frequency becomes higher, both of $S_d$ and $S_g$ tend to be increased. Thus, $S_d$ and $S_g$ are assumed to be the values of the usable maximum frequency.

Then, a contact rigidity (boundary rigidity) $K_g$, which is a spring constant per unit area in the microgap between the vibrating-electrode-insulating film 15a and the electret-insulating layer 14e, is obtained by differentiating σ with respect to w:

$$K_g = 2nS'(rw)^{1/2} \quad (6)$$

If $K_g \ll S'$, the amplitude of the vibrating-electrode-insulating film 15a agrees with the vibration of the microgap portion, and is inversely proportional to the $K_g$:

$$\Delta W_g = \Delta \sigma_d / K_g \quad (7)$$

From Eqs. (1), (3), (5), (6) and (7), the $\Delta V_{out}$ is represented as follows:

$$\Delta V_{out} = \Delta \sigma_d (E_g / (6 \in_g S'^2 n^2 r))^{1/3} \quad (8)$$

From Eq. (8), in order to improve the reception sensitivity, it is understood that the electric field strength $E_g$ in the gap shall be increased, the storage elastic moduli of one or both of the two layers with the microgap between shall be decreased, the radius r of the protrusion shall be made short, and the density n of the protrusions shall be decreased (the interval may be made wide). However, the drops in the radius r and the density n of the protrusion result in the increase in the bending of the vibrating-electrode-insulating film 15a. Thus, as mentioned above, attention should be paid to the requirements that the central line average roughness Ra of the vibrating-electrode-insulating film 15a shall be 1/10 or less of the gap width, and that, also the contact density of the microgap portion shall not be increased by the bending.

—Influence on Transmission Output—

As for the transmission, when a voltage pulse of an amplitude $\Delta V_{in}$ is supplied to the transmitter-side-ultrasonic probe, a pressure $\Delta \sigma_{out}$ generated in the vibrating-electrode insulating film 15a at the time of the transmission is represented as follows:

$$\Delta \sigma_{out} = \varepsilon_g ((V_e + \Delta V_{in})/W_g)^2 - \varepsilon_g (V_e/W_g)^2 \quad (9)$$
$$\approx (2\varepsilon_g E_g \Delta V_{in}/W_g)^2$$

Together with the bending of the vibrating-electrode-insulating film 15a and the deformation of the contact point of the microgap portion, the vibrating-electrode-insulating film 15a is changed on the basis of the $\Delta \sigma_{out}$, and the vibration of the vibrating-electrode-insulating film 15a is generated, and the acoustic wave is transmitted. Thus, from Eq. (9), it is known that, when the gap width $W_g$ is narrow and the electric field strength $E_g$ of the gap is high, the transmission sound pressure becomes large and the transmission output is improved.

—Damping of Acoustic Wave—

As another merit of the microgap lies in the damping (attenuation) of the ultrasonic wave. At the boundary portion where the microgap does not contact owing to the existence of the spacers 41, a reflection of the acoustic wave is generated. Thus, the acoustic wave that is propagated to the electret layer 13 is greatly attenuated in the microgap. When the acoustic wave is propagated to reach the electret layer 13, the electret layer 13 is distorted to induce piezoelectric effect, and the influence resulted from the piezoelectric effect may overlap with the reception output. Because the overlap of the piezoelectric effect will reduce the performance of the electret probe (ultrasonic probe), in the microgap portion, the acoustic wave is desired to be attenuated to the utmost extent. Providing with the microgap, the attenuation of the acoustic wave in the gap portion is dramatically increased.

Ultrasonic Transmission/Reception Property—

Let us consider an example in which the electro-mechanical transducer according to the first embodiment illustrated in FIG. 1 is applied to the ultrasonic probe (aerial ultrasonic probe) of aerial ultrasonic waves. In the example, the vibrating plate 15 encompasses a polyethylene terephthalate (PET) resin film having a thickness of 60 micrometers as the vibrating-electrode-insulating film 15a, which is deposited on the bottom surface of an Al electrode plate having a thickness of one micrometer or less as the vibrating electrode 15b, and the surface for the vibrating-electrode-insulating film 15a of the Al electrode plate is finished to a mirror surface. Also, on the electret layer 13 whose surface potential is −2 kV, the PET resin layer having a thickness of ten micrometers is laminated as the electret-insulating layer 14e, and on the electret-insulating layer 14e, the silicon particles each having a diameter of five micrometers are adhered at an average interval of 500 micrometers as the spacers 41. With the silicon particles, the microgap is formed between the PET resin layers, and the electric field of about 30 MV/m is applied from the electret layer 13. At this time, the sum of the bending of the vibrating electrode 15b and the deformation level of the silicon particle is 3.8 micrometers or less, and the vibrating-electrode-insulating film 15a and the electret-insulating layer 14e are never brought into contact with each other. Also, when the microgap is five micrometers or less, the dielectric breakdown strength of air is 60 MV/m or more. Thus, the dielectric breakdown of air in the microgap is not generated in the microgap. The reception sensitivity of this ultrasonic probe is −50 dB or more between 20 Hz and 1 MHz. Typically, the reception sensitivity of a piezoelectric aerial ultrasonic sensor in a narrow band in which the resonance is used is about −60 dB at −40 kHz, and it can be received at the sensitivity that is more higher than this and at a wider band.

Also, as for the transmission, the vibration amplitude of 3.4 nanometers is obtained for a voltage pulse input of 1 V. When lead-zirconium-titanate (PZT) is used as the material for the ultrasonic probe, the vibration amplitude greater than 3.4 nanometers can be obtained when the resonance is used. However, PZT can be used only at the resonant frequency. Under a non-resonant condition, only the vibration amplitude of about 0.3 nanometer is obtained in PZT. Thus, in the transmission in the wide frequency band, the ultrasonic probe of the present invention is very advantageous than the ultrasonic probe using PZT.

Let us consider another example, in which the electro-mechanical transducer according to the first embodiment is applied to the ultrasonic probe of the ultrasonic wave in which a low acoustic impedance material such as a water, a living body material and the like is used as a medium.

Figure 4:
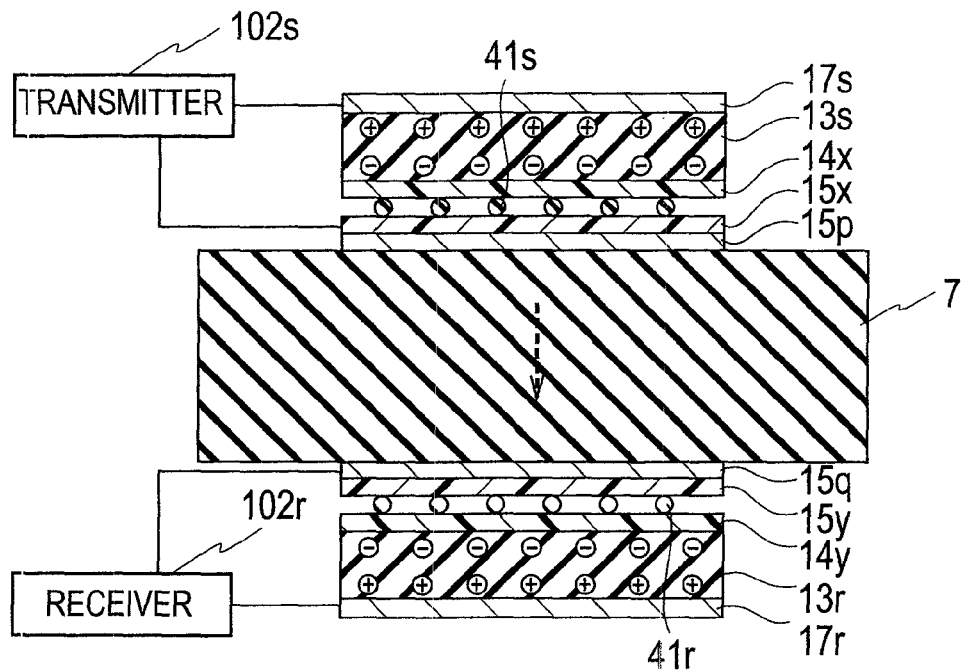
FIG. 4 is a schematic sectional view illustrating a configuration of a system, in which an electro-mechanical transducer according to the first embodiment is used as a transmitter-side-ultrasonic probe so that ultrasonic wave can be generated, and the generated ultrasonic wave propagates through a silicon block, and then the ultrasonic wave propagated through the silicon block is received by another electro-mechanical transducer according to the first embodiment as a receiver-side-ultrasonic probe.

As illustrated in FIG. 4, the transmitter-side-ultrasonic probe according to the first embodiment encompasses vibrating plates (15p, 15x); an electret layer 13s having the first principal surface facing to the vibration surfaces of the vibrating plates (15p, 15x); a back electrode 17s in contact with the second principal surface of the electret layer 13s; an electret-insulating layer 14x joined to the first principal surface of the electret layer 13s, and spacers 41s inserted between the vibrating-plate-insulating layer 15x and the electret-insulating layer 14x, and the spacers 41s control the interval of "microgap" defined between the vibrating-plate-insulating layer 15x and the electret-insulating layer 14x. Similarly, the receiver-side-ultrasonic probe according to the first embodiment encompasses vibrating plates (15q, 15y), an electret layer 13r having the first principal surface facing to the vibration surfaces of the vibrating plates (15q, 15y), a back electrode 17r in contact with the second principal surface of the electret layer 13r, an electret-insulating layer 14y joined to the first principal surface of the electret layer 13r, and spacers 41r inserted between the vibrating-plate-insulating layer 15y and the electret-insulating layer 14y, and the spacers 41r control the interval of "microgap" defined between the vibrating-plate-insulating layer 15y and the electret-insulating layer 14y.

Figure 3:
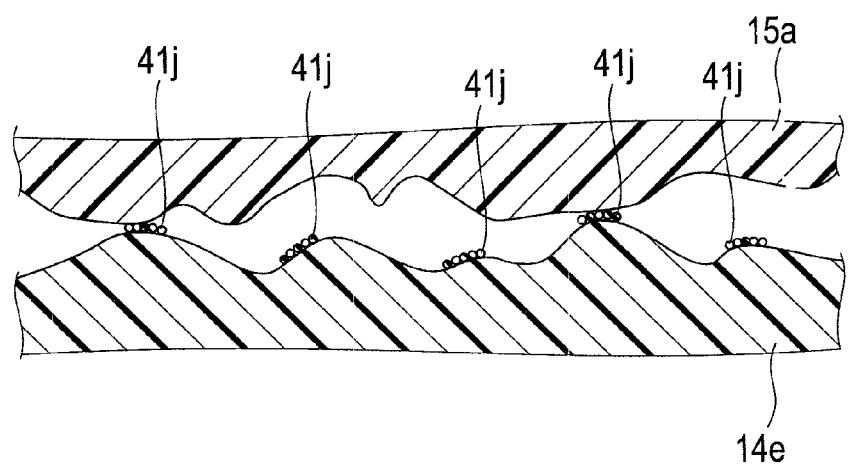
FIG. 3 is a schematic sectional view illustrating a state of a microgap, in a situation that tolerance of each of thicknesses of a vibration-plate-insulating layer and an electret-insulating layer is ±10%, in which the vibration-plate-insulating layer and the electret-insulating layer are brought into contact with each other through aggregated silicon particles.

Each of the vibrating plates 15p, 15q are made of aluminum having a thickness of 12 micrometers, and the surfaces on the sides facing to the respective gaps of the vibrating plates 15p, 15q are finished to the mirror surfaces. Also, PZT is used as the electret layers 13s, 13r, and the surface potentials are set to −2 kV. On the electret layer 13s, the FEP resin layer having a thickness of 12 micrometers is laminated as each of the vibrating-plate-insulating layer 15x and the electret-insulating layer 14x, and on the electret layer 13r, the FEP resin layer having a thickness of 12 micrometers is laminated as the vibrating-plate-insulating layer 15y and the electret-insulating layer 14y, respectively. Between the vibrating-plate-insulating layer 15x and the electret-insulating layer 14x and between the vibrating-plate-insulating layer 15y and the electret-insulating layer 14y, the silicon particles each having a diameter of two micrometers are adhered at an average interval of ten micrometers as the spacers 41s, 41r. However, the silicon particles are aggregated in an in-plane direction, as illustrated in FIG. 3, and the average interval between the aggregated groups is 100 micrometers. Also, the tolerance of the thickness of each of the FEP resin layers as the vibrating-plate-insulating layers 15x, 15y and the electret-insulating layers 14x, 14y is ±10%. For this reason, similar to the configuration illustrated in FIG. 3, the vibrating-plate-insulating layers 15x, 15y and the electret-insulating layers 14x, 14y contact locally through a part of the aggregated silicon particles, respectively, so as to form the corresponding microgaps between the vibrating-plate-insulating layers 15x, 15y and the electret-insulating layers 14x, 14y. At this time, in the inside of each of the microgaps, the electric field of about 70 MV/m is established from the electret layers 13s, 13r.

Figure 5:
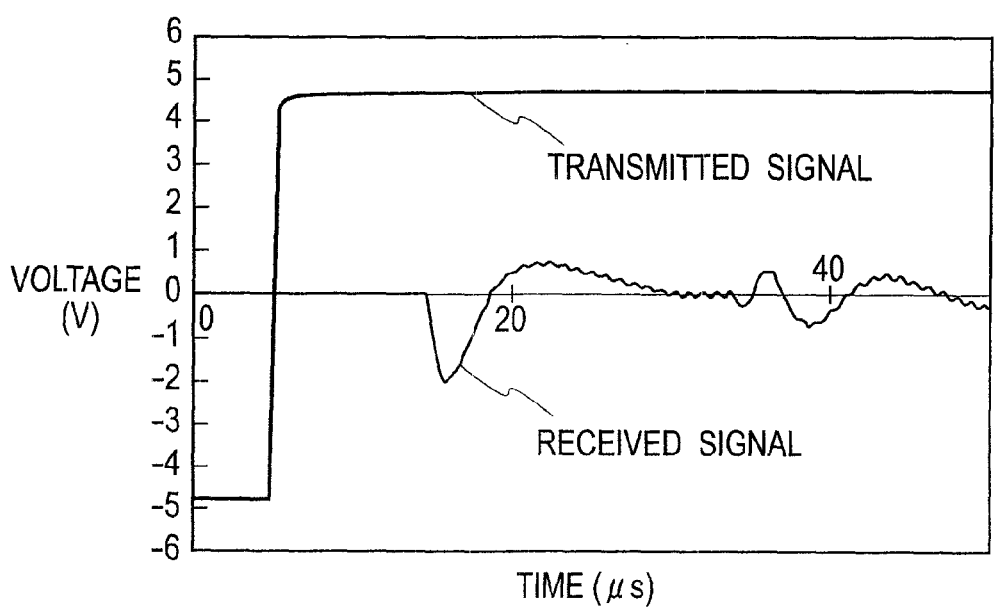
FIG. 5 is a view representing a transmission/reception property obtained by the transmitter-side-ultrasonic probe and the receiver-side-ultrasonic probe, which are illustrated in FIG. 4, between the transmitter-side-ultrasonic probe and the receiver-side-ultrasonic probe, the ultrasonic wave propagates in the silicon block.

As illustrated in FIG. 4, a step voltage is supplied through a transmitting amplifier 102s to the transmitter-side-ultrasonic probe so as to generate an ultrasonic wave such that the generated ultrasonic wave can propagate a silicon block 7, and the ultrasonic wave propagated through a silicon block 7 is received by the receiver-side-ultrasonic probe, and then amplified and detected by a receiving amplifier 102r, and FIG. 5 represents a result, in which, as a transmitted signal, the step voltage is supplied to the transmitter-side-ultrasonic probe, and the ultrasonic wave propagated through the silicon block 7 is received by the receiver-side-ultrasonic probe, and then amplified and detected by the receiving amplifier 102r as a received signal.

Figure 6:
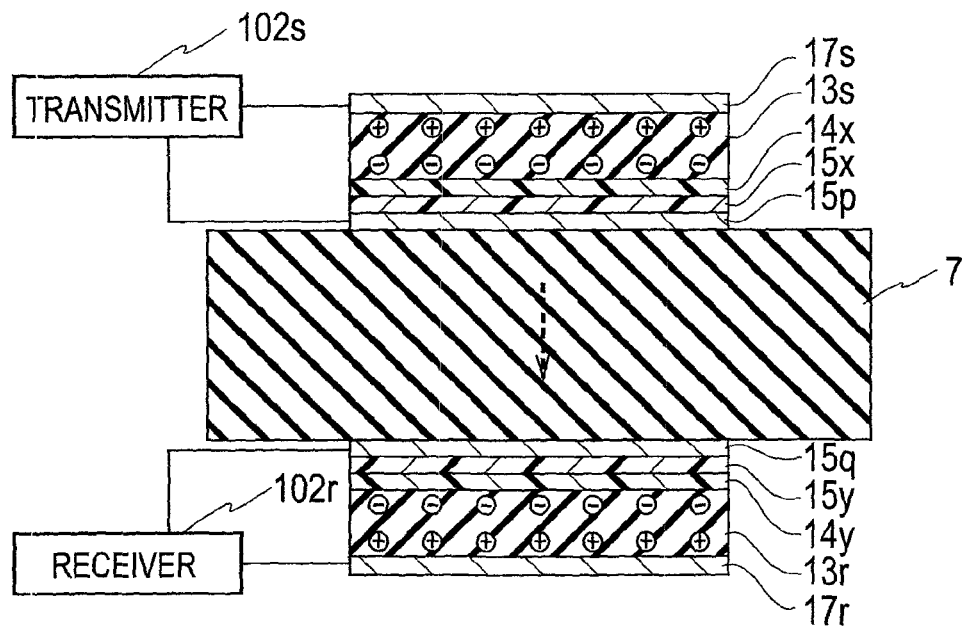
FIG. 6 is a schematic sectional view illustrating a configuration in which an electro-mechanical transducer according to a first comparison-example is used as the transmitter-side-ultrasonic probe, and the ultrasonic wave is generated and propagated through the silicon block, and then the ultrasonic wave propagated through the silicon block is received by another electro-mechanical transducer according to the first comparison-example as the receiver-side-ultrasonic probe.

On the contrary, FIG. 6 illustrates a structure of an ultrasonic probe according to a first comparison-example in which the silicon particle is not used as the spacer. As illustrated in FIG. 6, the transmitter-side-ultrasonic probe according to the first comparison-example encompasses a vibrating plates (15p, 15x); an electret layer 13s facing to the vibration surfaces of the vibrating plates (15p, 15x); a back electrode 17s in contact with the second principal surface of the electret layer 13s; and an electret-insulating layer 14x joined to the first principal surface of the electret layer 13s. Then, the vibrating-plate-insulating layer 15x and the electret-insulating layer 14x are macroscopically in direct contact with each other. Similarly, in the receiver-side-ultrasonic probe according to the first comparison-example encompasses vibrating plates (15q, 15y); an electret layer 13r facing to the vibration surfaces of the vibrating plates (15q, 15y); an back electrode 17r in contact with the second principal surface of the electret layer 13r; and an electret-insulating layer 14y joined to the first principal surface of the electret layer 13r are contained. Then, the vibrating-plate-insulating layer 15y and the electret-insulating layer 14y are macroscopically in direct contact with each other. As the electret layers 13s, 13r, PZT of the same material and of the same shape as the electret layers 13s, 13r used in FIG. 4 is used.

Figure 7:
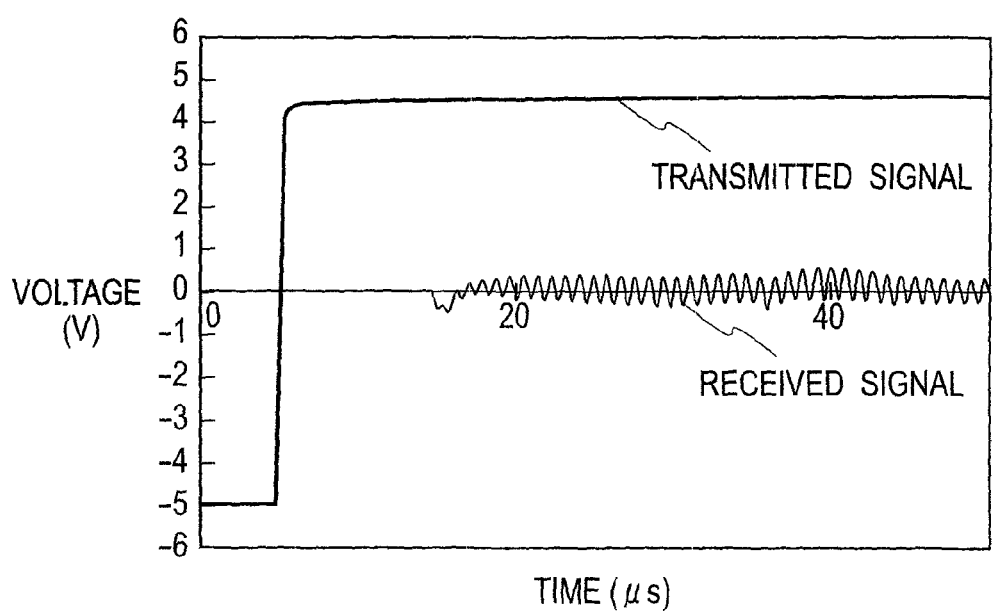
FIG. 7 is a view representing a transmission/reception property when the transmitter-side-ultrasonic probe according to the first comparison-example and the receiver-side-ultrasonic probe according to the first comparison-example illustrated in FIG. 5 are used to propagate the ultrasonic wave through the silicon block.

FIG. 7 represents a result in which, as illustrated in FIG. 6, the step voltage is supplied through a transmitting amplifier 102s to a transmitter-side-ultrasonic probe, and the ultrasonic wave is generated, and the ultrasonic wave propagated through a silicon block 7 is received by the receiver-side-ultrasonic probe, and then amplified and detected by a receiving amplifier 102r. Even when the silicon particle is not used as the spacer, the tolerance of the thickness of each FEP resin layer as the vibrating-plate-insulating layers 15x, 15y and the electret-insulating layers 14x, 14y is ±10%. Thus, as can be understood from FIG. 3, the microgap is microscopically established between the vibrating-plate-insulating layer 15x and the electret-insulating layer 14x and between the vibrating-plate-insulating layer 15y and the electret-insulating layer 14y.

Figure 8:
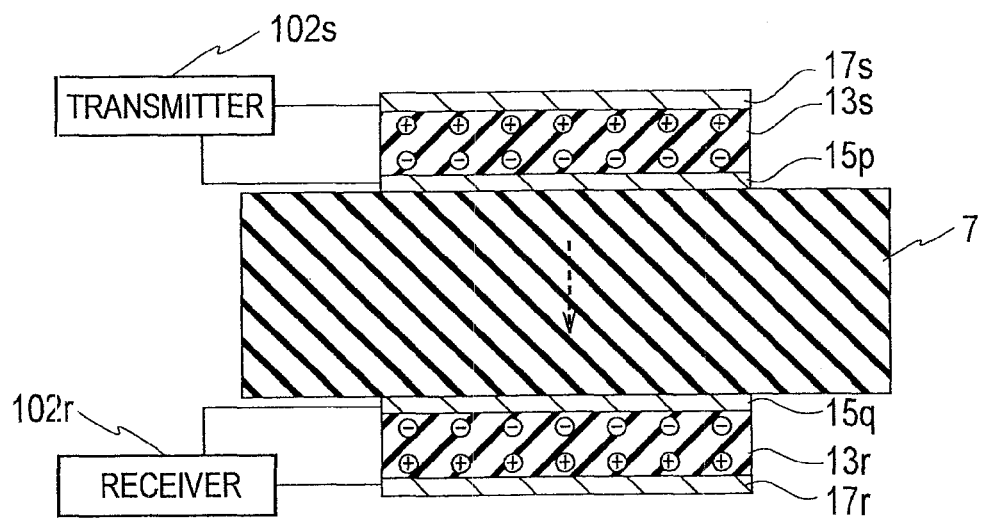
FIG. 8 is a schematic sectional view illustrating a configuration in which an electro-mechanical transducer according to a second comparison-example is used as the transmitter-side-ultrasonic probe, and the ultrasonic wave is generated and propagated through the silicon block, and then the ultrasonic wave propagated through the silicon block is received by using the electro-mechanical transducer according to the second comparison-example as the receiver-side-ultrasonic probe.
Figure 9:
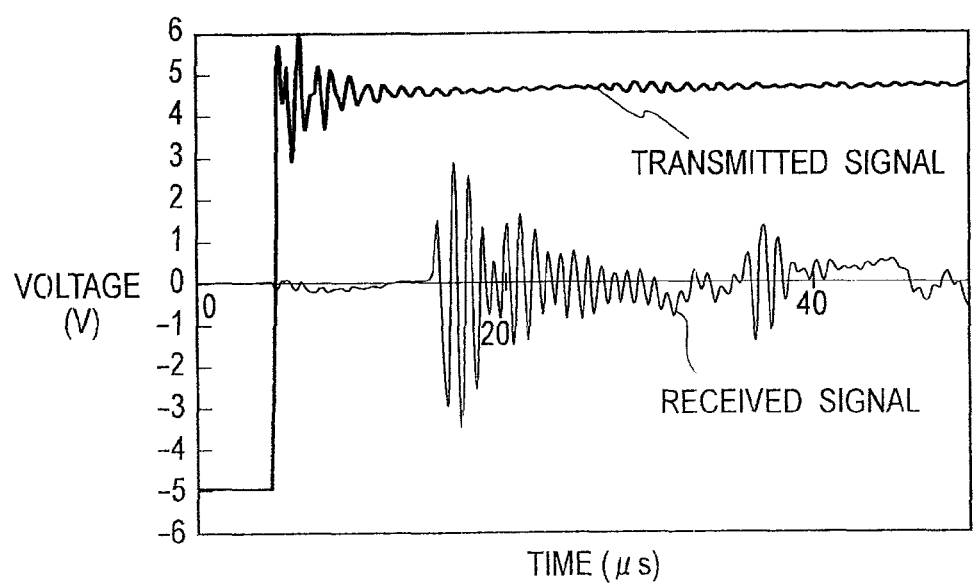
FIG. 9 is a view representing a transmission/reception property when the transmitter-side-ultrasonic probe according to the second comparison-example and the receiver-side-ultrasonic probe according to the second comparison-example illustrated in FIG. 8 are used to propagate the ultrasonic wave through the silicon block.

FIG. 8 illustrates a structure of an ultrasonic probe (piezoelectric probe) according to a second comparison-example in which the vibrating-plate-insulating layer and the electret-insulating layer are not used, in addition to the fact that the silicon particle is not used as the spacer. As illustrated in FIG. 8, a transmitting piezoelectric probe (transmitter-side-ultrasonic probe) according to the second comparison-example encompasses a vibrating electrode 15p, an electret layer 13s facing to the vibration surface of the vibrating electrode 15p and a back electrode 17s in contact with the second principal surface of the electret layer 13s. Similarly, a receiving piezoelectric probe (receiver-side-ultrasonic probe) according to the second comparison-example encompasses a vibrating electrode 15q, an electret layer 13r facing to the vibration surface of the vibrating electrode 15q and a back electrode 17r in contact with the second principal surface of the electret layer 13r. As the electret layers 13s, 13r, PZT of the same material and of the same shape as the electret layers 13s, 13r used in FIG. 4 and FIG. 6 are used. FIG. 9 represents a result in which, as illustrated in FIG. 8, the step voltage is supplied through a transmitting amplifier 102s to the transmitter-side-ultrasonic probe (transmitter-side-ultrasonic probe), and the ultrasonic wave is generated, and the ultrasonic wave propagated through the silicon block 7 is received by the receiving piezoelectric probe (receiver-side-ultrasonic probe) and then amplified by a receiving amplifier 102r and detected.

In both of the results represented by FIGS. 5 and 7, the ultrasonic waves propagated through the silicon block 7 from the transmitter-side-ultrasonic probe and the ultrasonic wave after one round-trip through reflections in the silicon block 7 are received. Even when the silicon particle is not used, there is the tolerance of ±10% in each FEP resin layer as the vibrating-plate-insulating layer 15x and the electret-insulating layer 14x. Thus, the microgap ought to be formed between the respective layers of the vibrating electrode 15p, the vibrating-plate-insulating layer 15x, the electret-insulating layer 14x and the electret layer 13s. However, as can be understood from the comparison between the results of FIGS. 5 and 7, since the silicon particles are used as the spacers 41s, 41r and then the microgaps are formed in the result represented by FIG. 5, the transmission/reception sensitivity of the ultrasonic wave is greatly increased in the result represented by FIG. 5. From the comparison between the results of FIGS. 5 and 7, the reduction in the number of the contact points of the microgaps and the reduction in the diameter of the contact portion can be understood to have great influence on the sensitivity.

Also, when the electret probe (ultrasonic probe) illustrated in FIG. 4 is compared with the piezoelectric probe in FIG. 8, it can be understood that, although there is not a great difference between their measured sensibilities, in the electret probe illustrated in FIG. 4, the received waveform has the waveform in which the leading edge is sharp such as the supplied step voltage waveform, and the resonance is rarely found.

Figure 10:
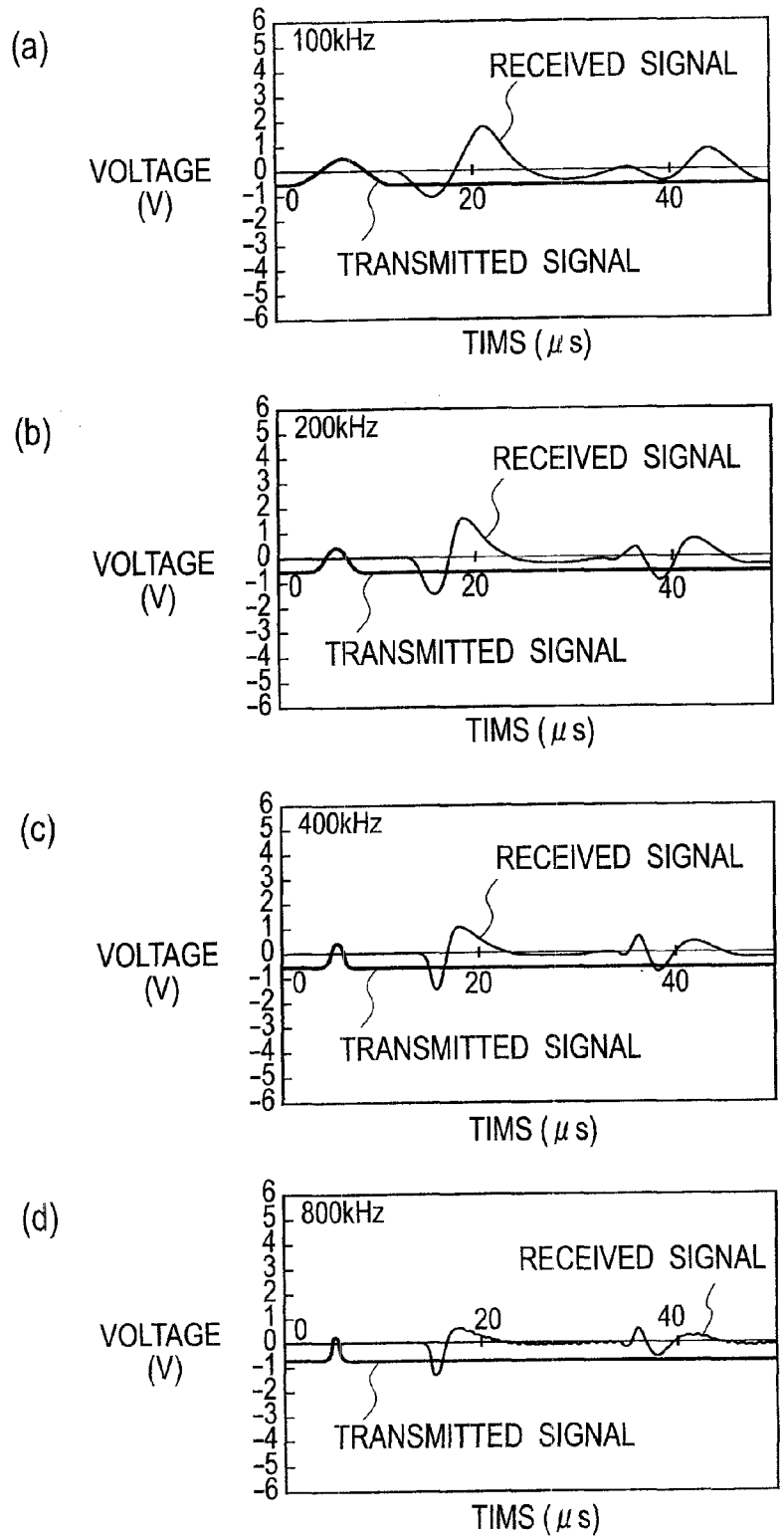
FIG. 10 is a view representing a result when a sine wave signal (a single wave) is supplied to one of the electro-mechanical transducers according to the first embodiment in FIG. 4 and then the transmission/reception is carried out.

Also, FIG. 10 represents results when sine wave signals (unit waves) are supplied respectively to the electret probe (ultrasonic probe) in FIG. 4 and the transmission/receptions are carried out respectively. FIG. 11 represents results when the piezoelectric probe in FIG. 8 is used and the transmission/receptions are similarly carried out respectively, by using the sine wave signals.

In the electret probe (ultrasonic probe) illustrated in FIG. 4, the waveforms close to the input signal are transmitted/received respectively in a wide frequency band, and their sensibilities are not greatly changed respectively. However, in the results of the piezoelectric probe illustrated in FIG. 8, only a signal waveform near the resonant frequency is transmitted/received, and as the frequencies of the input signals leave from the resonant frequency, the transmission/reception sensibilities are greatly decreased. In this way, by using the electret probe (ultrasonic probe) having the microgap, it is possible to obtain the ultrasonic probes having a high transmission/reception sensitivity in a wide band.

In the results represented by FIGS. 5 and 7 and FIGS. 9 to 11, the silicon block 7 is used as a propagation medium, because the acoustic impedance of the silicon block 7 is close to those of water and human body, even when water and human body are used as the propagation medium, the similar performance can be obtained. As one example of diagnostic approach using a medical ultrasonic probe, an approach of injecting a micro babble into the living body and carrying out a contrast imaging of a blood flow is proposed. This approach is a method of receiving the ultrasonic wave that is generated by the resonance, breakdown or disappearance of the micro babble when the ultrasonic wave is irradiated. However, since the sizes of the micro babbles are not regular, there is dispersion in the frequencies of the ultrasonic waves generated by the micro babbles. Since the piezoelectric probe of the resonance type can carry out the reception at only the particular frequency, the reception sensibilities of the ultrasonic waves generated by the micro babbles are reduced. By the ultrasonic wave according to the first embodiment, because the ultrasonic waves of the various frequencies can be transmitted/received, and even if the sizes of the micro babbles are irregular, the many ultrasonic waves can be received as compared with the piezoelectric probe, the contrast imaging effect becomes significant.

—Reason for 1/10 of Gap Width—

Experimental results in which the influences of the ratios between the central line average roughness Ra of the vibrating electrodes 15b and the gap widths $W_g$ on the charge holding characteristics of the electrets will be described here.

Figure 12:
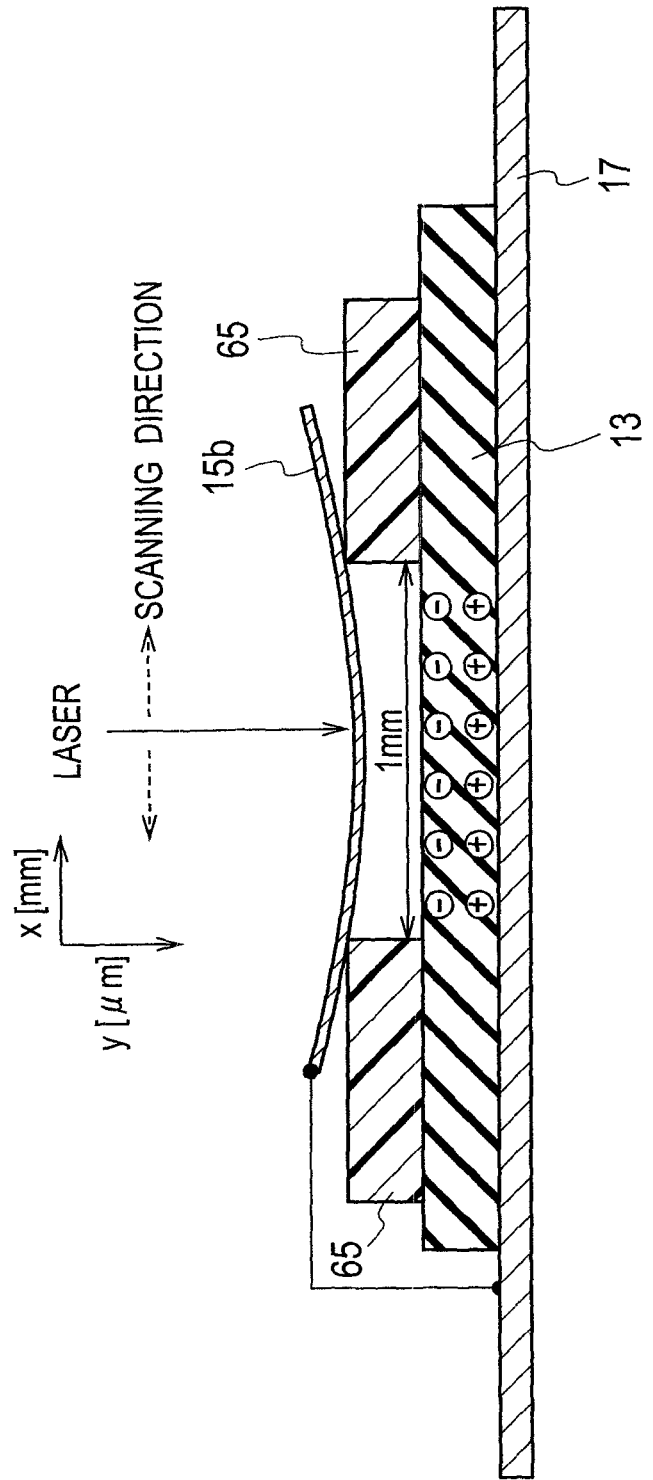
FIG. 12 is a sectional view of a measurement system for measuring a charge holding characteristics of an electret layer by the bending of a vibrating electrode.

At first, as illustrated in FIG. 12, with corona discharge, negative charges were generated on a surface of a tetrafluoroethylene-perfluoroalkyl vinyl ether copolymer (PFA) film having a thickness of 12.5 micrometers, and the electret layer 13 was formed by the PFA film. At this time, the surface potential of the PFA film was −1 kV. Then, the electret layer 13 was placed on the back electrode 17 made of aluminum, and a PFA film 65 having a thickness of 12.5 micrometers, in which a slit having a width of one millimeter is cut, was laminated on the electret layer 13, and the vibrating electrode 15b made of aluminum having a thickness of 50 micrometers was further placed on the PFA film 65. At this time, the vibrating electrode 15b and the back electrode 17, which were arranged respectively on the top side and the bottom side, created a condenser, and inside the air gap formed by the slit having the width of one millimeter, the electric field was established by the electret layer 13, and the vibrating electrode 15b arranged on the top side was pulled and bent. After the vibrating electrode 15b was held in the pulled and bent state for 24 hours, the bending of the vibrating electrode 15b was measured by using a laser displacement meter.

Figure 13:
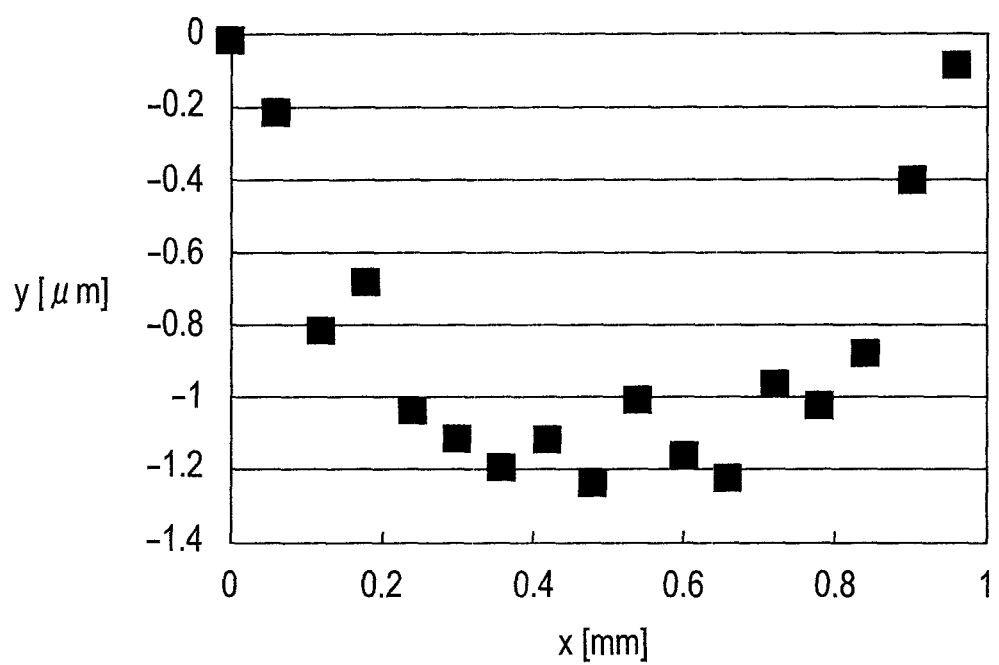
FIG. 13 is an x-y correlation diagram that illustrates the charge holding characteristics of the electret layer illustrated in FIG. 12, by the bending of the vibrating electrode.

FIG. 13 represents measured results. X-axis indicates a horizontal distance (x=0 at the left end of the slit), and a Y-axis indicates a vertical distance (y=0 at the left end of the slit). As illustrated in FIG. 13, the maximum bending of the vibrating electrode 15b was 1.23 micrometers. After that, when the vibrating electrode 15b was removed to measure the surface potential of the electret layer 13, the surface potential was increased to −750 V (the magnitude, or the absolute value of the surface potential was decreased). This was because, since the central line average roughness Ra of the vibrating electrode 15b (which corresponded to the maximum bending of the vibrating electrode 15b, in this experiment) was excessively large, which resulted in the electric field concentration, and consequently, the discharging caused the amount of polarization of the electret layer 13 to be decreased, thereby reducing the magnitude of the surface potential. Then, although the vibrating electrode 15b was again placed above the electret layer 13 and held for one week, the change in the surface potential that exceeded the above magnitude was not recognized. Thus, this indicated that the change in the surface potential caused by the electric field concentration was not generated under this condition. However, at this time, the central line average roughness Ra of the vibrating electrode 15b (which corresponded to the maximum bending of 1.23 micrometers of the vibrating electrode 15b in the experiment illustrated in FIG. 12) was determined to be about 1/10 of the gap width (which is the height 12.5 micrometers of the slit) defined between the bottom surface of the vibrating electrode 15b and the top surface of the electret layer 13. From this experiment, it can be concluded that the central line average roughness Ra of the vibrating electrode 15b was required to be suppressed to be 1/10 or less of the gap width defined between the bottom surface of the vibrating electrode 15b and the top surface of the electret layer 13.

Also, the experiment illustrated in FIG. 12 was carried out in the ambient of air gap. However, when the experiment is executed under the condition such that an insulating film and the like is laminated in the gap, attention should be paid to a possibility of the electric field concentration in the gap, when the dielectric constant of material laminated in the gap is high. In particular, the protrusions forming the microgap cause the dielectric constant to be changed in the surface direction (the vertical direction to the electric field) of the electret layer 13 and the vibrating electrode 15b. Thus, the electric field is likely to be concentrated at the protruded portion as compared with other portions in the microgap. In order to protect the concentration of the electric field, the dielectric constant of the protrusion should be decreased. Specifically, the relative dielectric constant of the protrusion should be set to ten or less and desired to be set to three or less.

When the ferroelectric ceramic whose polarization is very large (0.1 C/m² or more) is used as the electret layer 13, a rate at which the amount of polarization decreases is small, even if the discharging caused by the electric field concentration is similarly generated, as compared with the electret layer 13 implemented by polymers. Thus, when the ferroelectric ceramic of the single-crystal such as a lithium niobate single-crystal is used in the electret layer 13, the central line average roughness Ra of the vibrating electrode 15b can be set to 1/10 or more of the gap width that is defined between the bottom surface of the vibrating electrode 15b and the top surface of the electret layer 13. However, on the other hand, when the poly-crystalline ceramic as the ferroelectric material is used in the electret layer 13, because the insulating characteristics (volume resistance) of the ferroelectric material itself is inferior, a leakage current flowing inside the ferroelectric material causes the drop in the amount of polarization. For this reason, when the ferroelectric ceramic: of the poly-crystal is used as the electret layer 13, the central line average roughness Ra of the vibrating electrode 15b is required to be suppressed to be 1/10 or less of the gap width that is defined between the bottom surface of the vibrating electrode 15b and the top surface of the electret layer 13, similarly to the polymer electret layer 13.

Also, in the experiment illustrated in FIG. 12, although the average magnitude of the electric field of the air gap is known to be about 60 MV/m, if the electric field magnitude can be reduced, the discharging caused by the electric field concentration can be protected. However, on the other hand, when the electric field magnitude is reduced, the amplitude of the vibrating electrode 15b is required to be made high, in order to keep the sensitivity as the microphone, and therefore, the bands of the frequency and the sound pressure will become narrow. Also, the reduction in the electric field magnitude leads to the drop in the transmission output. Because the feature of the electro-mechanical transducer according to the first embodiment of the present invention inheres in the achieved high electric field across the gap, ascribable to the employment of the microgap, the approach for reducing the electric field magnitude so as to protect discharge caused by the electric field concentration should be avoided. Hence, it is necessary to protect discharge caused by the electric field concentration by suppressing the central line average roughness Ra of the vibrating electrode 15b to be 1/10 or less of the gap width defined by the bottom surface of the vibrating electrode 15b and the top surface of the electret layer 13.

<Manufacturing Method of Ultrasonic Probe>

Figure 14:
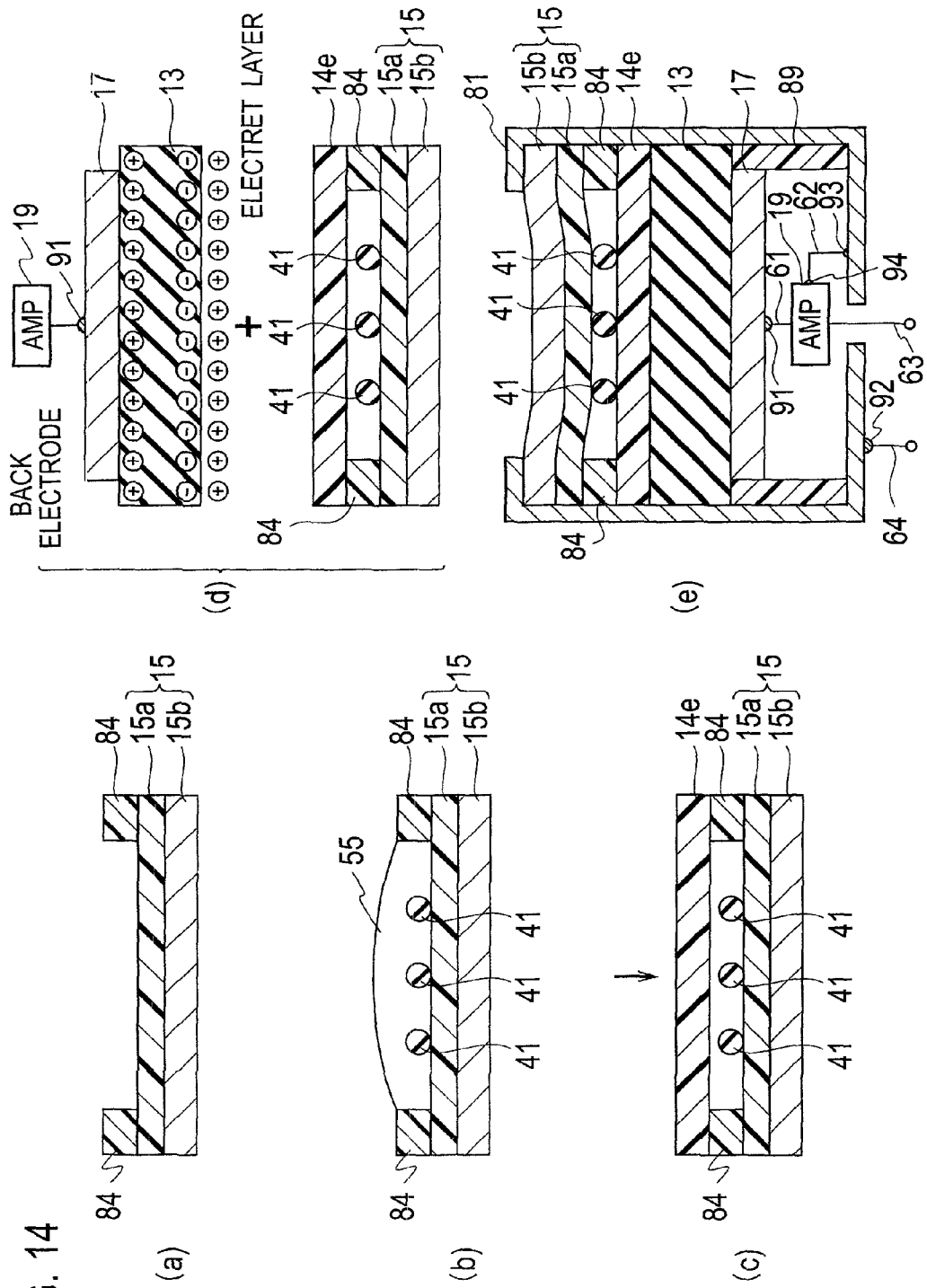
FIG. 14 is a schematic process-flow-sectional view illustrating a rough configuration of the electro-mechanical transducer (ultrasonic probe) according to the first embodiment of the present invention.

The manufacturing method of the electro-mechanical transducer (ultrasonic probe) according to the first embodiment of the present invention will be described below with reference to FIG. 14. By the way, the manufacturing method of the electro-mechanical transducer (ultrasonic probe) described below is recited as one of the examples. Within the scope prescribed by Claims, including the modified examples, the electro-mechanical transducer can be naturally manufactured by using various manufacturing methods other than the example described here.

(a) At first, an Al film as the vibrating plate 15 is deposited on the PET film as the vibrating-electrode-insulating film 15a, and the vibrating plate 15 is formed. A washer of the PET film is placed as a spacer ring 84 on the PET film on which the Al film as the vibrating plate 15 is deposited, as illustrated in FIG. 14(a). The thickness of the spacer ring 84 is set to be slightly thicker than that of the silicon particle serving as the spacers 41. The PET washer as the spacer ring 84 is provided such that at a state illustrated in FIG. 14(e), which will be described later, when the PET washer is assembled into the receptacle 81, the statistic stress except the electro-statistic force of the electret layer 13 is not applied to the microgap portion. However, when the thickness of the PET washer is set to be thicker than that of the silicon particles as the spacers 41 so as to support the vibrating-electrode-insulating film 15a, because the pressure applied to the silicon particle by the electro-statistic force of the electret layer 13 can be decreased, the contact rigidity of the microgap portion can be reduced. In this configuration, although the entire bending of the vibrating-electrode-insulating film 15a supported by the PET washer is made large, as far as the vibrating-electrode-insulating film 15a is in contact with the silicon particles as the spacers 41, Ra determined by the silicon particles can be set to be 1/10 or less of the gap width.

(b) Next, the silicon particles as the spacers 41 are colloidally diffused into a solvent 55 by a dispersant. Then, as illustrated in FIG. 14(b), the solvent 55 is dropped onto the PET film implementing the vibrating plate 15 and dried. Then, the silicon particles as the spacers 41 are coated on the PET film. By the way, differently from the method illustrated in FIG. 14(b), it is allowable to use a method such that preliminarily performing a surface processing on the PET film implementing the vibrating plate 15 so as to form the micro protrusions (spacers 41) at the surface of the vibrating plate 15, beforehand.

(c) Then, as illustrated in FIG. 14(c), the PET film as the electret-insulating layer 14e is placed on the spacer ring 84 and the spacers 41. The microgap is established between the vibrating-electrode-insulating film 15a and the electret-insulating layer 14e, and the entire thickness of the vibrating-electrode-insulating film 15a, the spacers 41 and the electret-insulating layer 14e becomes the macroscopic gap width $W_g$.

(d) Apart from the above flow of procedures (a) to (c), as illustrated in FIG. 14(d), the electret layer 13 having the back electrode 17 is prepared. The back electrode 17 and the electret layer 13 may be metallurgically joined or may be adhered by an adhesive agent and the like, or may be merely brought into contact by a mechanical pressure. For example, a copper electrode as the back electrode 17 is provided on a substrate, under which the amplifying circuit 19 is mounted, and the PET film as the electret layer 13 is placed on the back electrode 17. Then, the PET film is electrified by corona discharge.

(e) Then, the electret layer 13 having the back electrode 17 is stacked on a structure encompassing the electret-insulating layer 14e, which is arranged through the spacer ring 84 and the spacers 41 on the vibrating plate 15, and then, the structure, on which the electret layer 13 is stacked, is assembled into a receptacle 81, as illustrated in FIG. 14(e). By the way, the ferroelectric material can be used as the electret layer 13, such that, for example, PZT in which the polarization directions are aligned, but is not electrified, may be assembled as the electret layer 13 into the receptacle 81, in accordance with the above procedure, and after the assembling of the PZT is finished, and that the PZT is heated to the temperature close to Curie point and held for several seconds to several minutes, and then, when the PZT is cooled to a room temperature so that surface charges of the PZT can be removed so as to form the electret layer 13 by the PZT. When Curie point temperature of PZT is higher than a soldering reflow temperature, as the reflow process of the packaged structure (product) including the ultrasonic probe is carried out, the PZT is changed into the electret layer 13 by the reflow process.

According to the ultrasonic probe pertaining to the first embodiment of the present invention, since the aerial transmission/reception sensitivity is higher than that of the earlier ultrasonic probe, the precisions of the distance measurement and the like can be expected to be improved. Moreover, if a frequency modulation is used, the transmission/reception with higher precision can be further achieved. Specifically, a particular signal pattern is selected to be transmitted by changing the frequency at the time of the transmission. Then, when the transmitted signal pattern is extracted at receiving site, if the particular signal pattern is so selected that the pattern is not generated under noise environment, the received waveform buried in the noise can be identified even in the higher noise environment. This noise protection scheme is an approach peculiar to the ultrasonic probe of the present invention in which the transmission/reception is possible in the wide frequency band. If ultrasonic waves can be transmitted/received in the wider frequency band, because a signal waveform in which only the leading edge is sharp as illustrated in FIG. 5 can be transmitted/received, duplicated reflected waves can be easily discriminated even when a plurality of reflected waves are simultaneously received.

Second Embodiment

Figure 15:
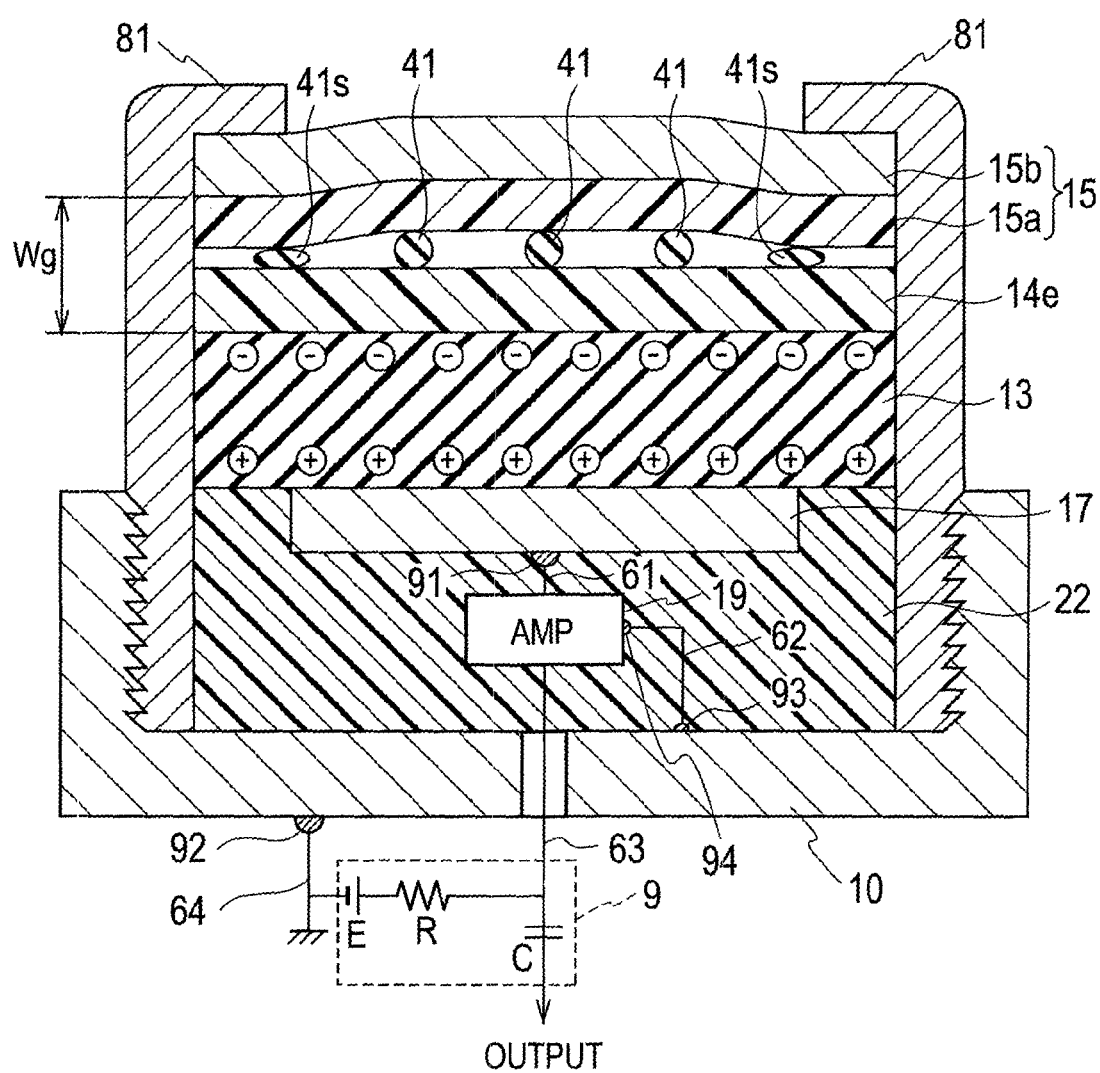
FIG. 15 is a schematic sectional view illustrating a rough configuration of an electro-mechanical transducer (hydrophone) according to a second embodiment of the present invention.

As illustrated in FIG. 15, an electro-mechanical transducer according to a second embodiment of the present invention is a hydrophone which encompasses a vibrating plate 15 that contains a vibrating electrode 15b made of conductor having a flat vibration surface; an electret layer 13 which is defined by the flat first principal surface facing to the vibration surface of the vibrating plate 15 and the second principal surface facing in parallel to the first principal surface and in which the polarization directions are aligned; a back electrode 17 in contact with the second principal surface of the electret layer 13; and amplifying means (19, 9) connected between the vibrating plate 15 and the back electrode 17. As described in the first embodiment, the back electrode 17 and the electret layer 13 may be metallurgically joined or may be adhered by adhesive agent and the like or may be merely brought into contact by the mechanical pressure. The vibrating plate 15 contains a vibrating electrode 15b and a vibrating-electrode-insulating film 15a on the bottom surface of the vibrating electrode 15b, as illustrated in FIG. 13. An electret-insulating layer 14e is arranged on the top surface of the electret layer 13. A plurality of spacers 41 implemented by particles of insulators, each having the particle diameter between ten nanometers and 100 micrometers are inserted between the vibrating-electrode-insulating film 15a and the electret-insulating layer 14e, and the spacers 41 control the interval of "microgap" defined between the vibrating-electrode-insulating film 15a and the electret-insulating layer 14e. As illustrated in FIG. 15, a holder 89 made of a cylindrical insulator is arranged under the circular electret layer 13 and supports the periphery of the electret layer 13. The vibrating plate 15, the electret layer 13, the back electrode 17, a part of the amplifying means (19, 9) and the holder 89 are accommodated in a conductive (metallic) receptacle 81 and implement the hydrophone.

Differently from the ultrasonic probe pertaining to the first embodiment, in the hydrophone according to the second embodiment, only the spacers 41 are arranged between the vibrating-electrode-insulating film 15a and the electret-insulating layer 14e, and the spacer ring 84 illustrated in FIG. 1 is not inserted. On the other hand, in the hydrophone according to the second embodiment, a silicon layer as a matching layer 16 is coated on the vibrating electrode 15b, as illustrated in FIG. 16(b). The matching layer 16 has a role as a protecting layer of the vibrating electrode 15b, in addition to the function for increasing the matching characteristics of the acoustic impedance with the medium.

The amplifying means (19, 9) contains an amplifier (FET) 19 connected to the back electrode 17 and an additional circuit (illustration is omitted) connected to the amplifying circuit 19. However, the amplifying circuit 19 and the additional circuit are buried in a resin layer 22 at the bottom surface side of the back electrode 17. Moreover, a lower portion of the receptacle 81 is screwed into a screw cap 10. The vibrating electrode 15b, the vibrating-electrode-insulating film 15a, the spacers 41, the electret-insulating layer 14e and the electret layer 13 are pushed upward of the receptacle 81 by the screw cap 10, and with this pushing force, the hydrophone can endure the high water pressure. Because the other configurations are substantially similar to those of the ultrasonic probe pertaining to the first embodiment, duplicative explanations are omitted.

For example, in the structure illustrated in FIG. 15, when the surface potential of the electret layer 13 is assumed to be as −4.5 kV, the thickness of the Al film layer as the vibrating electrode 15b is assumed to be as 20 micrometers, each of the thicknesses of the vibrating-electrode-insulating film 15a and the PET layer as the electret-insulating layer 14e is assumed to be as ten micrometers, the silicon particles as the spacers 41 are assumed to be PTFE particles, each having a diameter of two micrometers, and the average interval between the particles is assumed to be as 60 micrometers, the electric field of the microgap becomes about 150 MV/m (the dielectric breakdown strength is 180 MV/m or more). The reception sensitivity of the hydrophone according to the second embodiment becomes −80 dB or more between 20 Hz and 1 MHz. Also, when the vibrating-electrode-insulating film 15a implemented by the PET layer and the electret-insulating layer 14e will be brought into contact with each other, because a hydrostatic pressure of 2.5 MPa or more (which corresponds to a water depth of 2500 meters) is required, and the hydrophone according to the second embodiment can be used until the water depth of 1000 meters, with a drop in the sensitivity of 6 dB or less.

Because the earlier piezoelectric probe hydrophone that can be used up to the water depth of 1000 meters, the maximum sensitivity of −174 dB, in accordance with the hydrophone pertaining to the second embodiment, it is possible to obtain a high sensitivity, which largely exceeds that of the earlier piezoelectric type hydrophone.

<Manufacturing Method of Hydrophone>

The manufacturing method of the electro-mechanical transducer (hydrophone) pertaining to the second embodiment of the present invention will be described below with reference to FIG. 16. By the way, the manufacturing method of the electro-mechanical transducer (hydrophone) which will be described below is recited as one of examples. Within the scope prescribed by Claims, including various modified examples, the electro-mechanical transducer can be naturally fabricated by using various manufacturing methods other than the method described below.

(a) At first, similarly to the manufacturing method of the ultrasonic probe pertaining to the first embodiment, an Al film as the vibrating plate 15 is deposited on a PET film as the vibrating-electrode-insulating film 15a so as to form a vibrating plate 15. On the PET film on which the Al film as the vibrating plate 15 is deposited, the solvent 55 in which silicon particles are colloidally diffused is dropped, and dried so as to provide the silicon particles on the vibrating-electrode-insulating film 15a as the spacers 41. By the way, it is allowable to use a method that preliminarily performs the surface process on the PET film as the vibrating-electrode-insulating film 15a and then forms the micro protrusions (spacers 41). Differently from the manufacturing method of the ultrasonic probe pertaining to the first embodiment illustrated in FIG. 14(a), the washer of the PET film as the spacer ring 84 is not used. Then, as illustrated in FIG. 16(a), the PET film as the electret-insulating layer 14e is placed on the spacers 41. The microgap is established between the vibrating-electrode-insulating film 15a and the electret-insulating layer 14e, and the entire thickness of the vibrating-electrode-insulating film 15a, the spacers 41 and the electret-insulating layer 14e becomes the macroscopic gap width $W_g$.

(b) On the other hand, as illustrated in FIG. 16(a), an electret layer 13 having a back electrode 17 is prepared. Similarly to the manufacturing method of the ultrasonic probe pertaining to the first embodiment, the back electrode 17 and the electret layer 13 may be metallurgically joined or may be adhered by adhesive agent and the like, or may be merely brought into contact by the mechanical pressure. For example, a copper electrode as the back electrode 17 is arranged in the substrate under which an amplifying circuit 19 is mounted, and the PET film as the electret layer 13 is placed on the back electrode 17. Then, the PET film is electrified by corona discharge.

(c) Then, the electret layer 13 having the back electrode 17 is stacked on a structural-body unit encompassing the electret-insulating layer 14e, which is arranged through the spacers 41 on the vibrating plate 15, and then, the structural-body unit, on which the electret layer 13 is stacked, is assembled into a receptacle 81, as illustrated in FIG. 16(b). When the structural-body unit and the electret layer 13 are assembled into the receptacle 81, the bottom surfaces of the back electrode 17 and the electret layer 13 are buried in a resin layer 22. Moreover, the vibrating electrode 15b, the vibrating-electrode-insulating film 15a, the spacers 41, the electret-insulating layer 14e and the electret layer 13 are pushed upward of the receptacle 81 by the screw cap 10. Moreover, a silicon layer as the matching layer 16 is coated on the vibrating electrode 15b. By the way, ferroelectric material can be used as the electret layer 13, for example, PZT, in which the polarization directions are aligned, but the surface of which is not electrified, might be assembled as the electret layer 13 into the receptacle 81, in accordance with the above procedure. After the assembling of the PZT is finished, the PZT is heated to the temperature close to Curie point and held for several seconds to several minutes. Then, when the PZT is cooled to the room temperature, the surface charges of the PZT are removed so as to form the electret layer 13.

Third Embodiment

Figure 17:
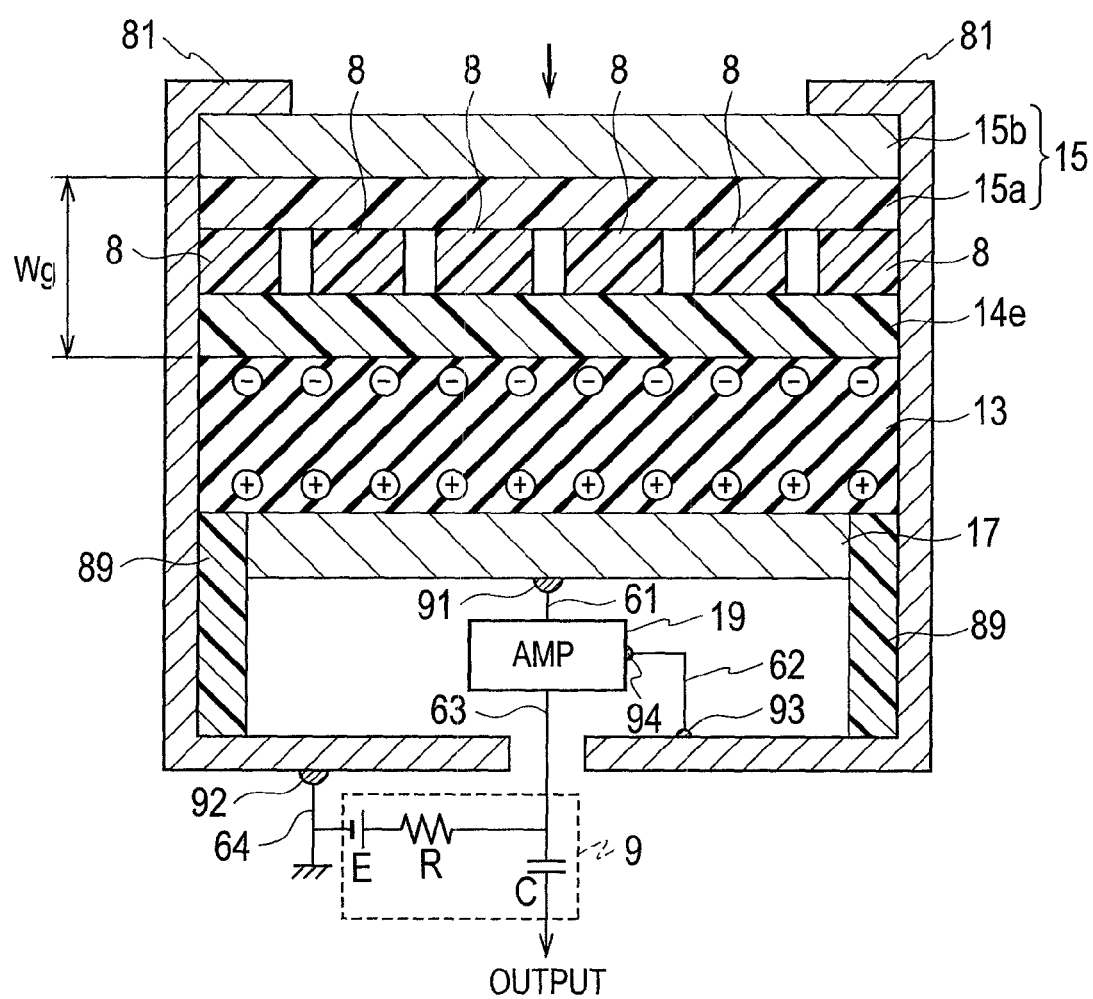
FIG. 17 is a schematic sectional view illustrating a rough configuration of an electro-mechanical transducer (ultrasonic sensor) according to a third embodiment of the present invention.

As illustrated in FIG. 17, an electro-mechanical transducer according to a third embodiment of the present invention is an ultrasonic sensor which encompasses a vibrating plate 15 that contains a vibrating electrode 15b made of conductor having a flat vibration surface; an electret layer 13 which is defined by the flat first principal surface facing to the vibration surface of the vibrating plate 15 and the second principal surface facing in parallel to the first principal surface and in which the polarization directions are aligned; a back electrode 17 in contact with the second principal surface of the electret layer 13; and amplifying means (19, 9) connected to the vibrating plate 15 and the back electrode 17. Similarly to the first and second embodiments, the back electrode 17 and the electret layer 13 may be metallurgically joined or may be adhered by adhesive agent and the like or may be merely brought into contact by the mechanical pressure. Although the illustrations on a plan view and a bird's eye view are omitted, each of the vibrating plate 15, the electret layer 13 and the back electrode 17 in the ultrasonic sensor illustrated in FIG. 17 can employ the shape of the circular disk having the radius, for example, between three nanometers and 40 nanometers. The vibrating plate 15 contains a vibrating electrode 15b and a vibrating-electrode-insulating film 15a at the bottom surface of the vibrating electrode 15b, as illustrated in FIG. 17. Similarly to the first and second embodiments, as necessary, a matching layer may be arranged on the top surface of the vibrating electrode 15b so that the matching characteristics of the acoustic impedance with the medium can be increased. The vibrating plate 15 is vibrated by receiving the acoustic wave. The electret layer 13 is a charged layer from which electric fields diverge to the outside. For example, electrifying the polymer film through corona discharge or by heating the ferroelectric material and removing the surface charges can implement the electret layer 13. The structural-body unit in which the electret-insulating layer 14e is arranged on the top surface of the electret layer 13 is similar to the electro-mechanical transducer according to the first embodiment. However, a spacer layer 8 in which many holes each having a diameter of 0.05 to one millimeter are opened is inserted between the vibrating-electrode-insulating film 15a and the electret-insulating layer 14e, and the interval of "microgap" defined between the vibrating-electrode-insulating film 15a and the electret-insulating layer 14e is controlled. The holder 89 made of the cylindrical insulator is arranged under the circular electret layer 13 and supports the periphery of the electret layer 13. The vibrating plate 15, the electret layer 13, the back electrode 17, the part of the amplifying means (19, 9) and the holder 89 are accommodated in the conductive (metallic) receptacle 81 and implement the ultrasonic sensor. The amplifying means (19, 9) contains the amplifier (FET) 19 connected to the back electrode 17 and the additional circuit 9 connected to the amplifier (FET) 19. The potential across the back electrode 17 and the vibrating plate 15 is amplified by the amplifier (FET) 19. Consequently, the charges that are induced on the electret layer 13 in association with the displacement of the vibration surface of the vibrating plate 15 are measured. The other configurations are substantially similar to those of the electro-mechanical transducer according to the first and second embodiments. Thus, the duplicative explanations are omitted.

Because the electro-mechanical transducer (ultrasonic sensor) according to the third embodiment of the present invention has a configuration such that the spacer layer 8, in which the many holes each having the diameter of 0.05 to one millimeter are opened, is inserted between the vibrating-electrode-insulating film 15a and the electret-insulating layer 14e, vibrations caused by the deformation of portions at the contact points in the microgap portion cannot be barely expected, and only the vibrations caused by the bending of the localized portions above the holes, which are opened by a punching work. Thus, the electric field magnitude cannot be made large, which is not suitable for the transmission. However, the sufficient sensitivity is obtained for only the reception. For example, under the above condition, when the surface potential of the electret layer 13 is 1 kV, the sensitivity becomes −45 dB.

<Manufacturing Method of Ultrasonic Sensor>

Figure 18:
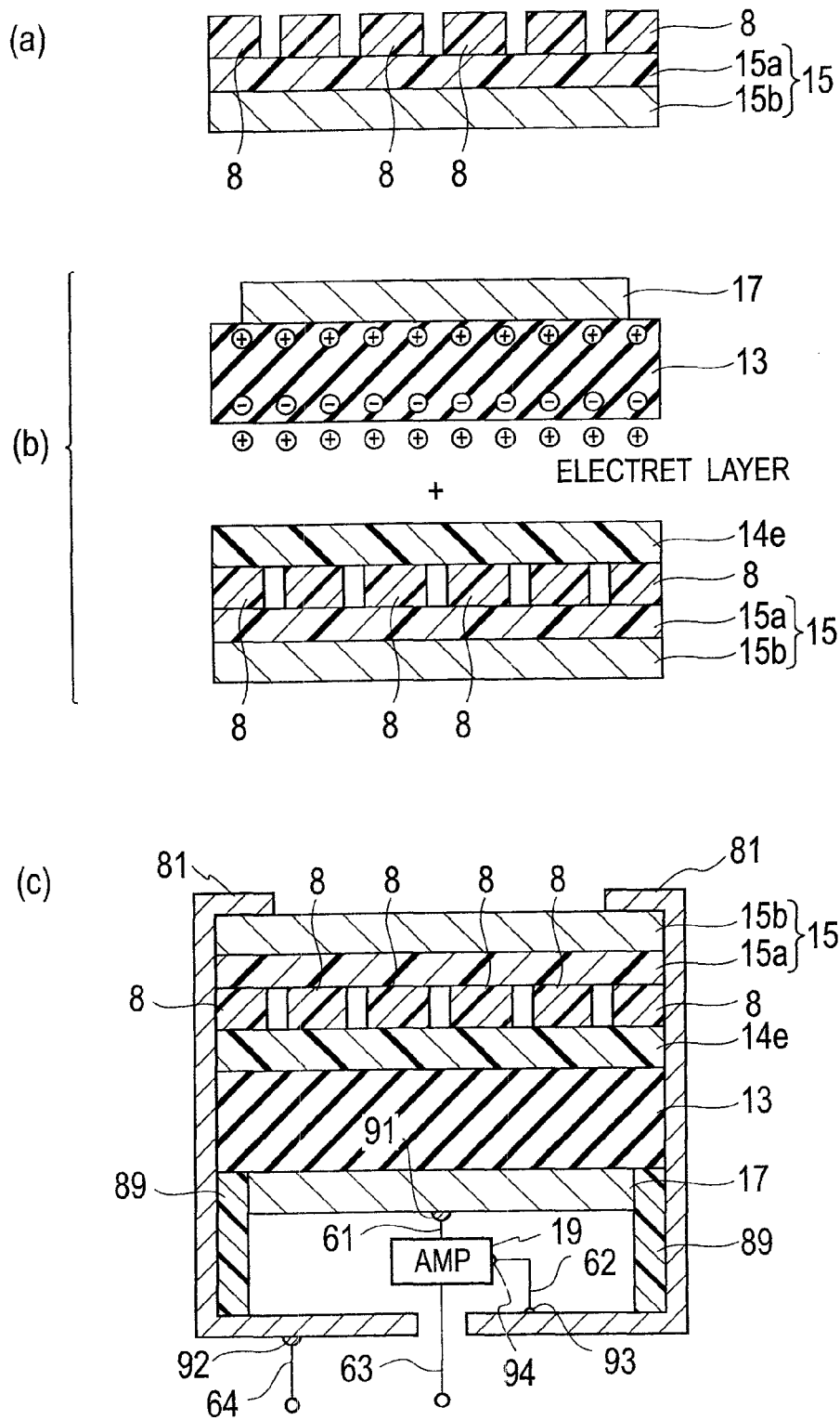
FIG. 18 is a schematic process-flow-sectional view illustrating a manufacturing method of the electro-mechanical transducer (ultrasonic sensor) according to the third embodiment of the present invention.

The manufacturing method of the electro-mechanical transducer (ultrasonic sensor) according to the third embodiment of the present invention will be described below with reference to FIG. 18. By the way, the manufacturing method of the electro-mechanical transducer (ultrasonic sensor), which will be described below, is recited as one of examples. Within the scope prescribed by Claims, including various modified examples, the electro-mechanical transducer (ultrasonic sensor) can be naturally fabricated by using various manufacturing methods other than the following description.

(a) At first, an Al film as the vibrating electrode 15b is deposited on a PET film having a thickness of 40 micrometers, as the vibrating-electrode-insulating film 15a so as to form a vibrating plate 15. On the other hand, in another PET film with a thickness of ten micrometers, many holes, each having a diameter of 50 to 700 micrometers, are opened by punching process such as etching, pressing or laser process so as to form a spacer layer 8. As illustrated in FIG. 18(b), the spacer layer 8 is stacked on the vibrating plate 15, which encompasses the PET film and the Al film deposited on the PET film.

(b) On the other hand, as illustrated in FIG. 18(b), an electret layer 13 having a back electrode 17 is prepared. Similarly to the first and second embodiments, the back electrode 17 and the electret layer 13 may be metallurgically joined or may be adhered by adhesive agent and the like, or alternatively, may be merely brought into contact by the mechanical pressure. For example, a copper electrode as the back electrode 17 is arranged on a substrate under which the amplifying circuit 19 is mounted, and a PET film may be placed on the back electrode 17 as the electret layer 13. Then, the PET film is electrified by corona discharge.

(c) Then, the electret layer 13 having the back electrode 17 is stacked on a structural-body unit encompassing the electret-insulating layer 14e, which is arranged through the spacers layer 8 on the vibrating plate 15, and then, the structural-body unit, on which the electret layer 13 is stacked, is assembled into a receptacle 81, as illustrated in FIG. 18(c). By the way, ferroelectric material can be used as the electret layer 13, for example, PZT, in which the polarization directions are aligned, but the surface of which is not electrified, might be assembled as the electret layer 13 into the receptacle 81, in accordance with the above procedure. After the assembling of the PZT is finished, the PZT is heated to the temperature close to Curie point and held for several seconds to several minutes. Then, when the PZT is cooled to the room temperature, the surface charges of the PZT are removed so as to form the electret layer 13. When Curie point temperature is higher than the soldering reflow temperature and then the reflow process of the packaged structure (product) including the ultrasonic sensor is carried out, PZT is changed into the electret layer 13 by the reflow process.

As mentioned above, because the manufacturing method of the electro-mechanical transducer (ultrasonic sensor) according to the third embodiment of the present invention is simple and easy, the manufacturing cost can be reduced.

Fourth Embodiment

Figure 19:
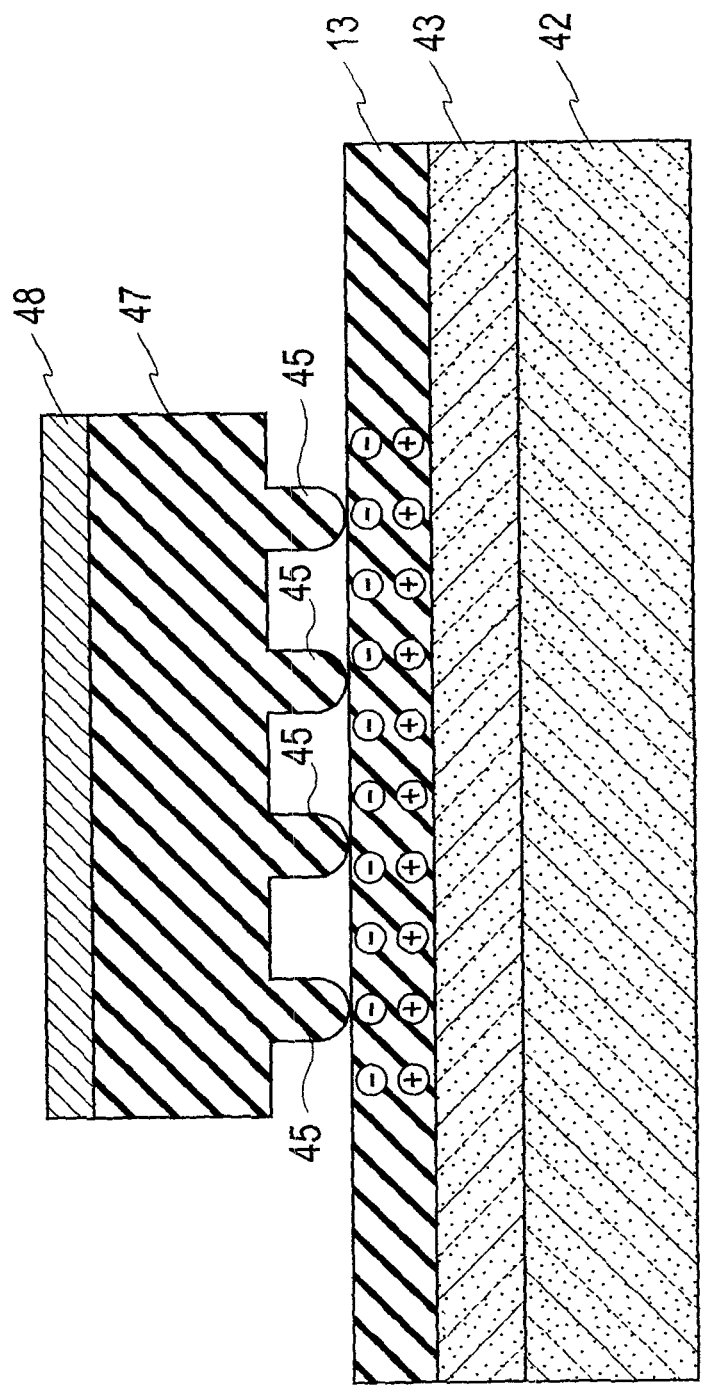
FIG. 19 is a schematic sectional view illustrating a rough configuration of an electro-mechanical transducer (MEMS microphone) according to a fourth embodiment of the present invention.

As illustrated in FIG. 19, an electro-mechanical transducer according to the fourth embodiment of the present invention is an MEMS microphone encompassing vibrating plate (48, 47) implemented by conductor having a flat vibration surface; an electret layer 13 which is defined by a flat first principal surface facing to the vibration surfaces of the vibrating plate (48, 47) and a second principal surface facing in parallel to the first principal surface and in which the polarization directions are aligned; a semiconductor integrated circuit 43 that contains a metal thin film layer serving as a back electrode in contact with the second principal surface of the electret layer 13 and an integrated electronic-circuit serving as an amplifying means connected to this metal thin film layer; and a semiconductor substrate 42 in which the semiconductor integrated circuit 43 is merged at a surface.

The vibrating plate (48, 47) contain a vibrating electrode 48 and a vibrating-electrode-insulating film 47 at the bottom surface of the vibrating electrode 48, as illustrated in FIG. 19. The electret layer 13 is implemented by a silicon oxide film serving as an inter-layer insulating film and a passivation film that are disposed on the semiconductor integrated circuit 43. With corona discharge, the silicon oxide film is electrified and changed into the electret layer 13. Similarly to the first to third embodiments, the metal thin film layer serving as the back electrode that is provided inside the semiconductor integrated circuit 43 and the electret layer 13 may be metallurgically joined or may be adhered by adhesive agent and the like, or alternatively, may be merely brought into contact by the mechanical pressure. However, in view of the multilevel interconnect technique of the semiconductor integrated circuit, as for the metal thin film layer serving as the back electrode formed inside the semiconductor integrated circuit 43 and the electret layer 13, the metallurgical-junction structure can be easily achieved. The PET film is used as the vibrating-electrode-insulating film 47. On the surface of the vibrating-electrode-insulating film 47, a polymer film that is superior in insulation characteristics such as a polyimide film and the like can be printed by ink jet. Consequently, protrusions 45 are formed. The protrusions 45 disposed on the surface of the vibrating-electrode-insulating film 47 control the interval of "microgap" defined between the vibrating-electrode-insulating film 47 and the electret layer 13.

The macroscopic "gap width $W_g$" is defined between the vibrating electrode 48 and the electret layer 13. The vibrating electrode 48 is pulled and bent by the electro-statistic force of the electret layer 13. However, size of concave/convex structure on the surface of the gap side of the vibrating electrode 48 in the deformed state is designed such that the central line average roughness Ra is $1/10$ or less of the gap width.

For this reason, although the MEMS microphone according to the fourth embodiment can achieve a high sensitivity equal to that of the microphone described in the Patent Document 1, the manufacturing method of the MEMS microphone according to the fourth embodiment is simpler and more easy, and the MEMS microphone according to the fourth embodiment can endure the stronger sound pressure.

Fifth Embodiment

Figure 20:
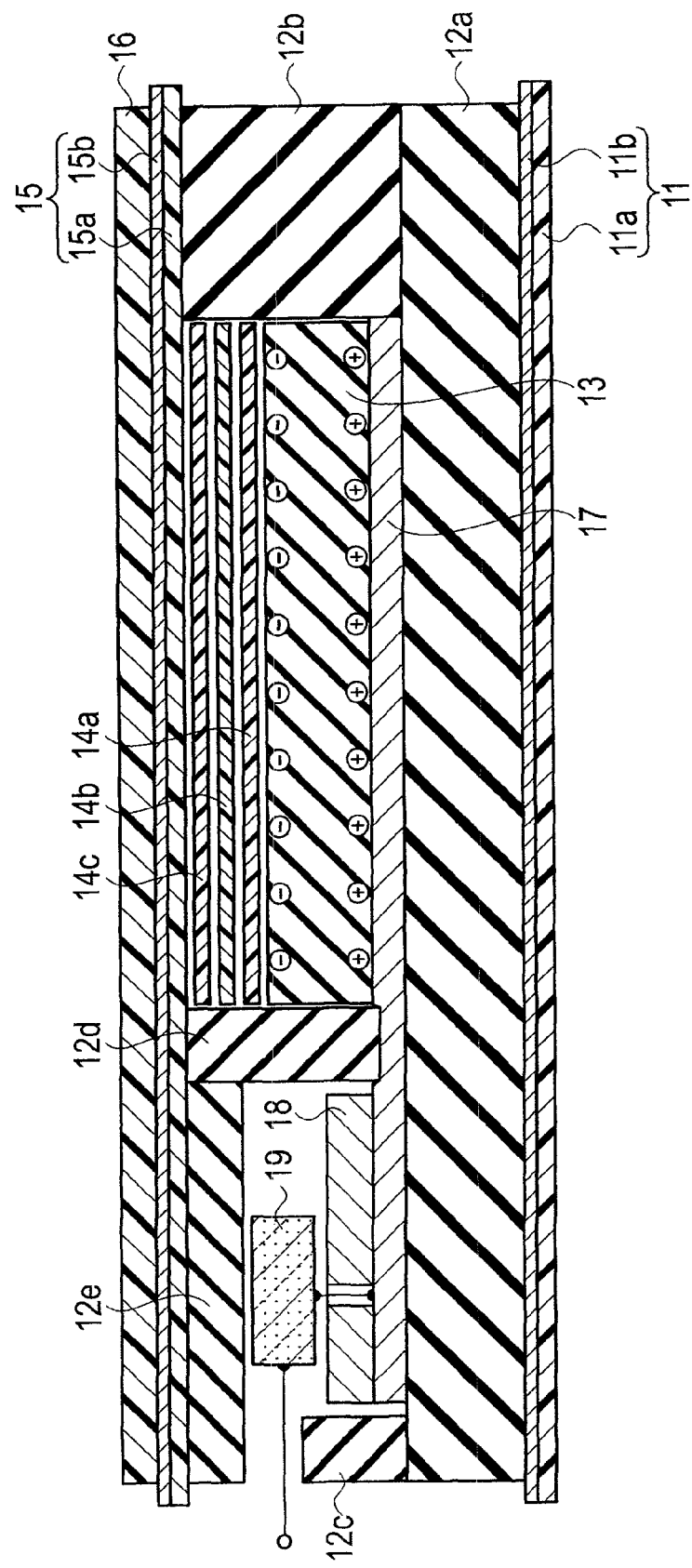
FIG. 20 is a schematic sectional view illustrating a rough configuration of a film-shaped electro-mechanical converter according to a fifth embodiment of the present invention.

As illustrated in FIG. 20, a film-shaped electro-mechanical converter according to a fifth embodiment of the present invention encompasses a vibrating electrode 15b; an electret layer 13 which faces the vibrating electrode 15b so as to provide an element-install cavity in between the vibrating electrode 15b and the electret layer 13; a back electrode 17 in contact with the bottom surface of the electret layer 13; a plurality of gap-insulating layers 14a, 14b and 14c, which are inserted in the element-install cavity, dividing the inside of the element-install cavity in upper and lower directions, so that a plurality of microgaps each having an interval between ten nanometers and 40 micrometers can be laminated in the inside of the element-install cavity; and an amplifying circuit (semiconductor chip) 19 electrically connected between the vibrating electrode 15b and the back electrode 17. The vibrating plate 15 has the flat vibration surface under no load condition.

In the film-shaped electro-mechanical converter according to the fifth embodiment, the effective surface roughness of the respective surface, defining each of the plurality of microgaps, is $1/10$ or less of the gap width $W_g$ of the element-install cavity. In FIG. 20, the gap width $W_g$ of the element-install cavity is defined in a configuration, which corresponds to a state in which the vibrating-electrode-insulating film 15a and all of the plurality of gap-insulating layers 14a, 14b, 14c, . . . are omitted like as the earlier electret microphone, and also the gap width $W_g$ corresponds to a distance between the electret layer 13 and the vibrating electrode 15b. Thus, in the film-shaped electro-mechanical converter according to the fifth embodiment, the gap width $W_g$ of the element-install cavity is defined in the stacked structure implemented by the gap-insulating layer 14a of the first level layer, the gap-insulating layer 14b of the second level layer and the gap-insulating layer 14c of the third level layer, which are disposed beneath the vibration surface of the vibrating plate 15. The polymer film is a film defined by a flat first principal surface facing to the vibrating electrode 15b through the element-install cavity and a second principal surface facing in parallel to the first principal surface, and the polarization directions are aligned in the polymer film.

Although the definition that will be recited below are similarly applied to even in the sixth to thirteenth embodiments of the present invention, "effective surface roughness $Ra_{eff}$ of the surface establishing microgap" in the film-shaped electro-mechanical converter according to the fifth embodiment mean as follows:

(a) the central line average roughness Ra of the convex portions provided at either one of the films between the vibrating-electrode-insulating film 15a and the gap-insulating layer 14c of the third level layer, or alternatively, the central line average roughness Ra when the particles inserted between the vibrating-electrode-insulating film 15a and the gap-insulating layer 14c of the third level layer are considered to implement the convex portions (see FIG. 2) (the central line average roughness Ra of the convex portions provided at either one of the films between the vibrating electrode 15b and the gap-insulating layer 14c of the third level layer when the vibrating-electrode-insulating film 15a is omitted, or alternatively, the central line average roughness Ra when the particles inserted between the vibrating electrode 15b and the gap-insulating layer 14c of the third level layer are considered to implement the convex portions);

(b) the central line average roughness Ra of the convex portions provided at either one of the films between the gap-insulating layer 14c of the third level layer and the gap-insulating layer 14b of the second level layer, or alternatively, the central line average roughness Ra when the particles inserted between the gap-insulating layer 14c of the third level layer and the gap-insulating layer 14b of the second level layer are considered to implement the convex portions;

(c) the central line average roughness Ra of the convex portions provided at either one of the films between the gap-insulating layer 14b of the second level layer and the gap-insulating layer 14a of the first level layer, or alternatively, the central line average roughness Ra when the particles inserted between the gap-insulating layer 14b of the second level layer and the gap-insulating layer 14a of the first level layer are considered to implement the convex portions; and (d) the central line average roughness Ra of the convex portions provided at either one of the films between the gap-insulating layer 14a of the first level layer and the electret-insulating film, or alternatively, the central line average roughness Ra when the particles inserted between the gap-insulating layer 14a of the first level layer and the electret-insulating film are considered to implement the convex portions (the central line average roughness Ra of the convex portions provided at either one of the films between the gap-insulating layer 14a of the first level layer and the polymer film when the electret-insulating film is omitted, or alternatively, the central line average roughness Ra when the particles inserted between the gap-insulating layer 14a of the first level layer and the polymer film are considered to implement the convex portions).

Each thickness of the vibrating plate 15, the gap-insulating layer 14a of the first level layer, the gap-insulating layer 14b of the second level layer and the gap-insulating layer 14c of the third level layer is elected to be about 0.1 micrometer to 100 micrometers, preferably about one micrometer to 40 micrometers, more preferably about one micrometer to 12 micrometers.

The thickness of the polymer film is elected to be about one micrometer to 50 micrometers, in the case of the electret manufactured by corona discharge, preferably one micrometer to 25 micrometers, or more preferably about five micrometers to 25 micrometers. Also, in the case of the electret of the ferroelectric material, its thickness is set to one micrometer to 10 millimeters, preferably five micrometers to two millimeters, or more preferably about 50 to 500 micrometers. However, when the flexibility is expected, the thickness is preferred to be 60 micrometers or less.

Figure 21:
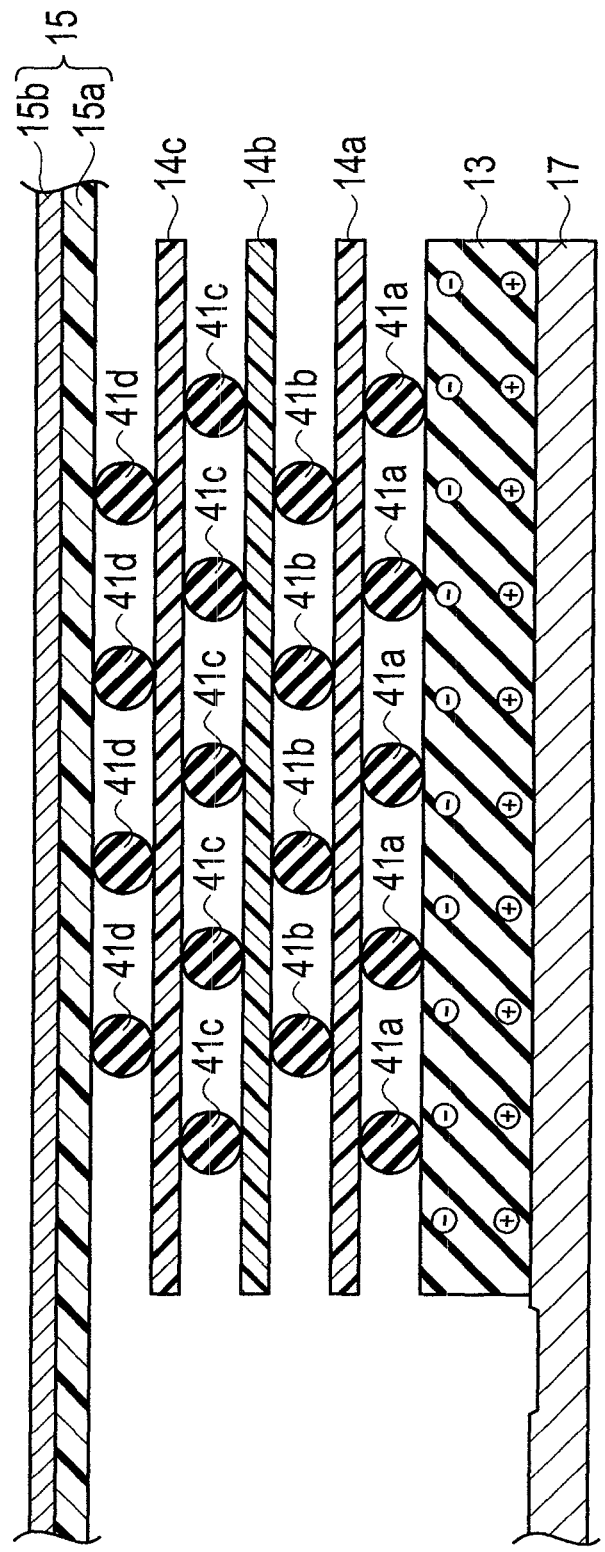
FIG. 21 is a schematic sectional view illustrating a detailed structure of a microgap used in the film-shaped electro-mechanical converter according to the fifth embodiment.

As illustrated in FIG. 21, first spacers 41a implemented by the particles of insulators each having a diameter between ten nanometers and 40 micrometers are inserted between the gap-insulating layer 14a of the first level layer and the polymer film, and second spacers 41b implemented by the particles of insulators each having a diameter between ten nanometers and 40 micrometers are inserted between the gap-insulating layer 14a of the first level layer and the gap-insulating layer 14b of the second level layer, and third spacers 41c implemented by the particles of insulators each having a diameter between ten nanometers and 40 micrometers are inserted between the gap-insulating layer 14b of the second level layer and the gap-insulating layer 14c of the third level layer, and fourth spacers 41d implemented by the particles of insulators each having a diameter between ten nanometers and 40 micrometers are inserted between the vibrating electrode 15b and the gap-insulating layer 14c of the third level layer, and the interval of the gap defined between the vibrating electrode 15b and the polymer film is controlled. In this way, the plurality of gap-insulating layers 14a, 14b, 14c, . . . are laminated and inserted, through the spacers 41a, 41b, 41c, 41d, . . . implemented by the particles of insulators each having the diameter between ten nanometers and 40 micrometers, between the vibrating-electrode-insulating film 15a and the polymer film. Consequently, between the vibrating-electrode-insulating film 15a and the gap-insulating layer 14c of the third level layer, between the gap-insulating layer 14c of the third level layer and the gap-insulating layer 14b of the second level layer, between the gap-insulating layer 14b of the second level layer and the gap-insulating layer 14a of the first level layer and between the gap-insulating layer 14a of the first level layer and the polymer film, "microgaps" that are the respective microscopic air gaps are defined, thereby controlling the respective intervals. The back electrode 17 and the polymer film may be metallurgically joined or may be adhered by adhesive agent and the like, or alternatively, may be merely brought into contact by the mechanical pressure. When the particle diameter of the particle serving as each of the spacers 41a, 41b, 41c, 41d, . . . is set to 100 micrometers or less, the effective surface roughness $Ra_{eff}$ of the surfaces establishing each of the microgaps can be set to $\frac{1}{10}$ or less of the gap width of the element-install cavity that is provided so as to accommodate the microgaps between the bottom surface of the vibrating electrode 15b and the top surface of the polymer film (the effective surface roughness $Ra_{eff}$ includes the bending under a loaded condition). However, in order to achieve the film-shaped electro-mechanical converter that is flexible and has a high degree of freedom in geometrical deformations, the particle diameter of the particle of each of the spacers 41a, 41b, 41c, 41d, . . . is set to ten nanometers to ten micrometers, which is preferable because the entire thickness becomes further thin. Moreover, in a range between ten nanometers and five micrometers, naturally, the particle diameter is desirable to be more and more close to ten nanometers. Although the representations on a plan view and a bird's eye view are omitted, the planer geometries of the vibrating plate 15, the plurality of gap-insulating layers 14a, 14b, 14c, . . . , the polymer film and the back electrode 17 in the film-shaped electro-mechanical converter illustrated in FIG. 20 can employ any shapes. For example, each of the plurality of gap-insulating layers 14a, 14b, 14c, . . . and the polymer film can have a shape of a circular disk having a radius between three millimeters and 40 millimeters. When each of the plurality of gap-insulating layers 14a, 14b, 14c, . . . and the polymer film is assumed to have a shape of a circular disk, each of the vibrating plate 15 and the back electrode 17 may have any planer geometry, such as an ellipse, barrel vault-shape or the like, in which an extension tongue is attached to the semi-circular portion with a radius between three millimeters and 40 millimeters, or alternatively, may have a circular shape that has a diameter larger than the diameters of each of the plurality of gap-insulating layers 14a, 14b, 14c, . . . and the polymer film. On the other hand, when the plurality of gap-insulating layers 14a, 14b, 14c, . . . and the polymer film are made into a rectangular shape, each of the vibrating plate 15 and the back electrode 17 can employ the various planer shapes such as a rectangular planer shape in which extension wings are joined to enlarge the area of the rectangular shape of the dimensions between three millimeters and 40 millimeters and the like. The vibrating plate 15 contains the vibrating electrode 15b made of conductor and the vibrating-electrode-insulating film 15a disposed at the bottom surface of the vibrating electrode 15b, as illustrated in FIG. 20. The thickness of each of the vibrating electrode 15b and the back electrode 17 may be set to ten nanometers to 100 micrometers, preferably ten nanometers to 20 micrometers, or more preferably about 0.1 micrometer to one micrometer.

Furthermore, a vibrating-plate-protection film 16 implemented by an insulating film such as polyvinyl chloride (PVC) film and the like is formed on the top surface of the vibrating plate 15, and the vibrating-plate-protection film 16 serves as the matching layer for increasing the matching characteristics of the acoustic impedance with the medium. Thus, the thickness of the vibrating-plate-protection film 16 may be changed in accordance with the requirement of the matching characteristics, within a range between about 10 and 100 micrometers.

As illustrated in FIG. 21, in a configuration such that the plurality of gap-insulating layers 14a, 14b, 14c, . . . are laminated, if the number of the microgap layers is increased, not only the damping characteristics but also the transmission/reception sensitivity will be improved. The improvement is ascribable to the fact that the amplitude of the vibrating electrode 15b is the summation of the deformations in all of the microgap layers. Thus, unless the acoustic wave (ultrasonic wave) propagated through the gap portion is perfectly attenuated, as the number of the microgap layers increases more, the transmission/reception sensitivity will improve more. In a structure such that the plurality of gap-insulating layers 14a, 14b, 14c, . . . are laminated, because the plurality of gap-insulating layers 14a, 14b, 14c, . . . can cover the increase of the deformation level, a film of a high elastic modulus such as fluorine resin film and the like can be used in each of the plurality of gap-insulating layers 14a, 14b, 14c, . . . . As the fluorine resin, the tetrafluoroethylene-perfluoroalkyl vinyl ether copolymer (PFA) is typical. In addition to the fluorine resin, it is possible to use PET resin (3 GPa), polyphenylene-sulfide (PPS) resin (4 GPa), polyimide resin (3 to 7 GPA) and the like. However, attention should be paid to a fact that in order to increase the lamination number of the plurality of gap-insulating layers 14a, 14b, 14c, . . . , the increase of the width of the entire gap will lead to the drop in the electric field strength in the gap.

If the film-shaped electro-mechanical converter is applied to a transmitter, the amplifying circuit 19 amplifies an input electric signal and the amplified electric signal is provided between the vibrating electrode 15b and the back electrode 17. On the other hand, if the film-shaped electro-mechanical converter is applied to a receiver, the amplifying circuit 19 amplifies the signal between the vibrating electrode 15b and the back electrode 17 so as to measure the charges induced in association with the displacement of the vibrating electrode 15b. In the film-shaped electro-mechanical converter for the transmitter, the vibrating plate 15 is vibrated by supplying the electric signal between the vibrating electrode 15b and the back electrode 17 through the amplifying circuit 19. On the other hand, in the film-shaped electro-mechanical converter for receiver, the vibrating plate 15 is vibrated by the reception of the acoustic wave from the outside.

The polymer film is the charged layer from which electric fields diverge to the outside. For example, the polymer film is electrified by corona discharge, and the ferroelectric material is heated to remove the surface charges so as to implement the polymer film. Although the illustration is omitted, the electret-insulating film may be laminated on the top surface of the polymer film, and the first spacers 41a may be provided on the electret-insulating film. As illustrated in FIG. 20, the plurality of gap-insulating layers 14a, 14b, 14c, . . . and the polymer film are accommodated in the inside of a box-shaped inner insulation container (12b, 12d), and the vibrating plate 15 serves as a cover of the inner insulation container (12b, 12d), and the back electrode 17 serves as the bottom plate of the inner insulation container (12b, 12d). Moreover, the structure in which the plurality of gap-insulating layers 14a, 14b, 14c, . . . and the polymer film are accommodated in the inside of the inner insulation container (12b, 12d) is further accommodated into an outer insulation container (12a, 12b and 12c) in which the spacer film 12a made of an insulation material serves as the bottom plate, together with the amplifying circuit 19. The vibrating plate serves as the cover of the outer insulation container (12a, 12b and 12c). A conductive (metallic) shielding-conductor film 11b is provided at the bottom of the outer insulation container (12a, 12b and 12c), and a shielding-conductor-protection film 11a is provided under the bottom of the shielding-conductor film 11b. The shielding-conductor-protection film 11a and the shielding-conductor film 11b implement a shield plate 11. Each of the spacer film 12a and the shielding-conductor-protection film 11a can be elected to be a value between about five micrometers and 150 micrometers, or preferably a value between about 50 and 100 micrometers.

For example, when the polymer film, the gap-insulating layers 14a, 14b, 14c, . . . and the vibrating-electrode-insulating film 15a are made of the PFA films, each of their thicknesses can be set to about ten micrometers. When the vibrating electrode 15b and the back electrode 17 are made of the Al films, each of their thicknesses can be set to about ten micrometers. Also, when the vibrating-plate-protection film 16 is made of the PVC film, its thickness can be about 50 micrometers, and when the spacer film 12a and the shielding-conductor-protection film 11a are made of the PVC films, the thickness of each of the spacer film 12a and the shielding-conductor-protection film 11a can be set to about 100 micrometers. In FIG. 20, the thicknesses of side-wall films 12b, 12d that serve as the side-plate blocks of the box-shaped insulation container (12a, 12b, 12d and 12e) may be designed by considering the thicknesses of the polymer films, the number of the gap-insulating layers 14a, 14b, 14c, . . . and the respective thicknesses of the gap-insulating layers 14a, 14b, 14c, . . . . However, in order to make the insulation container (12a, 12b, 12d and 12e) flexible, the thickness of about 100 micrometers is preferable.

Under no load condition, the first principal surface of the polymer film faces in parallel to the vibration surface of the vibrating plate 15. Here, the amplifying means encompasses an amplifying circuit 19 in which the amplifier (FET) connected to the back electrode 17 is integrated, and an additional circuit (illustration is omitted) connected to the amplifying circuit 19. FIG. 20 shows the film-shaped electro-mechanical converter for receiver. However, in the film-shaped electro-mechanical converter for receiver, the additional circuit encompasses a direct current power supply E whose one terminal, is grounded; a buffer resistor R connected between the direct current power supply E and the amplifying circuit 19; and a coupling capacitor C in which one electrode is connected to a connection node between the buffer resistor R and the amplifying circuit 19, and the other electrode serves as an output terminal. External circuitry (illustration is omitted) is connected to the output terminal of the coupling capacitor C serving as the output terminal of the amplifying circuit 19, and the external circuitry carries out a signal process necessary for a communication unit and a recording/storage unit that are connected to a microphone. In the amplifying circuit 19 in the film-shaped electro-mechanical converter according to the fifth embodiment, the potential across the back electrode 17 and the vibrating plate 15 is amplified by the amplifying circuit 19, and the charges induced onto the polymer film in association with the displacement of the vibration surface of the vibrating plate 15 is measured. On the other hand, in the film-shaped electromechanical converter for transmitter, the additional circuit encompasses a direct current power supply E whose one terminal is grounded; a buffer resistor R connected between the direct current power supply E and the amplifying circuit 19; and a coupling capacitor C in which one electrode is connected to the connection node between the buffer resistor R and the amplifying circuit 19, and the other electrode serves as an input terminal. External circuitry (illustration is omitted) is connected to the input terminal of the coupling capacitor C serving as the input terminal of the amplifying circuit 19, and an input signal is supplied from the external circuitry, and the input signal amplified by the amplifying circuit 19 is applied across the back electrode 17 and the vibrating plate 15.

The macroscopic "gap width $W_g$ of element-install cavity" is defined between the vibrating electrode 15b and the polymer film. The $W_g$ lies in a range between 0.1 micrometer and 1000 micrometers. The microgap is defined for each of the microscopic air gaps established between the vibrating-electrode-insulating film 15a and the gap-insulating layer 14c of the third level layer (between the vibrating electrode 15b and the gap-insulating layer 14c of the third level layer when the vibrating-electrode-insulating film 15a is omitted), between the gap-insulating layer 14c of the third level layer and the gap-insulating layer 14b of the second level layer, between the gap-insulating layer 14b of the second level layer and the gap-insulating layer 14a of the first level layer, and between the gap-insulating layer 14a of the first level layer and the electret-insulating film (the gap-insulating layer 14a of the first level layer and the polymer film when the electret-insulating film is omitted) is the gap, in each of which the gap width is set to be between ten nanometers and 40 micrometers and the dielectric breakdown strength of air in each of the gaps is achieved to be between 5 and 200 MV/m, the value of which is improved as compared with the macroscopic gap. For the gap width $W_g$ of the macroscopic element-install cavity, the dielectric breakdown strength of air is about 3 MV/m. However, when the insulating gas such as the fluorine based gas and the like other than air is filled in the gap width $W_g$ of the macroscopic element-install cavity, or when the macroscopic element-install cavity is evacuated to establish vacuum, the dielectric breakdown strength in the macroscopic element-install cavity can be further improved.

Because the vibrating electrode 15b is pulled and deformed by the electrostatic force between the polymer film and the vibrating electrode 15b, the dielectric breakdown strength of the microgap decreases. In order to obtain a high dielectric breakdown strength as mentioned above, the effective surface roughness $Ra_{eff}$ of a plane defining the microgap must be $\frac{1}{10}$ or less of the gap width of the element-install cavity, as described by using FIG. 12 and FIG. 13.

Any material may be used for the vibrating plate 15, as far as the bending of the vibrating-electrode-insulating film 15a or vibrating electrode 15b can be made to be $\frac{1}{10}$ or less of the gap width $W_g$ of the element-install cavity, the vibrating electrode 15b can be made to be superior in electrical conductivity, and the vibrating-electrode-insulating film 15a can be made to be superior in electrical insulation. Although the vibrating plate 15 is required to be high in rigidity, the light weight is preferable in order to be able to follow the high frequency. For this reason, the material having the high value of the specific rigidity ((elastic modulus)/density) is preferred to be used for one of the vibrating electrode 15b of the vibrating plate 15, the vibrating-electrode-insulating film 15a at the bottom surface of the vibrating electrode 15b, and the matching layer (whose illustration is omitted in FIG. 20) on the top surface of the vibrating electrode 15b. For this reason, as for the vibrating plate 15, aluminum (Al) and its alloy, or magnesium (Mg) and its alloy can be used as the vibrating electrode 15b, and a structure in which the FEP layer is laminated as the vibrating-electrode-insulating film 15a can be employed. Or, PET resin, polyethylene naphthalate (PEN) resin, epoxy resin, phenol resin and the like can be used as the vibrating-electrode-insulating film 15a, and aluminum may be deposited on the vibrating-electrode-insulating film 15a so as to implement the vibrating electrode 15b. Or, alumina, silicon nitride, silicon carbide ceramics and the like can be used as the vibrating-electrode-insulating film 15a, and on the vibrating-electrode-insulating film 15a, aluminum may be deposited or silver may be burned so as to implement the vibrating electrode 15b. In addition, a silicon substrate provided with a FEP resin layer or a silica layer, and the like, which is known to be used in the insulating layer of the earlier electret microphone, can be used for the vibrating-electrode-insulating film 15a. However, in this case, the thickness is required to be increased such that the bending is $\frac{1}{10}$ or less of the gap width of the element-install cavity. Thus, the present scheme largely differs from the designing scheme of the earlier electret microphone. Also, the other resins that are superior in insulation (silicon based resin, fluorine based resin, polyethylene based resin, polyester, polypropylene, polycarbonate, polystyrene, urethane, ABS, flexible vinyl chloride and the like) may be used as the vibrating-electrodeinsulating film 15*a*, and the vibrating electrode 15*b* may be attached on the vibrating-electrode-insulating film 15*a*, by adhesion, deposition or burning, so as to implement the vibrating plate 15. In this scheme, the thickness of the vibrating electrode 15*b* or vibrating-electrode-insulating film 15*a* shall be increased to ensure the rigidity necessary for the vibrating plate 15.

The material superior in electric insulation characteristics shall be used for the spacers 41*a*, 41*b*, 41*c*, 41*d*, . . . . Specifically, the ceramics such as silica, alumina, silicon nitride, silicon carbide and the like, the resin such as silicon based resin, fluorine based resin, polyethylene resin (including PET and the like), polyester, polypropylene, polycarbonate, polystyrene, urethane, ABS, flexible vinyl chloride and the like can be used. Also, the material whose elastic modulus is 2 GPa or less can be used for the spacers 41*a*, 41*b*, 41*c*, 41*d*, . . . . However, when there is the vibrating-electrode-insulating film 15*a* on the side of the vibrating plate 15 and also the elastic modulus of the vibrating-electrode-insulating film 15*a* is 2 GPa or less, there is no limit on each of elastic modulus of the spacers 41*a*, 41*b*, 41*c*, 41*d*, . . . . As the material having the superior electric insulation characteristics and the elastic modulus of 2 GPa or less, specifically, there are silicon based resin, the fluorine based resin, the polyethylene based resin, and the resins such as polyester, polypropylene, polycarbonate, polystyrene, urethane, ABS, flexible vinyl chloride and the like.

As for the spacers 41*a*, 41*b*, 41*c*, 41*d*, . . . , in addition to the particles whose particle diameter is between ten nanometers and 100 micrometers as illustrated in FIG. 21, the spacers 41 as the micro protrusions having a height between ten nanometers and 40 micrometers may be provided on the top surface of the gap-insulating layer 14*c* of the third level layer, as illustrated in FIG. 2. The spacers 41 can be provided at the top surface of the gap-insulating layer 14*c* of the third level layer, by means of tri pulse laser irradiation, lithography, etching, press and the like. Or, when the bottom surface of the vibrating-electrode-insulating film 15*a* or the vibrating-electrode-insulating film 15*a* is omitted, the micro protrusions having a height between ten nanometers and 40 micrometers may be formed at the bottom surface of the vibrating electrode 15*b*. Similarly, instead of the spacers 41*d* implemented by the particles of the insulator having a particle diameter between ten nanometers and 40 micrometers, the micro protrusions having a height between ten nanometers and 40 micrometers may be arranged at the bottom surface of the gap-insulating layer 14*c* of the third level layer. Moreover, instead of the spacers 41*b*, 41*c*, each of which are implemented by the particles of the insulator having a particle diameter between ten nanometers and 40 micrometers, the micro protrusions having a height between ten nanometers and 40 micrometers may be provided to at least one of the bottom surface and the top surface of the gap-insulating layer 14*b* of the second level layer, and instead of the spacers 41*a*, 41*b*, each of which are implemented by the particles of the insulator having a particle diameter between ten nanometers and 40 micrometers, the micro protrusions having a height between ten nanometers and 40 micrometers may be provided to at least one of the bottom surface and the top surface of the gap-insulating layer 14*a* of the first level layer. Moreover, when the electret-insulating film is laminated on the polymer film and when the top surface of the electret-insulating film and the electret-insulating film are omitted, the micro protrusions having a height between ten nanometers and 40 micrometers may be provided at the top surface of the polymer film. In order to achieve the film-shaped electro-mechanical converter that is flexible and has a high degree of freedom in geometrical deformations, the micro protrusions shall be set to a height between ten nanometers and ten micrometers so that the entire thickness can be made thinner. More preferably, the height, which is closer and closed to ten nanometers, in the range between ten nanometers and five micrometers, is preferable.

Each of the particle and the protrusion serves as the supporting member between the vibrating-electrode-insulating film 15*a* and the gap-insulating layer 14*c* of the third level layer (between the vibrating electrode 15*b* and the gap-insulating layer 14*c* of the third level layer when the vibrating-electrode-insulating film 15*a* is omitted), between the gap-insulating layer 14*c* of the third level layer and the gap-insulating layer 14*b* of the second level layer, between the gap-insulating layer 14*b* of the second level layer and gap-insulating layer 14*a* of the first level layer, and between the gap-insulating layer 14*a* of the first level layer and the electret-insulating film (the gap-insulating layer 14*a* of the first level layer and the polymer film when the electret-insulating film is omitted). Consequently, the microgaps are formed. As far as the microgaps can be formed, the shapes of the spacers 41*a*, 41*b*, 41*c*, 41*d*, . . . may be arbitrary. However, the curvature of the contact points of the protrusions is desired to be large. Also, when the layer having a surface roughness whose maximum height ($R_{max}$) is between ten nanometers and 100 micrometers is stacked as illustrated in FIG. 3, the microgap can be formed without the spacers 41*a*, 41*b*, 41*c*, 41*d*, . . . .

As mentioned above, the vibrating-electrode-insulating film 15*a*, the gap-insulating layer 14*a* of the first level layer, the gap-insulating layer 14*b* of the second level layer, the gap-insulating layer 14*c* of the third level layer and the electret-insulating film, the illustration of the electret-insulating film is omitted, are the layers of insulators, at the surface of which protrusions between ten nanometers and 100 micrometers are formed, or alternatively, on the surface of which particles whose particle diameters are between ten nanometers and 100 micrometers are adhered. Although FIGS. 20 and 21 exemplify the case in which the three insulating films of the gap-insulating layer 14*a* of the first level layer, the gap-insulating layer 14*b* of the second level layer and the gap-insulating layer 14*c* of the third level layer are laminated, as necessary, the insulating layers can be further laminated, so as to increase the number of the microgap layers. Or, only on the surface of a part of the insulating layers, the protrusions may be formed or the particles may be adhered, and the remainders may be tightly adhered or dried and brought into contact, thereby enabling the microgap to be formed through the surface roughness. As far as the gap width is limited to be 100 micrometers or less, as the lamination number of the insulating films increases, the acoustic damping characteristics improves. Also, as the insulating layer becomes thicker, the gap width becomes larger, and the large gap width can protect the drop in the dielectric breakdown strength of the microgap, which is caused by the bending of the vibrating electrode 15*b*. However, because the increase in the gap width leads to the drop in the electric field strength in the gap, the optimal number of the laminations is determined on the basis of the thickness of the insulating layer, the structure of the microgap and the like.

The polymer film must have the surface potential that enables the electric field between 5 and 200 MV/m to be generated in the gap. As the typical example of the polymer film, it is possible to use an insulating layer electrified by corona discharge, or a ferroelectric layer electrified by heating, and the like, which is described in the electro-mechanical transducer according to the first embodiment of the present invention. The thickness of the polymer film can be selected to be, for example, about 10 and 50 micrometers in the case of the poly-tetrafluoroethylene (PTFE) film electrified by corona discharge, and about 0.5 millimeter to two millimeters in the case of using PZT as ferroelectric material. Then, the thicknesses of the back electrode 17 and the vibrating plate 15 can be selected to, for example, about one micrometer to 100 micrometers in the case of an Al deposited PET film. However, the specific thicknesses and radiuses of the vibrating plate 15, the polymer film and the back electrode 17 may be determined on the basis of design schemes, requested performances and detailed requested particulars.

The amplifying circuit 19 is installed (mounted) on a circuit board 18, in the vicinity of the left end of the back electrode 17. A through hole (via) is made in the circuit board 18, and through the through hole (via), the amplifying circuit 19 is electrically connected to the back electrode 17, through a solder that is fused and connected to the vicinity of the left end of the back electrode 17. Although the illustration is omitted, the ground wiring from the amplifying circuit 19 is connected to the shielding-conductor film 11b of the shield plate 11 through solder.

Penetration holes (illustration is omitted) that penetrate through the back electrode 17, the plurality of gap-insulating layers 14a, 14b, 14c, . . . and the polymer film are made in the back electrode 17, the plurality of gap-insulating layers 14a, 14b, 14c, . . . and the polymer film. However, the penetration holes are sealed by using the solders so that (as necessary) the gas having high insulation characteristics (the insulating gas) can be sealed in the gap space between the polymer film and the vibrating plate 15. As the insulating gas, it is possible to employ nitrogen, sulfur hexafluoride and the like. In addition to the insulating gas, even if the insulating fluid such as silicon oil and the like can be filled in the gap space implemented by the plurality of gap-insulating layers 14a, 14b, 14c, . . . between the polymer film and the vibrating plate 15 so that the dielectric breakdown strength can be increased, which makes the generation of the discharge difficult. As a result, the amount of charges generated on the surface of the polymer film by discharge, can be reduced, thereby improving the sensitivity. Instead of the method of filling the insulating gas or insulating fluid, the gap space between the polymer film and the vibrating plate 15 is evacuated to establish vacuum, which can improve the sensitivity.

By the way, each of the vibrating plate 15, the polymer film and the back electrode 17 is not required to have a shape of the circular disk, and various geometrical shapes such as an ellipse, a rectangle or the like are allowable, but naturally, the other constituent members such as the shield plate 11 and the like shall be designed to be fitted to the geometric shapes of the vibrating plate 15, the polymer film and the back electrode 17.

—Dielectric Breakdown Strength of Air in Micro Gap—

When a potential difference is applied across two electrodes having air gap, it is known that the dielectric breakdown strength of air is increased under atmospheric pressure, as the inter-electrode distance is decreased and the maximum value is established when the inter-electrode distance lies between about one micrometer and two micrometers. However, as the curvature of the protrusion at the surface of the electrode becomes higher, the electric field is more concentrated at the protruded portion, and the dielectric breakdown strength decreases further. Thus, when size of concave/convex structure at the electrode surface is represented by the central line average roughness Ra, Ra must be $1/10$ or less of the gap width, and Ra is desired to be $1/100$ or less.

In any of the earlier electret microphones, the vibrating electrode is largely deformed by the electrostatic force between the electret layer, and the central line average roughness Ra of the surface of the vibrating electrode indicates the value that includes the deformation caused by the bending of the vibrating electrode. Thus, the central line average roughness Ra of the vibrating electrode of the earlier electret microphone exceeds $1/10$ of the gap width $W_g$ of the element-install cavity (in FIG. 20, as mentioned above, the earlier electret microphone corresponds to a case in which all of the vibrating-electrode-insulating film 15a and the plurality of gap-insulating layers 14a, 14b, 14c, . . . are omitted, and the gap width $W_g$ is the distance between the polymer film and the vibrating electrode 15b).

In the film-shaped electro-mechanical converter according to the fifth embodiment, the width of each of the microgaps between the vibrating-electrode-insulating film 15a and the gap-insulating layer 14c of the third level layer (between the vibrating electrode 15b and the gap-insulating layer 14c of the third level layer when the vibrating-electrode-insulating film 15a is omitted), between the gap-insulating layer 14c of the third level layer and the gap-insulating layer 14b of the second level layer, between the gap-insulating layer 14b of the second level layer and the gap-insulating layer 14a of the first level layer, and between the gap-insulating layer 14a of the first level layer and the electret-insulating film (between the gap-insulating layer 14a of the first level layer and the polymer film when the electret-insulating film is omitted) determines the dielectric breakdown strength of air.

In the film-shaped electro-mechanical converter according to the fifth embodiment, the insertions of the vibrating-electrode-insulating film 15a and the plurality of gap-insulating layers 14a, 14b, 14c, . . . enable the gap width $W_g$ of the element-install cavity to be enlarged, and consequently the film-shaped electro-mechanical converter according to the fifth embodiment enables the central line average roughness Ra (that includes the displacement caused by the bending of the vibrating electrode 15b through the spacers 41a, 41b, 41c, 41d, . . . ) of the bottom surface of the vibrating-electrode-insulating film 15a (the bottom surface of the vibrating electrode 15b, when the vibrating-electrode-insulating film 15a is omitted) to be $1/10$ or less of the gap width $W_g$. Also, the surface roughnesses of the top surfaces and the bottom surfaces of the gap-insulating layers 14a, 14b, 14c, . . . and the top surface of the electret-insulating film (the top surface of the polymer film when the electret-insulating film is omitted) similarly have influence on the dielectric breakdown strength of air in the gap. Also, Ra of the top surface of the electret-insulating film must be $1/10$ or less of the gap width, and Ra is desired to be $1/100$ or less.

In this way, in the film-shaped electro-mechanical converter according to the fifth embodiment, because the dielectric breakdown strength of air is set to be high, the pressure resistance is very high. Thus, as illustrated in FIG. 20, when the pressure receiving plane contains the vibrating-plate-protection film 16, differently from the earlier film-shaped electro-mechanical converter, the film-shaped electro-mechanical converter is not required to be stored in a receptacle, and the film-shaped electro-mechanical converter can be used, by pasting the film-shaped electro-mechanical converter onto a necessary portion. Also, the film-shaped electro-mechanical converter according to the fifth embodiment can be used as a waterproof microphone, because the structure having the high waterproof characteristics can be easily achieved. Moreover, the film-shaped electro-mechanical converter can be used as a pressure sensor for detecting a pressure fluctuation of 10 Hz or more in the fluid and the living body. Because the earlier film-shaped electro-mechanical converter is low in pressure resistance, the microphone device is accommodated in a receptacle so that the pressure receiving plane can be protected. However, in the film-shaped electro-mechanical converter according to the fifth embodiment, because the vibrating-plate-protection film 16 and the like are used to protect the surface of the vibrating electrode 15b from being damaged, even if the pressure receiving plane is directly thrummed with a finger and the like, the sensitivity is never deteriorated.

—Reception Sensitivity—

When the film-shaped electro-mechanical converter according to the fifth embodiment is used as the ultrasonic probe, the bending of the vibrating plate 15 and the deformation of the contact point in the microgap cause the vibrating plate 15 to be vibrated and the acoustic wave (ultrasonic wave) to be transmitted/received. When the vibrating plate 15 of the film-shaped electro-mechanical converter is vibrated by the acoustic wave (ultrasonic wave), with the principle similar to the electret condenser microphone, the change in the capacitance of the gap results in the change in the potential difference across the electrodes, and the output $\Delta V_{out}$ is given by Eqs. (1), (2) described in the first embodiment. At this time, with $q_d$ as the unit charge, the vibrating plate 15 is pulled by the electro-statistic force $\sigma_e$ given by Eq. (3) described in the first embodiment, from the polymer film. Attention should be paid to the fact that, via the protrusions (including the particles) in the microgap, which serve as the fulcrums, the vibrating plate 15 is pulled to the gap side, by the electrostatic force $\sigma_e$ of the polymer film, and statically bent. That is, the rigidity of the vibrating plate 15, the contact point density and the arrangement in the microgap shall be designed in such a way that Ra of the surface at the gap side of the vibrating electrode 15b is 1/10 or less of the gap width in the element-install cavity at statically deformed state. Also, when the bending causes the plurality of gap-insulating layers 14a, 14b, 14c, . . . implementing the microgaps to be brought into contact at a position different from the protrusions, the number of the contact points will increase, which severely reduces the contact rigidity. Thus, the contact at the position different from the protrusions must be avoided by increasing the rigidity of the vibrating plate 15, by increasing the height of the protrusions, or by increasing density of the protrusions.

—Vibration Caused by Bending of Vibration Plate—

The vibration caused by the bending of the vibrating plate is similarly generated even in the earlier electret microphone. Also, even if the bending is caused by the assumable maximum sound pressure, the two layers implementing the microgap must not be brought into contact at the position except the protrusions.

Vibration Caused by Deformation of Micro Gap—

The structure illustrated in FIG. 20 is illustrated as an example, and the microgap can be achieved without using the particles as the spacers 41a, 41b, 41c, 41d, . . . . By replacing the electret-insulating layer 14e in the explanation of the first embodiment with the gap-insulating layer 14c of the third level layer in the fifth embodiment, in a model that the microgap is formed through the dry contact, the micro protrusions of the constant radius r illustrated in FIG. 2 can be considered as the central line average roughness Ra of the convex portion formed at the surface of any films between the vibrating-electrode-insulating film 15a and the gap-insulating layer 14c of the third level layer (the electret-insulating layer 14e in the explanation in the first embodiment). Or alternatively, it can be considered that the particles, which are inserted between the vibrating-electrode-insulating film 15a and the gap-insulating layer 14c of the third level layer, implement the convex portions. Thus, the configuration illustrated in FIG. 2 is a schematic view serving as the base of the definition of "effective surface roughness $Ra_{eff}$ of the surface establishing microgap", which is formed between the vibrating-electrode-insulating film 15a and the gap-insulating layer 14c of the third level layer. The micro protrusions of the constant radius r as illustrated in FIG. 2, may be formed by generating local thermal deformations when the pulse laser is irradiated to the top surface of the gap-insulating layer 14c of the third level layer, by heating the entire film implementing the gap-insulating layer 14c of the third level layer so as to carry out the precipitation of oligomers or the self-organization of polymers, or alternatively, by processing the gap-insulating layer 14c of the third level layer through the press working.

As described in the first embodiment, silicon particles may be aggregated in the in-plane direction, as illustrated in FIG. 3, and the average interval between the aggregated groups is 100 micrometers. Also, the tolerance of the thickness of each resin layer as the vibrating-electrode-insulating film 15a and the gap-insulating layer 14c of the third level layer (the electret-insulating layer 14e in the explanation of the first embodiment) is ±10%, in many cases. For this reason, similar to the configuration illustrated in FIG. 3, between the vibrating-electrode-insulating film 15a and the gap-insulating layer 14c of the third level layer, microgaps can be formed by contacts at localized portions in the distribution of the aggregations of silicon particles. Via contacts through the aggregations of silicon particles, an electric field of about 70 MV/m can be applied from the polymer film in the inside of the microgap.

As described in the first embodiment, in the model in which the top surface of the gap-insulating layer 14c of the third level layer has the micro protrusions of the constant radius r as illustrated in FIG. 2, the contact pressure $\sigma$ is represented by Eqs. (4), (5). Then, the contact rigidity (boundary rigidity) $K_g$ that is the spring constant per unit area in the microgap between the vibrating-electrode-insulating film 15a and the gap-insulating layer 14c of the third level layer is given by Eq. (6) described in the first embodiment. Thus, if $K_g \ll S'$, the amplitude $\Delta W_g$ of the vibrating-electrode-insulating film 15a is given by Eq. (7). Thus, similarly to the first embodiment, from Eqs. (1), (3), (5), (6) and (7), the output $\Delta V_{out}$ is represented by Eq. (8). From Eq. (8), in order to improve the reception sensitivity, the electric field strength $E_g$ in the gap shall be increased, and the storage elastic moduli of one or both of the two layers with the microgap between shall be made low, and the radius r of the protrusion shall be made smoll, and the density n of the protrusions shall be made low (the interval may be made wide). However, the decrease in the radius r and the density n of the protrusions results in the increase of the bending of the vibrating-electrode-insulating film 15a. Thus, as mentioned above, attention should be paid to the requirements that the effective surface roughness $Ra_{eff}$ of a plane defining the microgap is limited to be 1/10 or less of the gap width of the element-install cavity and also that the contact density of the microgap portion shall not be increased by the bending.

—Influence on Output of Film-Shaped Electro-Mechanical Converter—

As for the film-shaped electro-mechanical converter, when a voltage pulse of the amplitude $\Delta V_{in}$ is supplied to an input of the film-shaped electro-mechanical converter for transmitter, the pressure $\Delta \sigma_{out}$ generated at the vibrating-electrode-insulating film 15a in the film-shaped electro-mechanical converter is given by Eq. (9) described in the first embodiment. Together with the bending of the vibrating-electrode-insulating film 15a and the deformations at the contact points in the microgap, the vibrating-electrode-insulating film 15a is driven on the basis of the $\Delta \sigma_{out}$ of Eq. (9), and the vibration of the vibrating-electrode-insulating film 15a is generated, and the acoustic wave is transmitted from the film-shaped electro-mechanical converter. Thus, from Eq. (9), it can be understood that, when the gap width $W_g$ of the element-install cavity becomes narrower and the electric field strength $E_g$ of the gap becomes higher, the sound pressure of the film-shaped electro-mechanical converter becomes large, and the output of the film-shaped electro-mechanical converter improves.

—Damping of Acoustic Wave—

As another merit of the microgap lies in the damping (attenuation) of the ultrasonic wave. At boundary portions that do not contact because of the spacers 41a, 41b, 41c, 41d, . . . in the microgap portions, reflections of the acoustic wave are generated. Thus, the acoustic wave that is propagated to the polymer film is largely attenuated. When the acoustic wave is propagated to reach the polymer film, the polymer film is distorted to generate piezoelectric effect, and the output resulting from the piezoelectric effect overlaps with the subject reception output. Because the overlap of the piezoelectric effect deteriorates the performance of the electret probe (film-shaped electro-mechanical converter), in the gap portion, the acoustic wave is desired to be attenuated to the utmost extent. Providing with a plurality of microgaps, the attenuation of the acoustic wave in the gap portion is dramatically increased.

Figure 22:
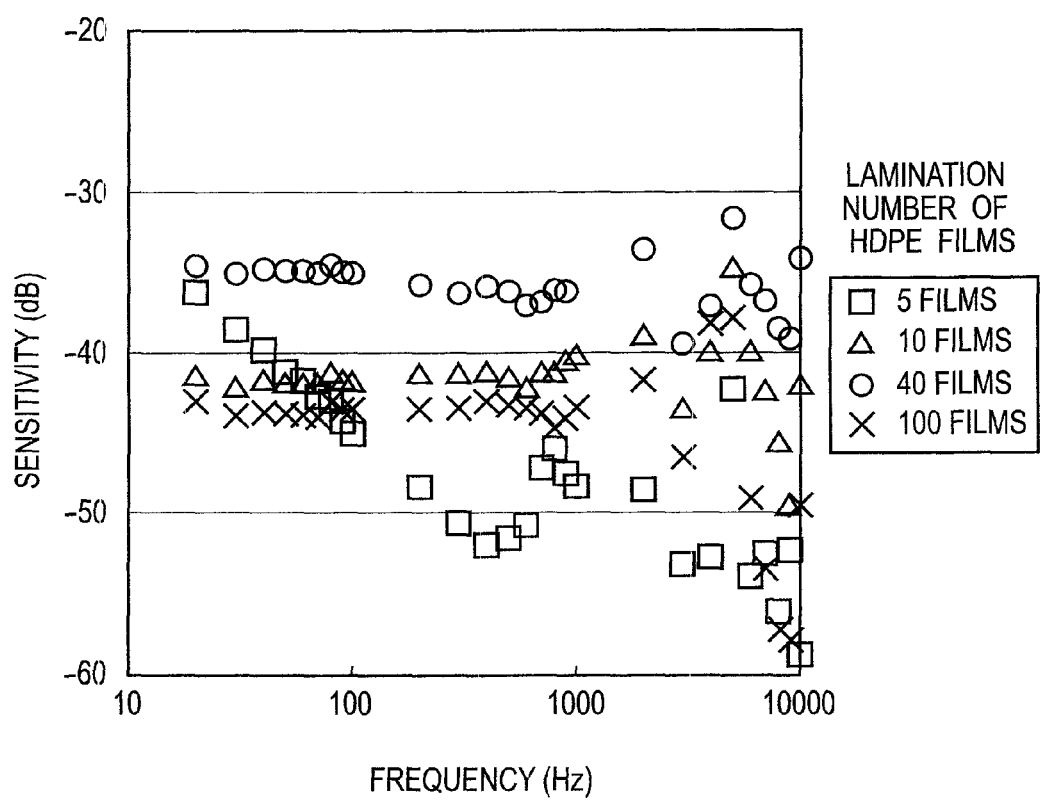
FIG. 22 is a view that illustrates a relation between sensitivity and frequency in the film-shaped electro-mechanical converter according to the fifth embodiment, in which the lamination numbers n of high density polyethylene (HDPE) films (n=5, 10, 40 and 100) are used as parameters

FIG. 22 is a view representing a relation between the sensitivity (dB) and the frequency (Hz) of the film-shaped electro-mechanical converter according to the fifth embodiment, while the lamination number n (n=5, 10, 40 and 100) of high density polyethylene (HDPE) films is recited as a parameter. In the targeted film-shaped electro-mechanical converter for the measurement in FIG. 22, the tetra-fluoride ethylene-hexafluoride propylene copolymerization (FEP) film with a thickness of 12 micrometers is changed into an electret by corona discharge so as to implement the polymer film serving as the electret, and on the polymer film, the n HDPE films each having a thickness of ten micrometers are laminated as the gap-insulating layers 14a, 14b, 14c, . . . , and the gap is formed, and then, Al foils are used as the vibrating electrode 15b and the back electrode 17, and the pressure receiving plane is formed as a circular shape having a diameter of 30 millimeters.

As can be understood from FIG. 22, when the n (n=40) HDPE films are laminated as the gap-insulating layers 14a, 14b, 14c, . . . , the sensitivity is about −32 dB. Because the sensitivity of general electret condenser microphones is between −60 and −45 dB, the film-shaped electro-mechanical converter according to the fifth embodiment has shown a very high sensitivity compared with the general electret condenser microphones.

<Manufacturing Method of Film-Shaped Electro-Mechanical Converter According to Fifth Embodiment>

The manufacturing method of the film-shaped electro-mechanical converter according to the fifth embodiment will be described below by using FIG. 23 to FIG. 28. By the way, the manufacturing method of the film-shaped electro-mechanical transducer which will be described below is recited as one of examples. Within the scope prescribed by Claims, including various modified examples, the film-shaped electro-mechanical converter can be naturally fabricated by using various manufacturing methods other than the following description.

Figure 23:
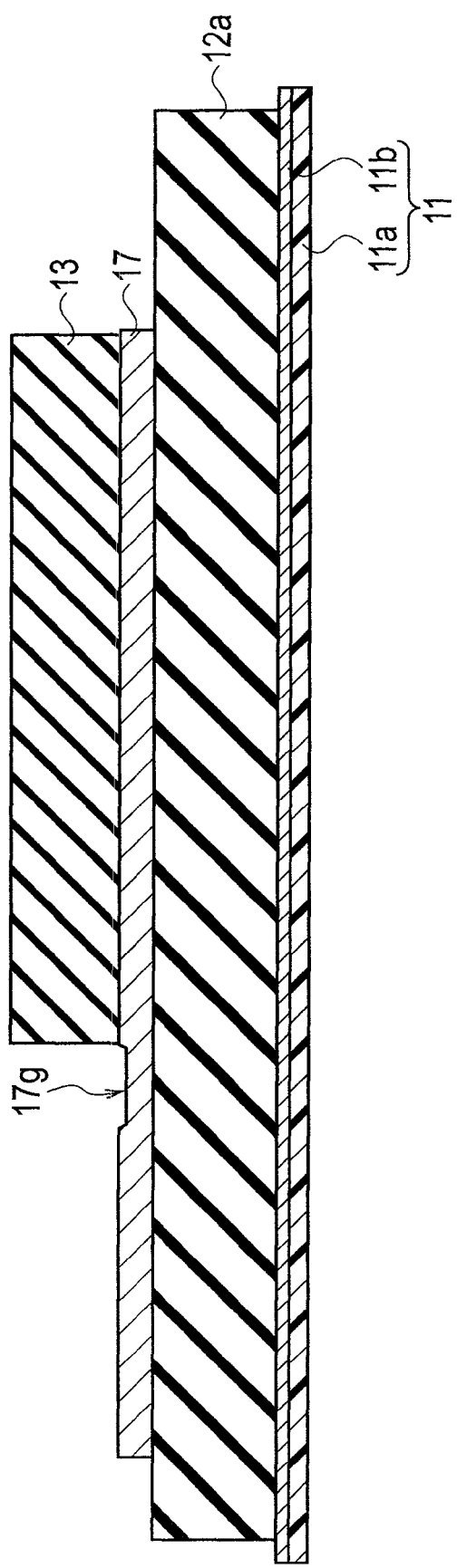
FIG. 23 is a schematic process-flow-sectional view illustrating a manufacturing method of the film-shaped electro-mechanical converter according to the fifth embodiment (No. 1)
Figure 24:
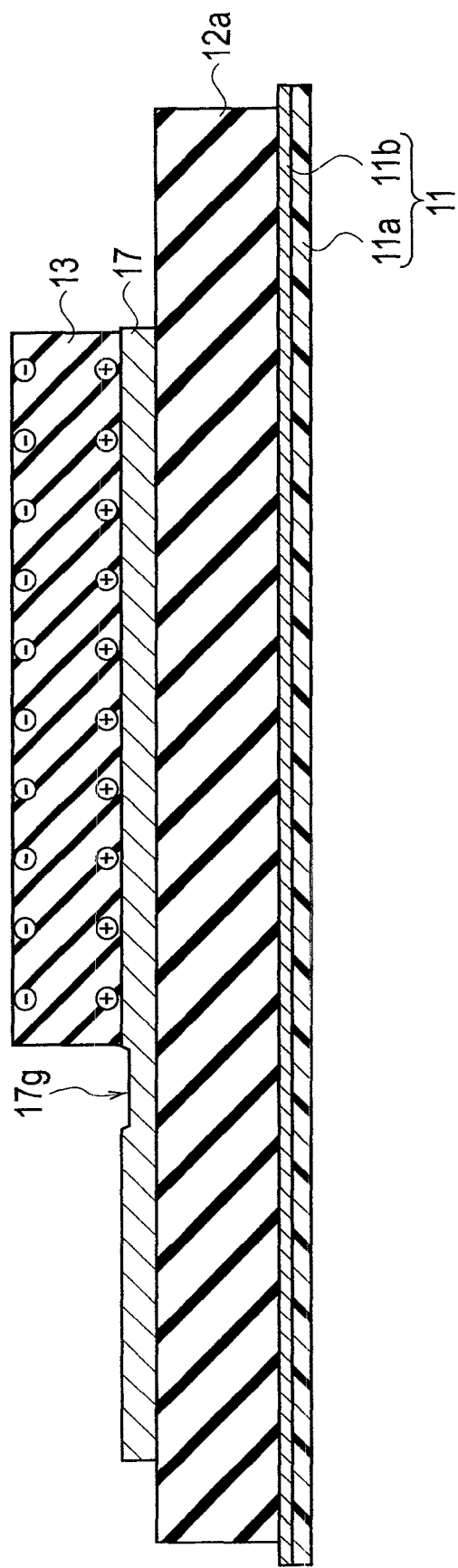
FIG. 24 is a schematic process-flow-sectional view illustrating the manufacturing method of the film-shaped electro-mechanical converter according to the fifth embodiment (No. 2)

(a) At first, an aluminum (Al) film serving as a shielding-conductor film 11b is deposited on a shielding-conductor-protection film 11a such as PVC film and the like, so as to implement a shield plate 11. The shield plate 11 is pasted on the rear surface of a spacer film 12a made of insulating material. Moreover, after second Al film is pasted on the top surface of the spacer film 12a, the second Al film is delineated to implement a back electrode 17. On a part of the back electrode 17, a shallow groove 17g is cut as illustrated in FIG. 23. Then, as illustrated in FIG. 23, a tetrafluoroethylene-perfluoroalkyl vinyl ether copolymer (PFA) film as a polymer film is pasted on a part of the top surface of the back electrode 17. The back electrode 17 and the polymer film may be metallurgically joined or may be adhered by adhesive agent and the like, or alternatively, may be merely brought into contact by the mechanical pressure. After the polymer film is formed on the back electrode 17, as illustrated in FIG. 24, the polymer film is electrified by corona discharge.

Figure 25:
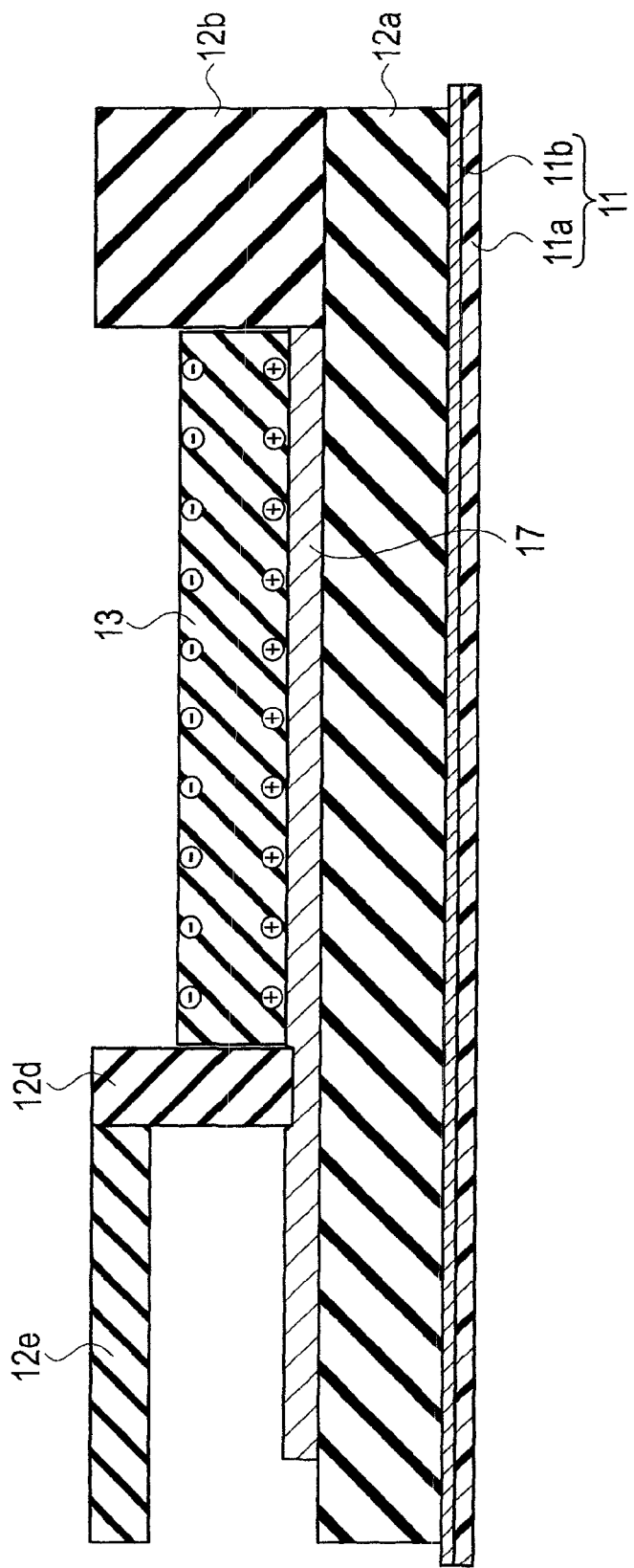
FIG. 25 is a schematic process-flow-sectional view illustrating the manufacturing method of the film-shaped electro-mechanical converter according to the fifth embodiment (No. 3)

(b) Then, as illustrated in FIG. 25, while the spacer film 12a made of insulating material can be used as a bottom plate, side-wall films 12b, 12d servicing as side-plate blocks of a box are arranged around the polymer film, and a box-shaped insulation container (12a, 12b, 12d and 12e) is assembled. At this time, the insulating layer 12d attached with a canopy top 12e is fitted into the shallow groove 17g formed in a part of the back electrode 17.

Figure 26:
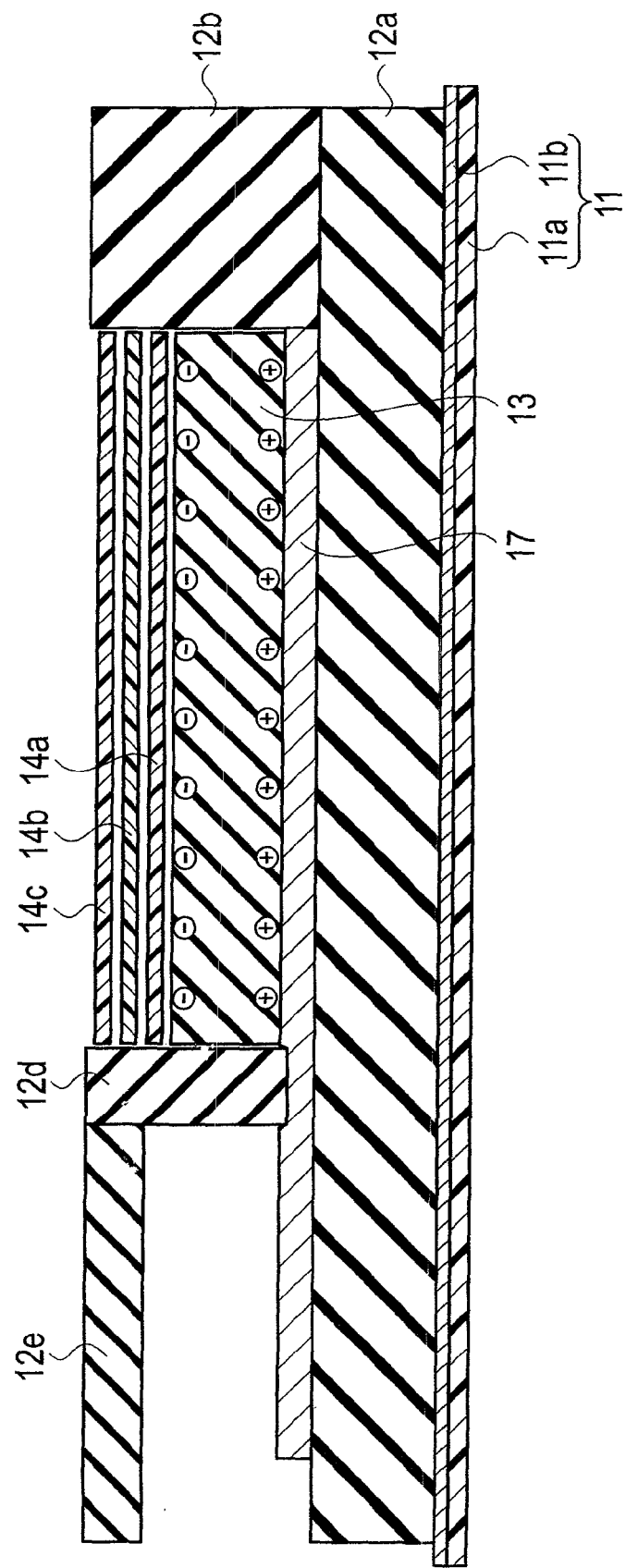
FIG. 26 is a schematic process-flow-sectional view illustrating a manufacturing method of the film-shaped electro-mechanical converter according to the fifth embodiment (No. 4)

(c) In the inside of the box-shaped insulation container (12a, 12b, 12d and 12e), a stacked structure in which the plurality of gap-insulating layers 14a, 14b, 14c, . . . are laminated through the spacers 41a, 41b, 41c, 41d, . . . implemented by the particles of insulators each having a particle diameter between ten nanometers and 40 micrometers are accommodated as illustrated in FIG. 26. When the diameter of the particles of insulators serving as each of the spacers 41a, 41b, 41c, 41d, . . . is elected to be between ten nanometers and ten micrometers, the entire thickness is made thinner, which is preferable. Moreover, in a range between ten nanometers and five micrometers, the particle diameter closer to ten nanometers is naturally desirable. The stacked structure implemented by the plurality of gap-insulating layers 14a, 14b, 14c, . . . can be manufactured by, for example, the repetition of the following procedures. That is, inside a separately-prepared lamination-process container, the silicon particles, which are scheduled to become spacers 41a, 41b, 41c, 41d, . . . , are colloidally diffused into solvent 55 by dispersant. Then, after a gap-insulating layer 14a of the first level layer is accommodated into the lamination-process container, the solvent 55 is dropped on the gap-insulating layer 14a of the first level layer, and dried so as to coat silicon particles serving as the spacers 41a, 41b on the gap-insulating layer 14a. Next, after a gap-insulating layer 14b of the second level layer is accommodated in the lamination-process container, the solvent 55 is dropped on the gap-insulating layer 14b of the second level layer, and dried so as to coat the silicon particles serving as the spacers 41c on the gap-insulating layer 14b. Moreover, after a gap-insulating layer 14c of the third level layer is accommodated in the lamination-process container, the solvent 55 is dropped on the gap-insulating layer 14c of the third level layer, and dried so as to coat the silicon particles as the spacers 41d on the gap-insulating layer 14c. By the way, another methods such that preliminarily performing surface processes on each of the plurality of gap-insulating layers 14a, 14b, 14c, . . . so as to implement micro protrusions (spacers 41a, 41b, 41c, 41d, . . . ) can be available.

Moreover, when the surface of the gap-insulating layer 14a facing to the electret is electrified by corona discharge (the polarity of the charges generated on the surface of the gap-insulating layer 14a is set to the same polarity as the electret), it is possible to protect discharge after when the electret is stacked, and also to reduce the attenuation of the charges on the electret.

Figure 27:
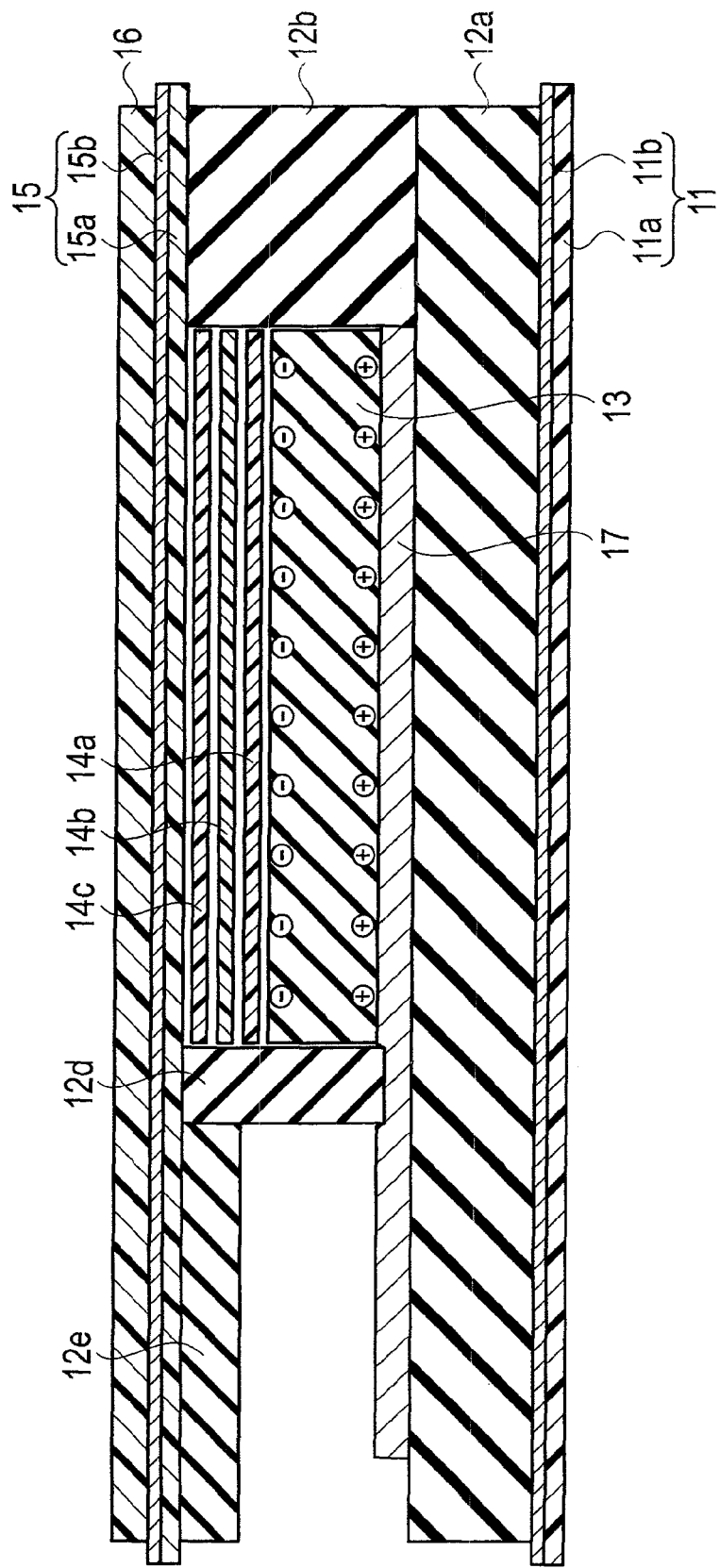
FIG. 27 is a schematic process-flow-sectional view illustrating the manufacturing method of the film-shaped electro-mechanical converter according to the fifth embodiment (No. 5)

(d) On the other hand, on a PFA film as the vibrating-electrode-insulating film 15a, an Al film as a vibrating electrode 15b is deposited so as to form a vibrating plate 15. Moreover, on the vibrating electrode 15b, a vibrating-plateprotection film 16 made of PVC film is pasted so as to implement a stacked structure with the vibrating plate 15, and the stacked structure is provided on the insulation container (12a, 12b, 12d and 12e) as a top cover, as shown FIG. 27. By the way, the solvent in which the silicon particles are colloidally diffused may be dropped on the PFA film on which the Al film is deposited as the vibrating plate 15, and dried so that the silicon particles as the spacers 41d are coated on the vibrating-electrode-insulating film 15a, and after that, as illustrated in FIG. 27, the stacked structure may be put as the top cover of the insulation container (12a, 12b, 12d and 12e). Moreover, it is allowable to use a method that preliminarily performs surface process on the PFA film as the vibrating-electrode-insulating film 15a so as to form the micro protrusions.

Figure 28:
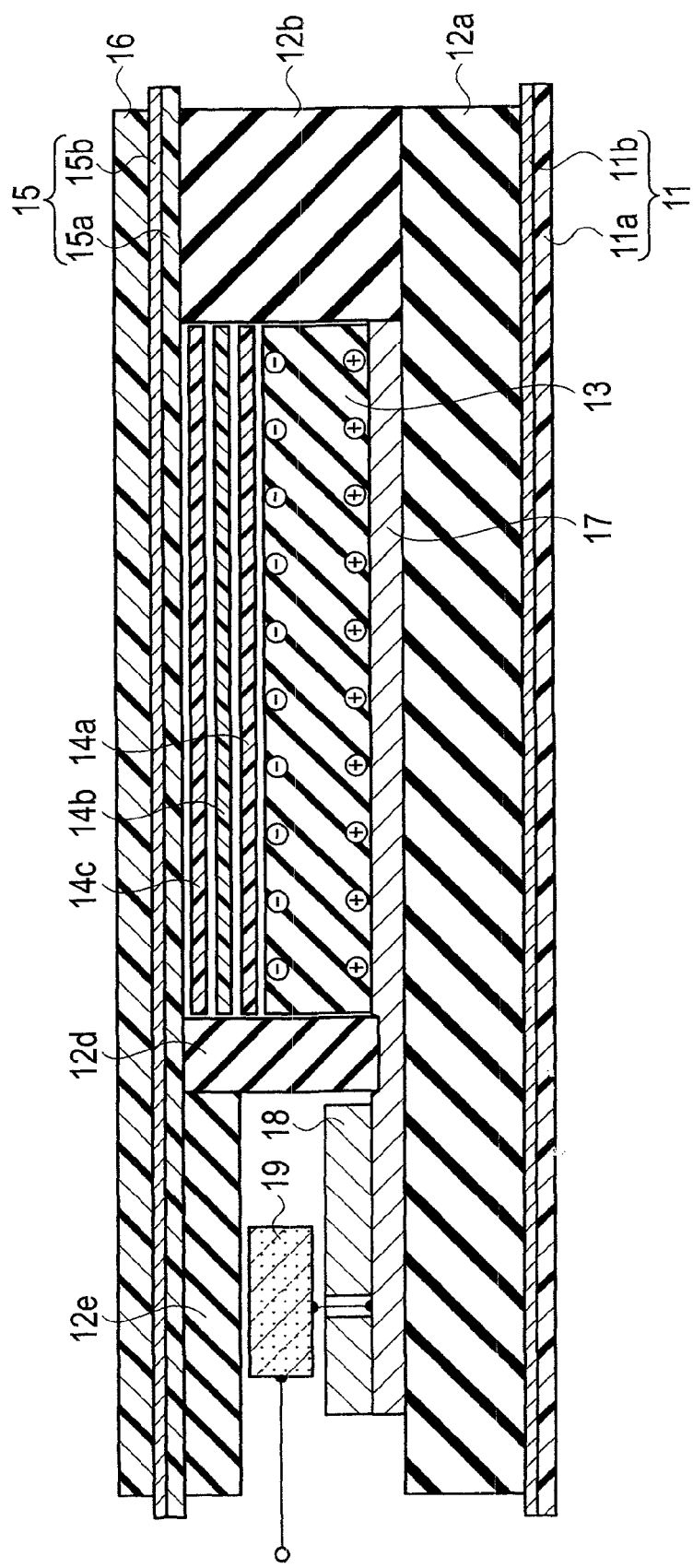
FIG. 28 is a schematic process-flow-sectional view illustrating the manufacturing method of the film-shaped electro-mechanical converter according to the fifth embodiment (No. 6)

(e) Moreover, separately, such as a ball grid array and the like, on a circuit board 18 that has a connector at the bottom of the board, an amplifying circuit 19 in which an amplifier (FET) is integrated is installed (mounted), thereby preparing a mounted structure (package) of the amplifier. Each of the electrodes of the amplifier integrated in the amplifying circuit 19 are electrically connected to connection electrodes, such as solder balls and the like, which are provided on the rear surface of the circuit board 18, through inner wirings and through holes (vias) provided in the circuit board 18 and surface wirings disposed on the surface of the circuit board 18. The mounted structure (package) of the amplifier is accommodated under the canopy top 12e of the box-shaped insulation container (12a, 12b, 12d and 12e), as illustrated in FIG. 28. After when the mounted structure (package) is accommodated under the canopy top 12e of the box-shaped insulation container (12a, 12b, 12d and 12e), a sealing insulating block 12c is inserted under the canopy top 12e as illustrated in FIG. 20 so that the sealing cover is plugged into the portion of the box-shaped insulation container (12a, 12b, 12d and 12e) for storing the mounted structure (package), the film-shaped electro-mechanical converter according to the fifth embodiment is completed.

Figure 29:
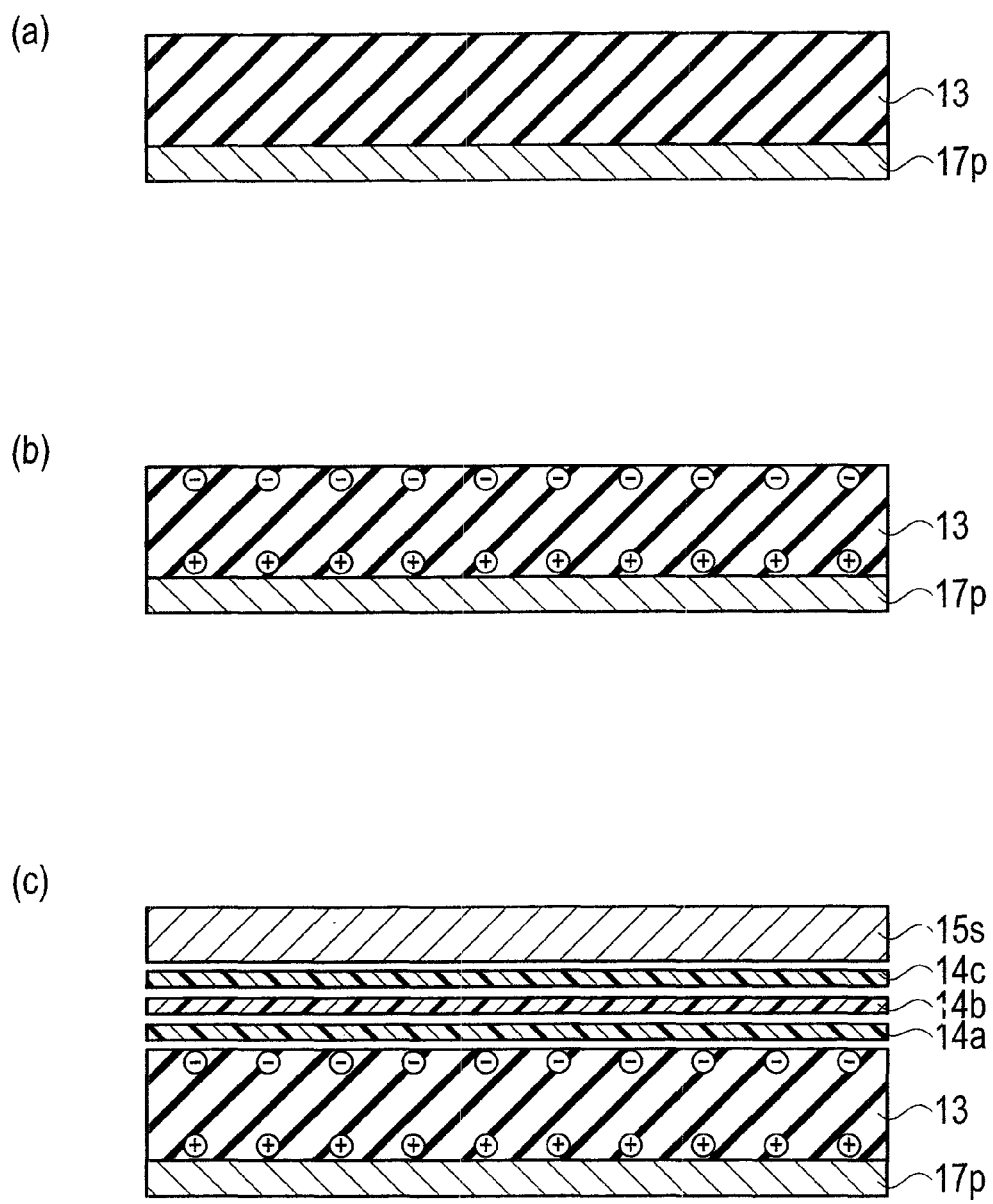
FIG. 29 is a conceptual process-flow-sectional view, corresponding to an outline (main portion) of the manufacturing method of the film-shaped electro-mechanical converter, which has been illustrated in FIGS. 23 to 28.

FIG. 29 illustrates roughly an outline of the main processes of the manufacturing method of the film-shaped electro-mechanical converter according to the fifth embodiment, which are explained with referring to FIG. 23 to FIG. 28. That is, (a) at first, as illustrated in FIG. 29(a), on the top surface of a back electrode 17p, a PFA film is pasted as the polymer film. (b) Then, after the polymer film is pasted on the back electrode 17p, as illustrated in FIG. 29(b), the polymer film is electrified by corona discharge and the like. (c) Meanwhile, a vibrating plate 15s is prepared, by depositing an Al film as the vibrating electrode on the rear surface of a PFA film as the vibrating-electrode-insulating film. And on the PFA film, a plurality of gap-insulating layers 14a, 14b, 14c, . . . are laminated through spacers (illustration is omitted) on the vibrating plate 15s. (d) Then, the polymer film having the back electrode 17p, and a structure in which the plurality of gap-insulating layers 14a, 14b, 14c, . . . are laminated through the spacers (illustration is omitted) on the vibrating plate 15s are assembled into a predetermined box, such as the insulation container (12a, 12b, 12d and 12e) illustrated in FIG. 20, so as to implement the lamination relationship as illustrated in FIG. 29(c). Through the above simple steps, the film-shaped electro-mechanical converter according to the fifth embodiment is completed.

By the way, ferroelectric material can be used as the polymer film, for example, when PZT, in which the polarization directions are aligned although the ferroelectric material is not electrified is assembled as the polymer film into the box-shaped insulation container (12a, 12b, 12d and 12e), in accordance with the above procedure. After the assembling is finished, the ferroelectric material is heated to the temperature close to Curie point and held for several seconds to several minutes. Then, when the ferroelectric material is cooled to the room temperature, the surface charges of the ferroelectric material are removed so as to form the polymer film. When Curie point temperature is higher than the soldering reflow temperature and then the reflow process of the packaged structure (product) including the film-shaped electro-mechanical converter is carried out, the ferroelectric material is changed into the polymer film by the reflow process.

According to the film-shaped electro-mechanical converter pertaining to the fifth embodiment, since its aerial transmission/reception sensitivity is higher than that of the earlier film-shaped electro-mechanical converter, the precisions of the distance measurement and the like can be expected to be improved. Moreover, if a frequency modulation is used, the transmission/reception with higher precision can be further achieved. Specifically, by changing the frequency of the film-shaped electro-mechanical converter, a particular signal pattern is generated in the film-shaped electro-mechanical converter. Then, the electro-mechanically converted signal pattern may be selectively extracted at receiver site, and if the signal pattern is predetermined to be the pattern that is not generated under the noise, the received waveform buried in the noise can be identified even in the environment in which the noise is high. The above scheme which employs such particular signal pattern can be estimated as an approach peculiar to the film-shaped electro-mechanical converter of the present invention, in which the transmission/reception is possible in the wide frequency band.

As mentioned above, in the film-shaped electro-mechanical converter pertaining to the fifth embodiment, when the polymer film is used as the electret layer 13, the film-shaped electro-mechanical converter is flexible and has no constraint on the shape of the pressure receiving plane. Thus, it is possible to deform the shape of the pressure receiving plane corresponding to the shape of an object allocated at any desired measurement location. Also, except the amplifying circuit 19 (if the thickness of the amplifying circuit 19 is set to 60 micrometers or less, the amplifying circuit 19 can be deformed although its deformation level is small), because all of the constituent members are made of thin films, the film-shaped electro-mechanical converter can be flexibly deformed. Ferroelectric material can be used as the electret layer 13 and when the ferroelectric material is processed to a film having the thickness of 60 micrometers or less, the flexibility is obtained. However, as compared with the polymer film, the deformation level of the ferroelectric material is small, and the flexibility cannot be expected at a thickness of 60 micrometers or more. Moreover, the microgaps are supported by the spacers 41a, 41b, 41c, 41d, . . . implemented by the many particles (or micro protrusions) made of insulators each having the particle diameter between ten nanometers and 40 micrometers, as illustrated in FIG. 21. Thus, the shape of the pressure receiving plane can be arbitrarily designed. For example, when the film-shaped electro-mechanical converter is used in a mobile telephone, the film-shaped electro-mechanical converter pertaining to the fifth embodiment can be attached between buttons and the like. However, when the film-shaped electro-mechanical converter pertaining to the fifth embodiment is deformed, there is a fear that the respective layers of the polymer film, the gaps and the vibrating electrode 15b are slightly displaced. The entire amount of displacement depends on the deformation level, the thickness and area of the film-shaped electro-mechanical converter, and the amount of displacement for each of the gap-insulating layers 14a, 14b, 14c, . . . implementing the respective layers depends on even the film thickness Then, when each thickness of the gap-insulating layers 14a, 14b, 14c, ... is assumed to be t, because the maximum amount of displacement for each of the gap-insulating layers 14a, 14b, 14c, ... caused by the deformation is 2πt, the maximum amount of displacement must be smaller than the interval between the micro protrusions implementing the microgap. The interval between the micro protrusions is determined on the basis of the maximum allowable sound pressure (pressure resistance) of the film-shaped electro-mechanical converter, and a pressure resistance of at least one atmospheric pressure or more is required, because the external force is directly applied to the pressure receiving plane, as illustrated in FIG. 20. By considering the above situations, the interval between the micro protrusions shall be 500 micrometers or less, and each thickness of the gap-insulating layers 14a, 14b, 14c, ... implementing the film-shaped electro-mechanical converter shall be 80 micrometers or less.

Also, when the area of the pressure receiving plane of the film-shaped electro-mechanical converter pertaining to the fifth embodiment is excessively small, the capacitance is insufficient, which results in the reduction in sensitivity. The necessary area depends on the gap thickness, the thickness of the polymer film and the dielectric constant. However, at least 1 mm$^2$ or more is required and 10 mm$^2$ or more is desirable. Also, when the area of the pressure receiving plane is excessively large, the gap-insulating layers 14a, 14b, 14c, ... may be fluctuated by sound, and the variation in the output is consequently increased. Moreover, as the displacements of the laminated gap-insulating layers 14a, 14b, 14c, ... increase, air gap width between the gap-insulating layers 14a, 14b, 14c, ... increases, which brings about the generation of the discharge, and the sensitivity is deteriorated. The upper limit of the area of the pressure receiving plane depends on the thicknesses of the gap-insulating layers 14a, 14b, 14c, ... implementing the film-shaped electro-mechanical converter and the frequency band of the sound to be measured. So, at least 100 cm$^2$ or less is required and 10 cm$^2$ or less is desirable.

Sixth Embodiment

Figure 30:
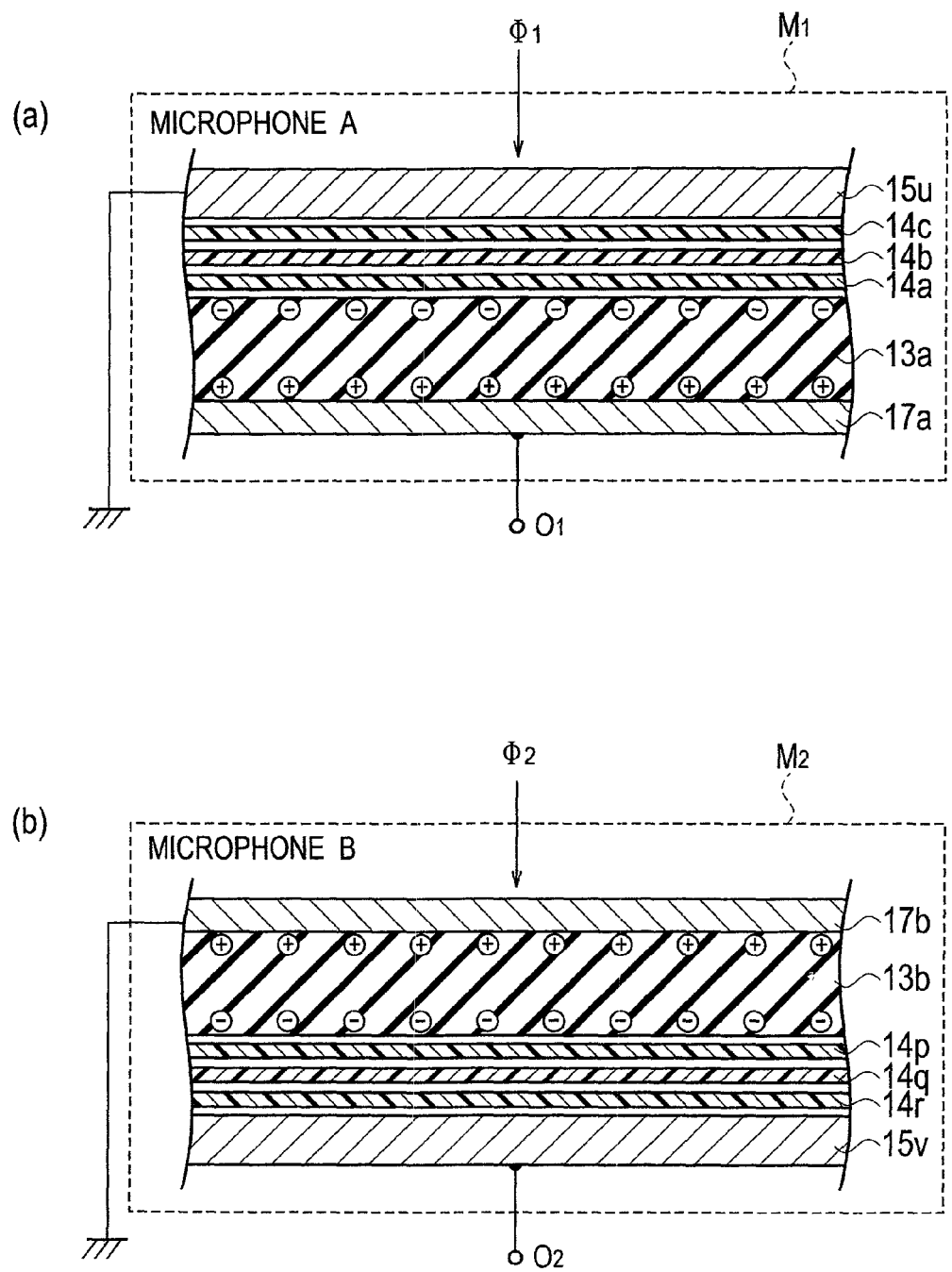
FIG. 30($a$) is a schematic sectional view illustrating a rough configuration of a film-shaped electro-mechanical converter (microphone A) when a sound pressure $\Phi_1$ is received from the vibration plate side, and FIG. 30($b$) is a schematic sectional view illustrating a rough configuration of a film-shaped electro-mechanical converter (microphone B) when a sound pressure $\Phi_2$ is received from the electret layer side.

In the film-shaped electro-mechanical converter pertaining to the fifth embodiment of the present invention illustrated in FIG. 20, when a polymer film is used as the polymer film 13b, as shown as a microphone B in FIG. 30(b), even if a sound pressure $\Phi_2$ is received from the side of the polymer film 13b, the vibration is transmitted to gap-insulating layers 14p, 14q, 14r, ... without any substantial attenuation through the polymer film 13b. Thus, when the side of the back electrode 17b is used as the pressure receiving plane, the sensitivity is little different from a situation in which a sound pressure $\Phi_1$ is received from the side of the vibrating plate 15u, such as a microphone A illustrated in FIG. 30(a).

A film-shaped electro-mechanical converter according to a sixth embodiment of the present invention is a double-sided film-shaped electro-mechanical converter that can carry out receptions on both faces of the electro-mechanical converter, in which the microphone A illustrated in FIG. 30(a) and the microphone B illustrated in FIG. 30(b) are compatible. As illustrated in FIG. 30(a), the microphone A as a first pressure receiving device $M_1$ encompasses a vibrating plate 15u having a flat vibration surface under no load condition; a polymer film 13a, which is defined by a flat first principal surface facing to the vibration surface of the vibrating plate 15u through a gap space, the thickness of the gap space is measured in a stacked structure implemented by a gap-insulating layer 14a of the first level layer, a gap-insulating layer 14b of the second level layer and a gap-insulating layer 14c of the third level layer, and a second principal surface facing in parallel to the first principal surface, the polarization directions are aligned in the polymer film 13a; a back electrode 17a in contact with the second principal surface of the polymer film 13a; and an amplifying means (illustration is omitted) connected between the vibrating plate 15u and the back electrode 17a. Similarly to the configuration illustrated in FIG. 21 in the explanation of the film-shaped electro-mechanical converter pertaining to the fifth embodiment, first spacers implemented by particles of insulator having a particle diameter between ten nanometers and 40 micrometers are inserted between the gap-insulating layer 14a of the first level layer and the polymer film 13a, and second spacers implemented by particles of insulators having a particle diameter between ten nanometers and 40 micrometers are inserted between the gap-insulating layer 14a of the first level layer and the ID gap-insulating layer 14b of the second level layer, and third spacers implemented by particles of insulators having a particle diameter between ten nanometers and 40 micrometers are inserted between the gap-insulating layer 14' b of the second level layer and the gap-insulating layer 14c of the third level layer, and fourth spacers implemented by particles of insulators having a particle diameter between ten nanometers and 40 micrometers are inserted between the vibrating electrode 15b and the gap-insulating layer 14c of the third level layer so as to control the interval of the gap defined between the vibrating electrode 15b and the polymer film 13a. In this way, between the vibrating plate 15u and the polymer film 13a, the plurality of gap-insulating layers 14a, 14b, 14c, ... are laminated and inserted through the spacers implemented by particles of insulators each having the particle diameter between ten nanometers and 40 micrometers. Consequently, microgaps are defined between the vibrating plate 15u and the gap-insulating layer 14c of the third level layer, between the gap-insulating layer 14c of the third level layer and the gap-insulating layer 14b of the second level layer, between the gap-insulating layer 14b of the second level layer and the gap-insulating layer 14a of the first level layer, and between the gap-insulating layer 14a of the first level layer and the polymer film 13a, respectively. Consequently, the gap width $W_g$ of the macroscopic element-install cavity between the vibrating plate 15u and the polymer film 13a is controlled. When each diameter of the particles serving as the first to fourth spacers are assumed to be 100 micrometers or less, the effective surface roughness $Ra_{eff}$ of the surfaces establishing each of the microgaps can be set to $\frac{1}{10}$ or less of each gap width of the element-install cavity which is defined to accommodate the microgaps between the bottom surfaces of the vibrating plates 15u, 15v and the top surfaces of the polymer films 13a, 13b (the effective surface roughness $Ra_{eff}$ includes the bending under no load condition). However, in order to achieve the film-shaped electro-mechanical converter that is flexible and has a high degree of freedom in geometrical deformations, the particle diameter of the particle of each of the first to fourth spacers is elected to be ten nanometers to ten micrometers, which is preferable because the entire thickness becomes further thin. Moreover, in a range between ten nanometers and five micrometers, the particle diameter closer to ten nanometers is naturally desirable. In the first pressure receiving device $M_1$ (microphone A), the side of the back electrode 17a is used as the output terminal.

Meanwhile, as illustrated in FIG. 30(b), the microphone B as a second pressure receiving device $M_2$ encompasses a vibrating electrode 15v having a flat vibration surface under no load condition; a polymer film 13b which is defined by a flat first principal surface facing to the vibration surface of the vibrating plate 15v through a gap space, the thickness of the gap space is measured in a stacked structure implemented by a gap-insulating layer 14p of the first level layer, a gap-insulating layer 14q of the second level layer and a gap-insulating layer 14r of the third level layer, and a second principal surface facing in parallel to the first principal surface, the polarization directions are aligned in the polymer film 13b; a back electrode 17b in contact with the second principal surface of the polymer film 13b; and amplifying means (illustration is omitted) connected between the vibrating plate 15v and the back electrode 17b. Similarly to the microphone A, between the vibrating plate 15v and the polymer film 13b, the plurality of gap-insulating layers 14p, 14q, 14r, . . . are laminated and inserted through the spacers implemented by particles of insulators each having a particle diameter between ten nanometers and 40 micrometers. Consequently, the microgaps are defined between the vibrating plate 15v and the gap-insulating layer 14r of the third level layer, between the gap-insulating layer 14r of the third level layer and the gap-insulating layer 14q of the second level layer, between the gap-insulating layer 14q of the second level layer and the gap-insulating layer 14p of the first level layer, and between the gap-insulating layer 14p of the first level layer and the polymer film 13b, respectively. Consequently, the gap width $W_g$ of the macroscopic element-install cavity between the vibrating plate 15v and the polymer film 13b is controlled. In the second pressure receiving device $M_2$ (microphone B), the side for receiving a voice is located facing to the first pressure receiving device $M_1$ (microphone A). Thus, the side of the vibrating plate 15v serves as the output terminal.

The microphone A (the first pressure receiving device $M_1$) illustrated in FIG. 30(a) and the microphone B (the second pressure receiving device $M_2$) illustrated in FIG. 30(b) are both made of thin film. Thus, the deformation is flexibly possible.

Figure 31:
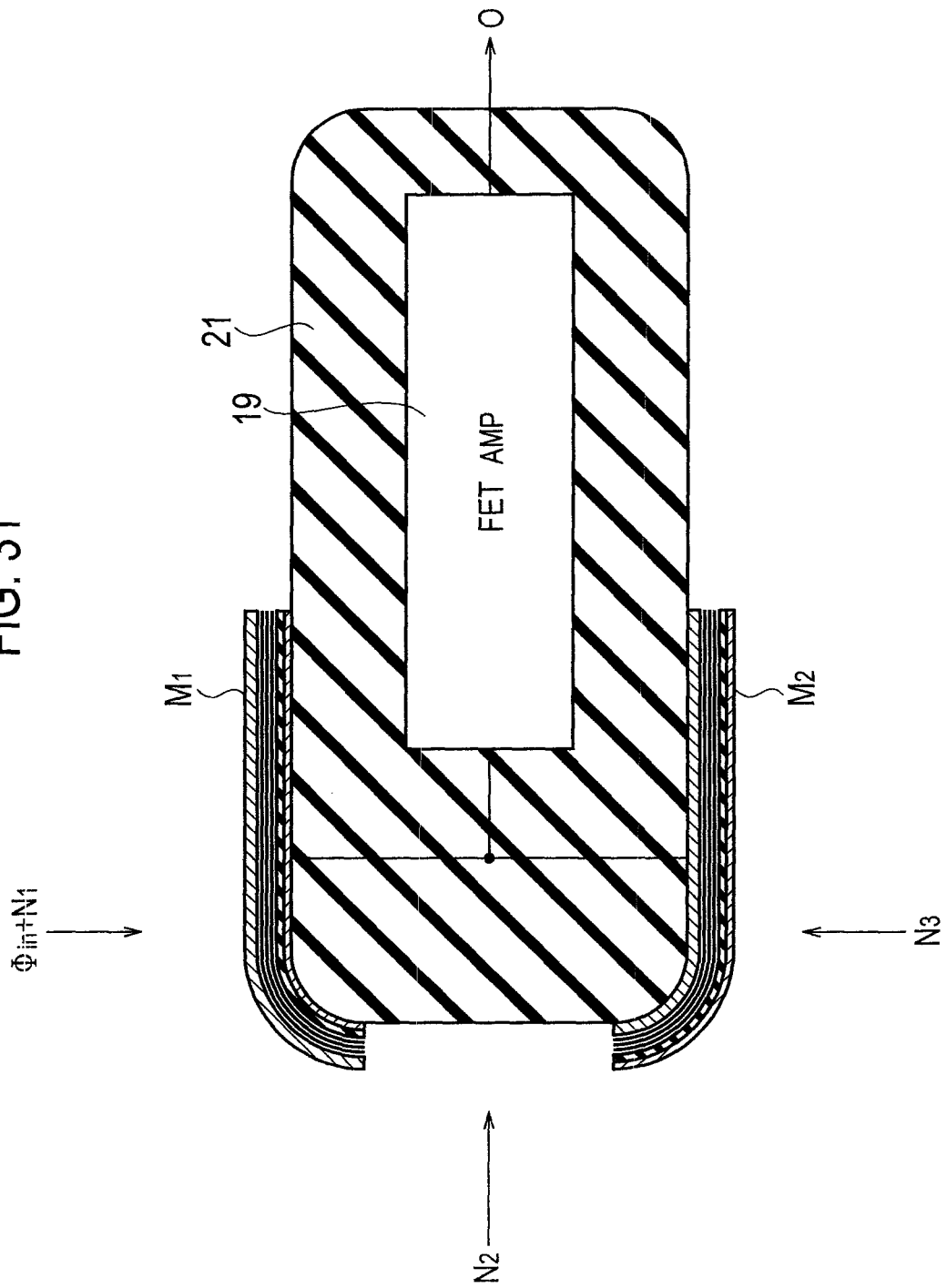
FIG. 31 is a schematic sectional view illustrating a rough configuration of the film-shaped electro-mechanical converters according to the second embodiment of the present invention, in which the microphone A illustrated in FIG. 30($a$) and the microphone B illustrated in FIG. 30($b$) are used.

FIG. 31 shows a noise-cancelling phone as a specific example of the film-shaped electro-mechanical converter according to the six embodiment. As illustrated in FIG. 31, the film-shaped electro-mechanical converter according to the sixth embodiment encompasses a board (microphone substrate) 21 in which a semiconductor chip (FET amplifier) 19 is built; a first pressure receiving device $M_1$ (microphone A) that is bent correspondingly to a curvature of a corner and bonded to an upper left corner of the board (microphone substrate) 21; and a second pressure receiving device $M_2$ (microphone B) that is bent correspondingly to a curvature of a corner and bonded to the lower left corner of the board (microphone substrate) 21. Both of the first pressure receiving device $M_1$ and the second pressure receiving device $M_2$ are flexible and have no constraint on the shape of the pressure receiving plane. Thus, the first pressure receiving device $M_1$ and the second pressure receiving device $M_2$ can have any shape corresponding to a target allocated at the arrangement place and can be deformed. Thus, as illustrated in FIG. 31, the first pressure receiving device $M_1$ (microphone A) can be curved and bonded to the upper left corner of the board (microphone substrate) 21 so that the back electrode 17a is brought into contact with the board (microphone substrate) 21, and the second pressure receiving device $M_2$ (microphone B) can be curved and bonded to the bottom left corner of the board (microphone substrate) 21 so that the vibrating plate 15v is brought into contact with the board (microphone substrate) 21.

In this way, in the film-shaped electro-mechanical converter (noise-cancelling phone) according to the sixth embodiment, the first pressure receiving device $M_1$ and the second pressure receiving device $M_2$, in which the sides for receiving the voice are located opposite to each other with regard to the front/rear relation, are bonded to the surface of the board (microphone substrate) 21, and the outputs from the first pressure receiving device $M_1$ and the second pressure receiving device $M_2$ can be received by the same semiconductor chip (FET amplifier) 19.

As illustrated in FIG. 31, the first pressure receiving device $M_1$ is bonded to the board (microphone substrate) 21 in such a way that the back electrode 17a is brought into contact with the board (microphone substrate) 21, and the second pressure receiving device $M_2$ is bonded to the board (microphone substrate) 21 in such a way that the vibrating plate 15v is brought into contact with the board (microphone substrate) 21. Thus, the polarities of the signals of the first pressure receiving device $M_1$ and the second pressure receiving device $M_2$ are inverted, thereby removing noises $N_1$, $N_2$ and $N_3$. Consequently, it is possible to simplify the circuit of the film-shaped electro-mechanical converter (noise-cancelling phone) according to the sixth embodiment.

In the film-shaped electro-mechanical converter according to the sixth embodiment, there is a fear that stray capacitances will increase on the transmission route from the first pressure receiving device $M_1$ and the second pressure receiving device $M_2$ to the semiconductor chip (FET amplifier) 19. However, as mentioned above, as for the first pressure receiving device $M_1$ and the second pressure receiving device $M_2$, because the respective shapes are free, the freedom in shape can be used to enlarge the areas of the pressure receiving planes, and, it is adequate to make the active capacitances of the first pressure receiving device $M_1$ and the second pressure receiving device $M_2$ sufficiently large.

Seventh Embodiment

In the film-shaped electro-mechanical converter according to the sixth embodiment, there is the fear that the stray capacitance will increase on the transmission route from the first pressure receiving device $M_1$ and the second pressure receiving device $M_2$ to the semiconductor chip (FET amplifier) 19. For this reason, the film-shaped electro-mechanical converter according to the sixth embodiment employs the method which uses the fact that the shapes of the first pressure receiving device $M_1$ and the second pressure receiving device $M_2$ are free, and enlarges the area of the pressure receiving plane and sufficiently increases the active capacitances of the first pressure receiving device $M_1$ and the second pressure receiving device $M_2$. In a film-shaped electro-mechanical converter according to a seventh embodiment of the present invention, another method is described which can increase the active capacitance, facilitating the compensation of the stray capacitance, in the double-sided film-shaped electro-mechanical converter that can carry out the reception on both sides of the film-shaped electro-mechanical converter.

Figure 32:
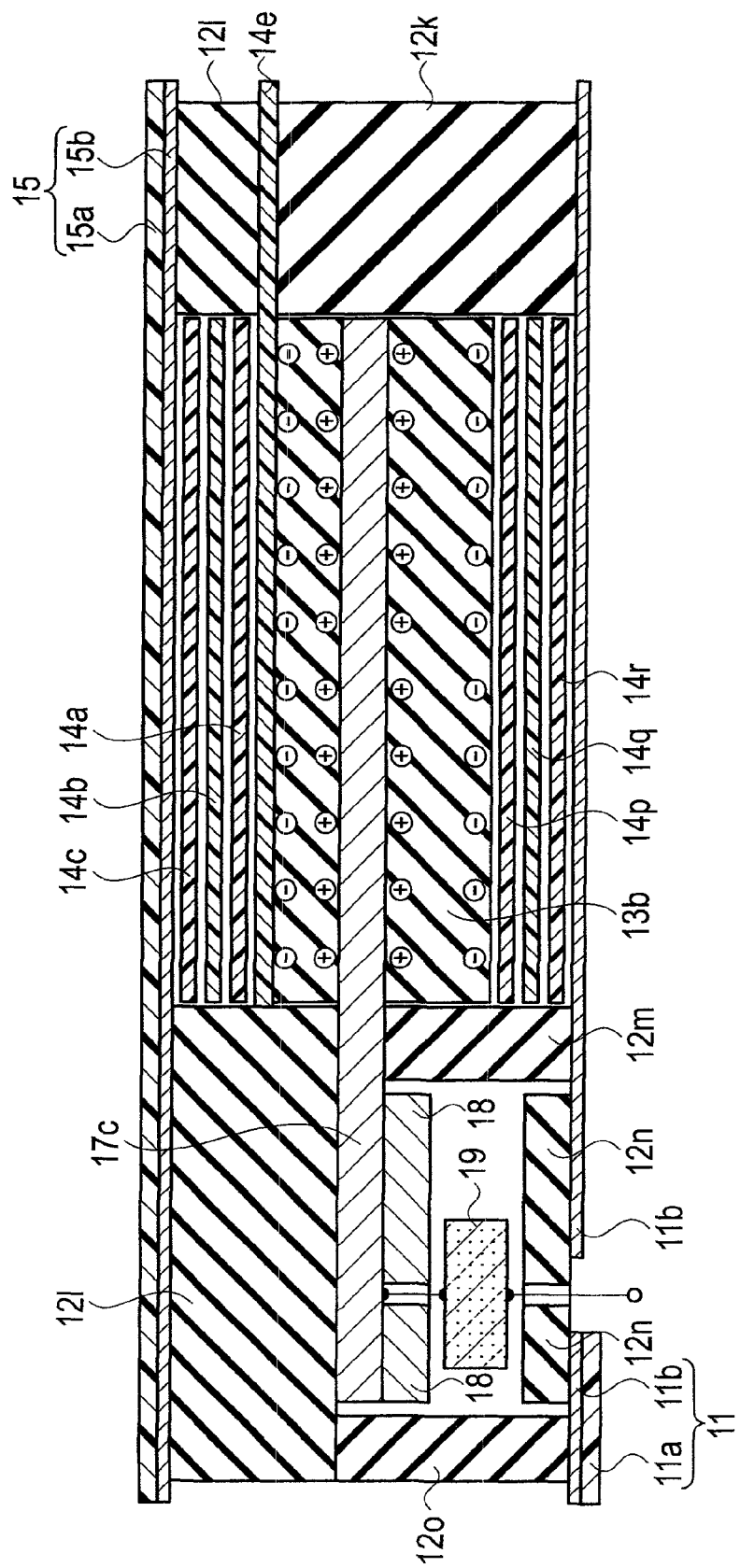
FIG. 32 is a schematic sectional view illustrating a rough configuration of a film-shaped electro-mechanical converter according to a seventh embodiment of the present invention.

That is, in the film-shaped electro-mechanical converter according to the seventh embodiment of the present invention, as illustrated in FIG. 32, an upper polymer film 13a and a lower polymer film 13b are bonded on and under a common electrode 17c for inputting/delivering signals, respectively, so that their respective polarities are opposite to each other.

The first pressure receiving device $M_1$ formed on the common electrode 17c encompasses an upper vibrating plate 15 having a flat vibration surface under no load condition; an electret-insulating layer 14e that faces the vibration surface of the upper vibrating plate 15 through a gap space, the thickness of the gap space is measured in a stacked structure implemented by an upper gap-insulating layer 14a of the first level layer, an upper gap-insulating layer 14b of the second level layer and an upper gap-insulating layer 14c of the third level layer; an upper polymer film 13a which is defined by a flat first principal surface facing to the electret-insulating layer 14e and a second principal surface facing in parallel to the first principal surface, the polarization directions are aligned in the electret-insulating layer 14e; and a common electrode 17c in contact with the second principal surface of the upper polymer film 13a. The upper vibrating plate 15 contains an upper vibrating electrode 15b made of conductor and a vibrating-electrode-insulating film 15a at the bottom surface of the upper vibrating electrode 15b, as illustrated in FIG. 32. Similarly to that illustrated in FIG. 21 in the explanation of the film-shaped electro-mechanical converter pertaining to the fifth embodiment, the first spacers implemented by particles of insulators having a particle diameter between ten nanometers and 40 micrometers are inserted between the upper gap-insulating layer 14a of the first level layer and the electret-insulating layer 14e, the second spacers implemented by particles of insulators having a particle diameter between ten nanometers and 40 micrometers are inserted between the upper gap-insulating layer 14a of the first level layer and the upper gap-insulating layer 14b of the second level layer, and the third spacers implemented by particles of insulators having a particle diameter between ten nanometers and 40 micrometers are inserted between the upper gap-insulating layer 14b of the second level layer and the upper gap-insulating layer 14c of the third level layer, and the fourth spacers implemented by particles of insulators having a particle diameter between ten nanometers and 40 micrometers are inserted between the vibrating plate 15b and the upper gap-insulating layer 14c of the third level layer, and the interval of the gap defined between the vibrating electrode 15b and the upper polymer film 13a is controlled. In this way, between the upper vibrating plate 15 and the upper polymer film 13a, the plurality of upper gap-insulating layers 14a, 14b, 14c, . . . are laminated and inserted through the spacers implemented by particles of insulators each having the particle diameter between ten nanometers and 40 micrometers. Consequently, the microgaps are defined between the upper vibrating plate 15 and the upper gap-insulating layer 14c of the third level layer, between the upper gap-insulating layer 14c of the third level layer and the upper gap-insulating layer 14b of the second level layer, between the upper gap-insulating layer 14b of the second level layer and the upper gap-insulating layer 14a of the first level layer, and between the upper gap-insulating layer 14a of the first level layer and the upper polymer film 13a, respectively. Consequently, the gap width $W_g$ of the macroscopic element-install cavity between the upper vibrating plate 15 and the upper polymer film 13a is controlled. When the particle diameter of the particle serving as each of the first to fourth spacers is elected to be 100 micrometers or less, the effective surface roughness $Ra_{eff}$ of the surfaces establishing each of the microgaps can be $1/10$ or less of the gap width of the element-install cavity that is defined to accommodate the microgaps between the bottom surface of the upper vibrating plate 15 and the top surface of the upper polymer film 13a (the effective surface roughness $Ra_{eff}$ includes the bending under a loaded condition). However, in order to achieve the film-shaped electro-mechanical converter that is flexible and has a high degree of freedom in geometrical deformations, the particle diameter of the particle serving as each of the first to fourth spacers is elected to be ten nanometers to ten micrometers, which is preferable because the entire thickness becomes further thin. Moreover, in a range between ten nanometers and five micrometers, the particle diameter closer to ten nanometers is naturally desirable.

The second pressure receiving device $M_2$ formed under the common electrode 17c encompasses a shielding-conductor film 11b; a lower polymer film 13b which is defined by a flat first principal surface facing to the vibration surface of the shielding-conductor film 11b, through a gap space, the thickness of the gap space is measured in a stacked structure implemented by a lower gap-insulating layer 14p of the first level layer, a lower gap-insulating layer 14q of the second level layer and a lower gap-insulating layer 14r of the third level layer, and a second principal surface facing in parallel to the first principal surface; and a common electrode 17c in contact with the second principal surface of the lower polymer film 13b. The shielding-conductor film 11b serves as the vibrating plate having the flat vibration surface under no load condition of the second pressure receiving device $M_2$. Similarly to the first pressure receiving device $M_1$, between the shielding-conductor film 11b and the lower polymer film 13b, a plurality of lower gap-insulating layers 14p, 14q, 14r, . . . are laminated and inserted through the spacers implemented by particles of insulators each having the particle diameter between ten nanometers and 40 micrometers. Consequently, the microgaps are defined between the shielding-conductor film 11b and the lower gap-insulating layer 14r of the third level layer, between the lower gap-insulating layer 14r of the third level layer and the lower gap-insulating layer 14q of the second level layer, between the lower gap-insulating layer 14q of the second level layer and the lower gap-insulating layer 14p of the first level layer, and between the lower gap-insulating layer 14p of the first level layer and the lower polymer film 13b, respectively. Consequently, the gap width $W_g$ of the macroscopic element-install cavity between the shielding-conductor film 11b and the lower polymer film 13b is controlled. In the first pressure receiving device $M_1$ and the second pressure receiving device $M_2$, the common electrode 17c is used as the common output terminal.

When the particle diameter of the particle serving as each of the first to fourth spacers is elected to be 100 micrometers or less, the effective surface roughness $Ra_{eff}$ of the surfaces establishing each of the microgaps can be $1/10$ or less of the gap width of the element-install cavity that is defined to accommodate the microgaps between the bottom surface of the lower polymer film 13b and the top surface of the shielding-conductor film 11b (the effective surface roughness $Ra_{eff}$ includes the bending under a loaded condition). However, in order to achieve the film-shaped electro-mechanical converter that is flexible and has a high degree of freedom in geometrical deformations, the particle diameter of the particle serving as spacer shall be elected to be ten nanometers to ten micrometers, which is preferable because the entire thickness becomes further thin. Moreover, in a range between ten nanometers and five micrometers, the particle diameter closer to ten nanometers is naturally desirable.

As illustrated in FIG. 32, the plurality of upper gap-insulating layers 14a, 14b, 14c, . . . , the electret-insulating layer 14e and the upper polymer film 13a are accommodated in the inside of the box-shaped insulation containers (12k, 12l) in which the common electrode 17c is used as the bottom plate, and the upper vibrating plate 15 serves as the cover of the insulation containers (12k, 12l). Meanwhile, the lower polymer film 13b and the plurality of lower gap-insulating layers 14p, 14q, 14r, . . . are accommodated in the inside of the box-shaped insulation containers (12k, 12m and 12o) in which the common electrode 17c serves as the ceiling plate, and the shielding-conductor film 11b serves as the bottom plate of the insulation containers (12k, 12m and 12o).

The semiconductor chip (FET amplifier) 19 is installed (mounted) through a circuit board 18, in the vicinity of the left end of the bottom surface of the common electrode 17c, in FIG. 32. On the circuit board 18, a through hole (via) is made, and through the through hole (via), an amplifying circuit 19 is electrically connected to the common electrode 17c, through a solder that is fused and connected to the vicinity of the left end of the common electrode 17c. Although the illustration is omitted, the ground wiring from the amplifying circuit 19 is connected to the shielding-conductor film 11b through solder. The electrodes of the amplifier integrated in the amplifying circuit 19 are electrically connected to the connection electrodes, such as the solder ball and the like, on the rear surface of the circuit board 18, through the inner wirings and the through holes (vias) provided in the circuit board 18 and surface wiring delineated on the surface of the circuit board 18. The mounted structure (package) of the amplifying circuit 19 is accommodated in an installing cavity provided under the box-shaped insulation containers (12k, 12m and 12o), as illustrated in FIG. 32. When the mounted structure (package) is accommodated, as illustrated in FIG. 32, an insulating layer 12n is used to put the cover at the bottom surface of the installing cavity. Then, the film-shaped electro-mechanical converter according to the seventh embodiment is completed.

As illustrated in FIG. 32, in the film-shaped electro-mechanical converter according to the seventh embodiment, the upper polymer film 13a and the lower polymer film 13b are bonded on and under the common electrode 17c for inputting/outputting; the signal, while their polarities are opposite to each other. Moreover, the plurality of upper gap-insulating layers 19a, 14b, 14c, . . . , the plurality of lower gap-insulating layers 14p, 14q, 14r, . . . , the upper vibrating electrode 15b and the shielding-conductor film 11b are laminated. The capacitance is two times that of the film-shaped electro-mechanical converter pertaining to the fifth embodiment illustrated in FIG. 20.

In the film-shaped electro-mechanical converter (noise-cancelling phone) according to the seventh embodiment, in such a way that the sides for receiving the voice are opposite to each other, the first pressure receiving device $M_1$ and the second pressure receiving device $M_2$ are bonded to both sides of the common electrode 17c, and the outputs from the first pressure receiving device $M_1$ and the second pressure receiving device $M_2$ can be received by the same amplifying circuit 19. Thus, the polarities of the signals of the first pressure receiving device $M_1$ and the second pressure receiving device $M_2$ are inverted, thereby enabling the removal of the noise. Consequently, it is possible to simplify the circuit of the film-shaped electro-mechanical converter (noise-cancelling phone) according to the seventh embodiment.

By the way, in the second pressure receiving device $M_2$ in the film-shaped electro-mechanical converter according to the seventh embodiment, the electret-insulating film and the vibrating-electrode-insulating film are omitted. However, similarly to the first pressure receiving device $M_1$, the electret-insulating film and the vibrating-electrode-insulating film may be contained. Also, the common electrode 17c and the upper polymer film 13a, or the common electrode 17c and the lower polymer film 13b may be metallurgically joined or may be adhered by an adhesive agent and the like, or alternatively, may be merely brought, into contact by a mechanical pressure.

Eighth Embodiment

The film-shaped electro-mechanical converters according to the fifth to seventh embodiments can be used not only as microphones but also as acoustic probes (ultrasonic probes) even with the structures recited in FIGS. 20 and 32, as they are, because these film-shaped electro-mechanical converters can transmit acoustic waves. Also, the film-shaped electro-mechanical converters according to the fifth to seventh embodiments can be flexibly deformed, because all of them can be made of thin films.

Figure 33:
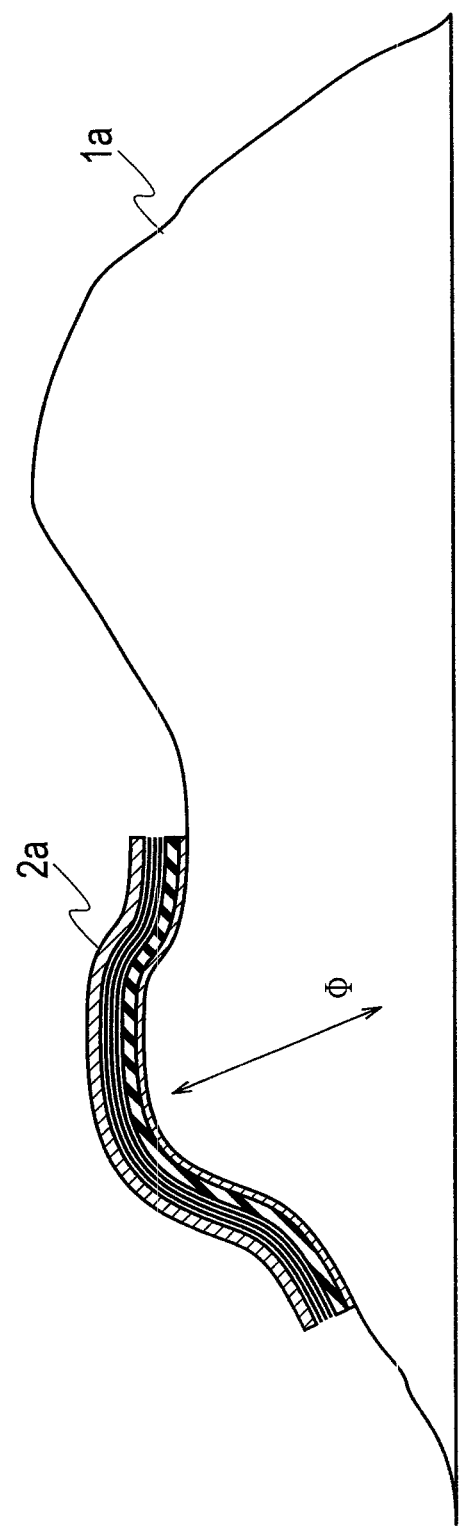
FIG. 33 is a schematic view illustrating a situation, in which a film-shaped electro-mechanical converter according to an eighth embodiment of the present invention is bonded on a measurement target, such that, when the surface of the measurement target is curved, the shape of the film-shaped electro-mechanical converter is fitted to the curved topology.

For this reason, for example, even if the surface of a measurement target 1a is curved as illustrated in FIG. 33, so as to be fitted to the shape of the target 1a, a film-shaped electro-mechanical converter 2a according to a eighth embodiment can be bonded to the target 1a, thereby enabling the transmission/reception of an acoustic wave (ultrasonic wave) $\phi$. For example, when the film-shaped electro-mechanical converter 2a according to IJ the eighth embodiment is used as an electronic stethoscope, the human body as the measurement target 1a and the electronic stethoscope (film-shaped electro-mechanical converter) 2a can be tightly pressed, thereby reducing variation in the reception sensitivity caused by various contact states of the electronic stethoscope 2a. Also, because the electronic stethoscope 2a can transmit and receive the ultrasonic wave $\Phi$, by measuring a sound speed and an attenuation rate of body tissues with the electronic stethoscope 2a, the electronic stethoscope 2a can doubly conducts percussion and palpation.

Figure 34:
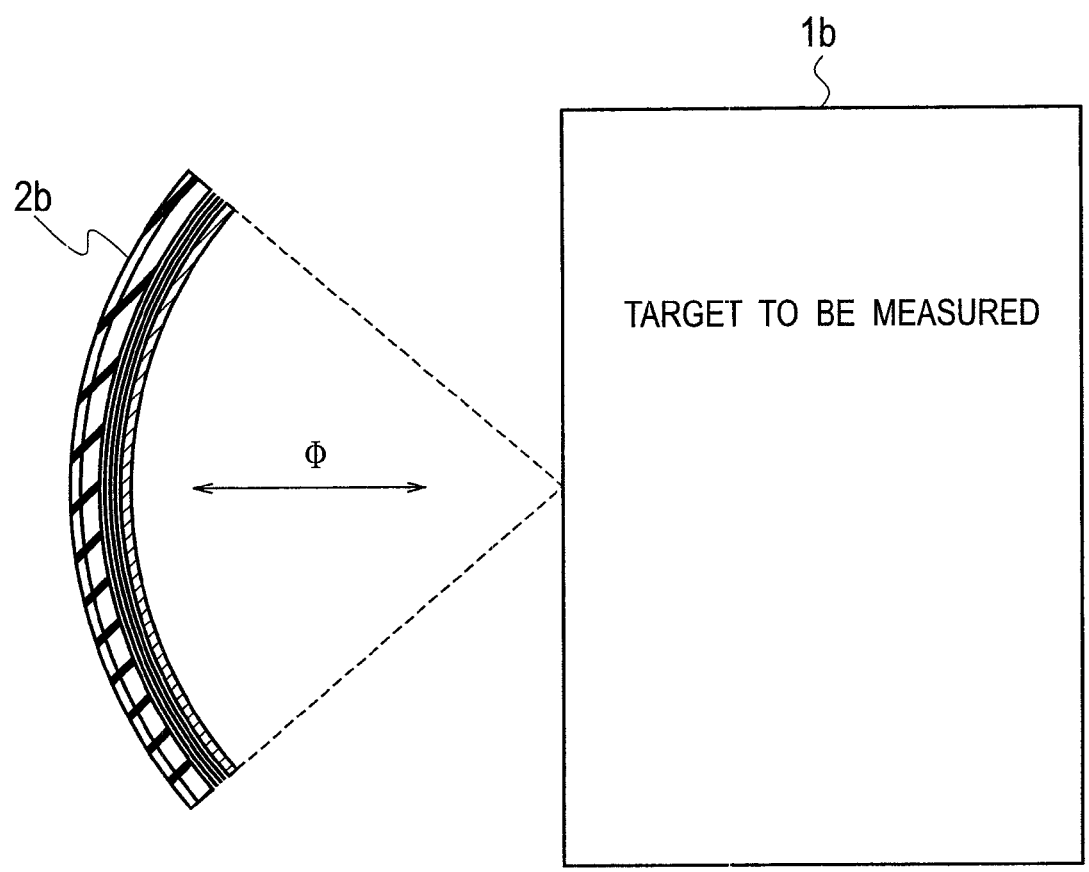
FIG. 34 is a schematic view illustrating a configuration, in which the film-shaped electro-mechanical converter according to the eighth embodiment that is deformed to a bowl-like shape, and the deformed film-shaped electro-mechanical converter converges the ultrasonic waves φ transmitted from the measurement target.

Also, as illustrated in FIG. 34, when a film-shaped electro-mechanical converter 2b according to the eighth embodiment is deformed into bowl-shape, it is possible to converge ultrasonic waves $\Phi$ transmitted from a measurement target 1b. The scheme illustrated in FIG. 34 is a method referred as an immersion testing, which uses water as a contact medium and carries out an ultrasonic wave measurement, and the piezoelectric device is used to carry out the immersion testing. However, in the transmission/reception of aerial ultrasonic waves, because the reception sensitivity is low, the generation of strong ultrasonic waves is required, and the piezoelectric device is strongly resonated to generate the strong ultrasonic wave. However, with the piezoelectric device, the structure illustrated in FIG. 31 cannot be manufactured.

On the contrary, the film-shaped electro-mechanical converter 2b according to the eighth embodiment can carry out the transmission/reception of aerial ultrasonic waves without using the resonance, because a high sensitivity is kept up to about 100 kHz.

Ninth Embodiment

As described in the explanation of the eighth embodiment, the film-shaped electro-mechanical converters according to the fifth to seventh embodiments can be used not only as microphones but also as acoustic probes (ultrasonic probes) even with the structures illustrated in FIGS. 20 and 32, because the acoustic waves can be transmitted. However, because dielectric constant of the film-shaped electro-mechanical converters is lower than that of the piezoelectric device, as compared with the piezoelectric ultrasonic probe having the same area of the pressure receiving plane, the low capacitance of the film-shaped electro-mechanical converters becomes problematic.

Figure 35:
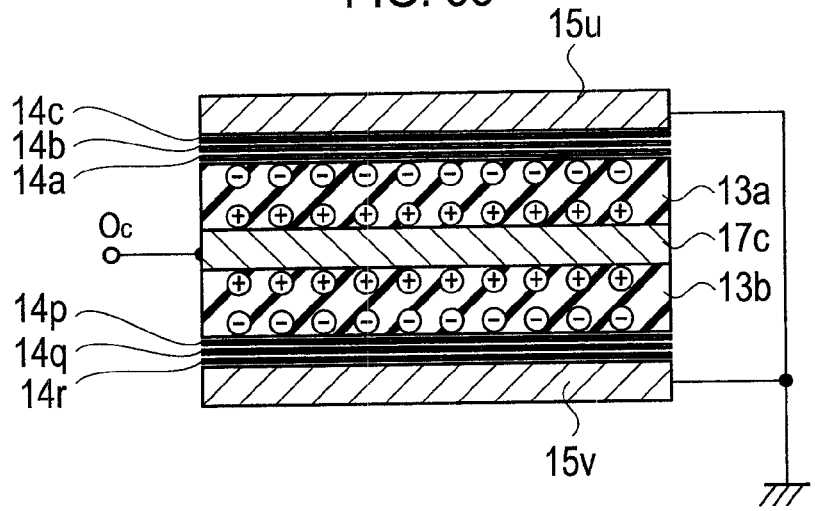
FIG. 35 is a schematic sectional view illustrating a rough configuration of a film-shaped electro-mechanical converter according to a ninth embodiment of the present invention, in which n units (n=2) are stacked and pasted to each other.

In a film-shaped electro-mechanical converter according to a ninth embodiment of the present invention, in order to solve the problem associated with the low capacitance, as illustrated in FIG. 35, a plurality of polymer films 13a, 13b are stacked to achieve a condenser microphone or an ultrasonic probe.

FIG. 35 illustrates a structure in which the main portion is substantially equal to the film-shaped electro-mechanical converter according to the seventh embodiment, which has already been illustrated in FIG. 32. However, the first pressure receiving device $M_1$ formed on the common electrode 17c encompasses an upper vibrating plate (first vibrating plate) 15u; an upper electret layer (first electret layer) 13a that faces the vibration surface of the upper vibrating plate (first vibrating plate) 15u through a gap space, the thickness of the gap space is measured in a stacked structure of a plurality of upper gap-insulating layers (first gap-insulating layers) 14a, 14b, 14c, . . . ; and a common electrode 17c in contact with the upper electret layer (first electret layer) 13a (the upper vibrating plate 15u contains an upper vibrating electrode 15b made of conductor and a vibrating-electrode-insulating film 15a at the bottom surface of the upper vibrating electrode 15b, as illustrated in FIG. 32). The second pressure receiving device $M_2$ arranged under the common electrode 17c encompasses a lower vibrating plate (second vibrating plate) 15v; a lower electret layer (second electret layer) 13b that faces the vibration surface of the lower vibrating plate (second vibrating plate) 15v, through a gap space, the thickness of the gap space is measured in a stacked structure of a plurality of lower gap-insulating layers (second gap-insulating layers) 14p, 14q, 14r, . . . ; and the common electrode 17c in contact with the lower electret layer 13b. In the first pressure receiving device $M_1$ and the second pressure receiving device $M_2$, the common electrode 17c is used as the output terminal.

As illustrated in FIG. 35, the first polymer film 13a and the second polymer film 13b are bonded on and under the common electrode 17c for inputting/outputting the signal, while their polarities are opposite to each other. Moreover, the plurality of first gap-insulating layers 14a, 14b, 14c, . . . , the plurality of second gap-insulating layers 14p, 14q, 14r, . . . , the first vibrating plate 15u and the second vibrating plate 15v are stacked. Thus, as compared with the structure of the film-shaped electro-mechanical converter pertaining to the fifth embodiment illustrated in FIG. 20, it is possible to obtain a two-fold capacitance by the same pressure receiving plane.

When the piezoelectric ultrasonic probe for the aerial ultrasonic wave transmission/reception has a diameter of ten nanometers, the piezoelectric ultrasonic probe has a capacitance of about 2000 pF. On the contrary, in the structure illustrated in FIG. 35, when each thickness of the electrode layer and the films that implement the gap layer is assumed to be five micrometers and the thickness of the polymer film is assumed to be ten micrometers and the specific dielectric constant between the polymer film layer and the gap layer is three, the thickness of the film-shaped electro-mechanical converter according to the ninth embodiment illustrated in FIG. 35 is 70 micrometers and the capacitance is 200 pF.

Figure 36:
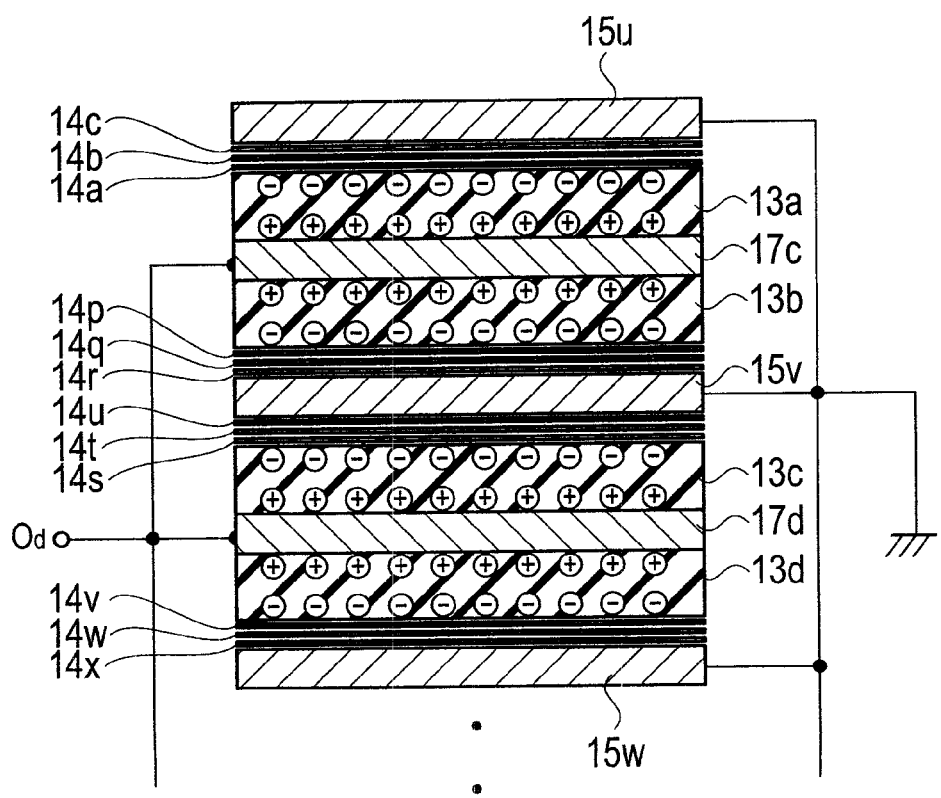
FIG. 36 is a schematic sectional view illustrating a rough configuration of another film-shaped electro-mechanical converter according to the ninth embodiment and illustrates a case in which n (n≦3) units are stacked and joined each other.

Moreover, as illustrated in FIG. 36, when a plurality of polymer films 13a, 13b, 13c, 13d, . . . are stacked and joined corresponding to the number of the necessary units (=n: n is integer of two or more), the capacitance can be largely increased. In FIG. 36, a third pressure receiving device $M_3$ and a fourth pressure receiving device $M_4$, are stacked under the stacked structure of the first pressure receiving device $M_1$ and the second pressure receiving device $M_2$ illustrated in FIG. 36.

That is, in FIG. 36, the first pressure receiving device $M_1$ disposed on a first common electrode 17c encompasses a first vibrating plate 15u; a first polymer film 13a that faces the vibration surface of the first vibrating plate 15u, through a gap space, the thickness of the gap space is measured in a stacked structure of a plurality of first gap-insulating layers 14a, 14b, 14c, . . . ; and the first common electrode 17c serves as the back electrode in contact with the first polymer film 13a. The second pressure receiving device $M_2$ arranged under the first common electrode 17c encompasses a vibrating plate (second common electrode) 15v; a second polymer film 13b that faces the vibration surface of the vibrating plate (second common electrode) 15v, through a gap space, the thickness of the gap space is measured in a stacked structure of a plurality of second gap-insulating layers 14p, 14q, 14r, . . . ; and the first common electrode 17c serves as the back electrode in contact with the second polymer film 13b. In the first pressure receiving device $M_1$ and the second pressure receiving device $M_2$, the first common electrode 17c is used as the output terminal.

Under the second pressure receiving device $M_2$, the third pressure receiving device $M_3$ is arranged, the third pressure receiving device $M_3$ encompasses a second common electrode film 15v serving as the vibrating electrode; a third polymer film 13c that faces the vibration surface of the second common electrode film 15v, through a gap space, the thickness of the gap space is measured in a stacked structure of a plurality of third gap-insulating layers 14s, 14t, 14u, . . . ; and a third common electrode film 17d serving as the back electrode in contact with the third polymer film 13c. The fourth pressure receiving device $M_4$, arranged under the third common electrode film 17d, encompasses a vibrating plate (fourth common electrode) 15w; a fourth polymer film 13d that faces the vibration surface of the vibrating plate (fourth common electrode) 15w, through a gap space, the thickness of the gap space is measured in a stacked structure of a plurality of fourth gap-insulating layers 14v, 14w, 14x . . . ; and the third common electrode film 17d serves as the back electrode in contact with the fourth polymer film 13d. In the third pressure receiving device $M_3$ and the fourth pressure receiving device $M_4$, the third common electrode film 17d is used as the common output terminal.

In this way, in FIG. 36, the plurality of polymer films 13a, 13b, 13c, 13d, . . . are stacked, with the unit number n=10, so that the same capacitance as the piezoelectric ultrasonic probe can be achieved. While, the piezoelectric ultrasonic probe for the aerial ultrasonic wave reception is accommodated in a protecting receptacle, and generally, the thickness of the piezoelectric ultrasonic probe is about 10 millimeters. Meanwhile, in the film-shaped electro-mechanical converter according to the ninth embodiment, even if the plurality of polymer films 13a, 13b, 13c, 13d, . . . are stacked with the unit number n=10, the entire thickness is about 700 micrometers. Thus, it is possible to obtain the film-shaped electro-mechanical converter that is extremely thin. Also, as described in the fifth embodiment by using Eq. (8) and the like, the film-shaped electro-mechanical converter according to the ninth embodiment has the high reception sensitivity and the wide band.

Tenth Embodiment

As described in the fifth embodiment, when the area of the pressure receiving plane of the film-shaped electro-mechanical converter pertaining to the fifth embodiment is excessively small, the capacitance is insufficient, which results in the reduction in sensitivity. Although the area of the pressure receiving plane depends on the gap thickness, the thickness of the polymer film and the dielectric constant, at least 1 mm² or more is required for the area of the pressure receiving plane. Meanwhile, when the area of the pressure receiving plane is excessively large, the gap-insulating layers 14a, 14b, 14c, . . . are fluctuated by the sound, and the variation in the output is consequently increased. Moreover, since the displacements of the laminated gap-insulating layers 14a, 14b, 14c, . . . are increased, air gap widths between the gap-insulating layers 14a, 14b, 14c, . . . increases, which brings about the generation of the discharge, and the sensitivity is deteriorated. Although the area of the pressure receiving plane depends on the thicknesses of the gap-insulating layers 14a, 14b, 14c, . . . and the frequency band of the sound to be measured, the area of the pressure receiving plane is preferred to be at least 100 cm² or less. However, as indicated in a film-shaped electro-mechanical converter according to a tenth embodiment illustrated in FIG. 37, when a sensing area in the film-shaped electro-mechanical converter is divided into many elements $M_{ij-1}$, $M_{ij}$, $M_{ij+1}$, . . . (i=1 to m; j=1 to n: each of the m and the n is positive integer of two or more) and the portions between the elements $M_{ij-1}$, $M_{ij}$, $M_{ij+1}$, . . . are joined so that the films are not displaced, as far as the area of each one of pressure receiving planes of the respective elements $M_{ij-1}$, $M_{ij}$, $M_{ij+1}$, . . . is limited to be within the above range, an upper limit of the entire area of the film-shaped electro-mechanical converter is not limited to the foregoing values.

Figure 37:
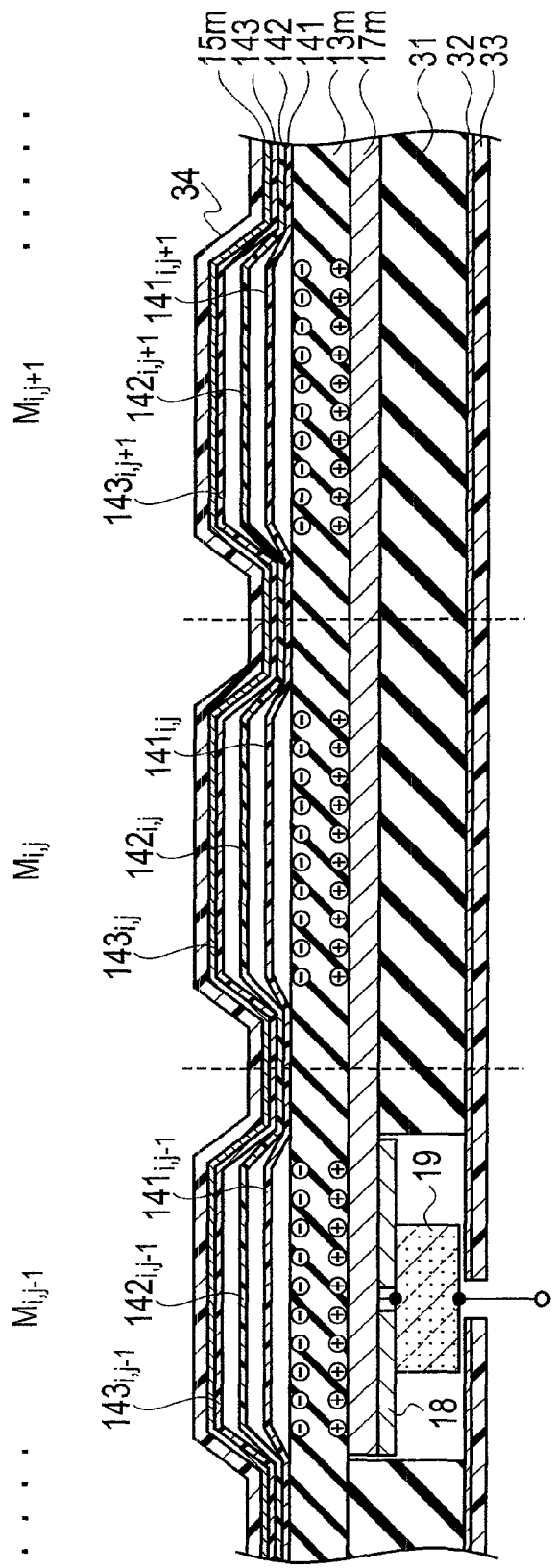
FIG. 37 is a schematic sectional view illustrating a rough configuration of a film-shaped electro-mechanical converter according to a tenth embodiment of the present invention, in which a sensing area is divided into many elements.

As indicated in FIG. 37, the film-shaped electro-mechanical converter according to the tenth embodiment of the present invention encompasses a vibrating plate 15m having a flat vibration surface under no load condition; a polymer film 13m which is defined by a flat first principal surface facing to the vibration surface of the vibrating plate 15m, through a gap space, the thickness of the gap space is measured in a stacked structure implemented by a gap-insulating layer 141 of the first level layer, a gap-insulating layer 142 of the second level layer and a gap-insulating layer 143 of the third level layer, and a second principal surface facing in parallel to the first principal surface, the polarization directions are aligned in the polymer film 13m; and a back electrode 17m in contact with the second principal surface of the polymer film 13m. On the vibrating plate 15m, a vibrating-plate-protection film 34 is laminated for protecting the vibrating plate 15m. Each thickness of the gap-insulating layer 141 of the first level layer, the gap-insulating layer 142 of the second level layer, the gap-insulating layer 143 of the third level layer and the polymer film 13m is elected to be about one micrometer to 50 micrometers, preferably about one micrometer to 25 micrometers, more preferably about five micrometers to 25 micrometers.

When focusing to a central element $M_{ij}$ in FIG. 37 and describing only the central element $M_{ij}$, in the element $M_{ij}$ implementing the film-shaped electro-mechanical converter according to the tenth embodiment of the present invention, first spacers (illustration is omitted) implemented by particles of insulators having a particle diameter between ten nanometers and 40 micrometers are inserted between a gap-insulating layer $141_{ij}$ of the first level layer and the polymer film 13m, and the second spacers (illustration is omitted) implemented by particles of insulators having a particle diameter between ten nanometers and 40 micrometers are inserted between the gap-insulating layer $141_{ij}$ of the first level layer and a gap-insulating layer $142_{ij}$ of the second level layer, and the third spacers (illustration is omitted) implemented by particles of insulators having a particle diameter between ten nanometers and 40 micrometers are inserted between the gap-insulating layer $142_{ij}$ of the second level layer and a gap-insulating layer $143_{ij}$ of the third level layer, and the interval of the gap defined between the vibrating plate 15m and the polymer film 13m is controlled. The gap-insulating layer $143_{ij}$ of the third level layer and the vibrating plate 15m are tightly joined, and the gap-insulating layer $143_{ij}$ of the third level layer carries out the function equivalent to that of the vibrating-electrode-insulating film of the film-shaped electro-mechanical converter pertaining to the fifth embodiment. In this way, between the vibrating plate 15m and the polymer film 13m, the plurality of gap-insulating layers $141_{ij}$, $142_{ij}$, $143_{ij}$, . . . are laminated and inserted through the spacers (illustration is omitted) implemented by particles of insulators, each having the particle diameter between ten nanometers and 40 micrometers. Consequently, the microgaps are defined between the gap-insulating layer $143_{ij}$ of the third level layer and the gap-insulating layer $142_{ij}$ of the second level layer, between the gap-insulating layer $142_{ij}$ of the second level layer and the gap-insulating layer $141_{ij}$ of the first level layer, and between the gap-insulating layer $141_{ij}$ of the first level layer and the polymer film 13m, respectively, and the respective intervals in the elements $M_{ij}$ are controlled.

When each diameter of the particles serving as the first to third spacers is elected to be 100 micrometers or less, the effective surface roughness $Ra_{eff}$ of the surfaces establishing each of the microgaps can be 1/10 or less of the gap width of the element-install cavity, which is defined for each of elements, between the bottom surface of the gap-insulating layer $143_{ij}$ of the third level layer and the top surface of the polymer film 13m (the effective surface roughness $Ra_{eff}$ includes the bending under a loaded condition). However, in order to achieve the film-shaped electro-mechanical converter that is flexible and has a high degree of freedom in geometrical deformations, the diameter of the particles serving as each of the first to third spacers is elected to be ten nanometers to ten micrometers, which is preferable because the entire thickness becomes further thin. Moreover, in the range between ten nanometers and five micrometers, the particle diameter closer to ten nanometers is naturally desirable. The back electrode 17m and the polymer film 13m may be metallurgically joined or may be adhered by adhesive agent and the like, or alternatively, may be merely brought into contact by the mechanical pressure.

A spacer film 31 made of insulating material is bonded to at the bottom surface of the polymer film 13m, a conductive (metallic) shielding-conductor film 32 is laminated at the bottom surface of the spacer film 31, and a shielding-conductor-protection film 33 is laminated at the bottom surface of the shielding-conductor film 32. The shielding-conductor-protection film 33 and the shielding-conductor film 32 implement a shield plate. Each thickness of the spacer film 31 and the shielding-conductor-protection film 33 can be elected to be a value of about five to 150 micrometers, preferably about 50 to 100 micrometers. As indicated in the vicinity of the left end, below the back electrode 17m in FIG. 37, an amplifying circuit 19 is accommodated in a hollow cavity formed in a part of the spacer film 31. The amplifying circuit 19 is installed (mounted) on the circuit board 18, in the vicinity of the left end of the back electrode 17m. On the circuit board 18, a through hole (via) is made, and through the through hole (via), the amplifying circuit 19 is electrically connected to the back electrode 17m, through a solder that is fused and connected to the vicinity of the left end of the back electrode 17m. Although the illustration is omitted, a ground wiring from the amplifying circuit 19 is connected to the shielding-conductor film 32 through solder. In the film-shaped electro-mechanical converter for transmitter, the amplifying circuit 19 amplifies the input electric signal and applies across the vibrating plate 15m and the back electrode 17m. Meanwhile, in the film-shaped electro-mechanical converter for receiver, the amplifying circuit 19 amplifies and measures the charges induced in association with the displacement of the vibrating plate 15m, between the vibrating plate 15m and the back electrode 17m. In the film-shaped electro-mechanical converter for transmitter, the vibrating plate 15m is vibrated by supplying the electric signal, through the amplifying circuit 19, across the vibrating plate 15m and the back electrode 17m. Meanwhile, in the film-shaped electro-mechanical converter for receiver, the vibrating plate 15m is vibrated by the reception of the acoustic wave from the outside.

For example, in FIG. 37, a PVC film with a thickness of 100 micrometers can be used as the vibrating-plate-protection film 34, and an Al film with a thickness of ten micrometers can be used as each of the vibrating plate 15m, the back electrode 17m and the shielding-conductor film 32, and a PTFE film with a thickness of 50 micrometers can be used as the spacer film 31, and a PFA film with a thickness of ten micrometers can be used as the polymer film 13m, and three PFA films each having a thickness of five micrometers can be used as the gap-insulating layer 141 of the first level layer, the gap-insulating layer 142 of the second level layer, and the gap-insulating layer 143 of the third level layer, respectively. When the vibrating plate 15m is an Al film, which is deposited on the gap-insulating layer 143 of the third level layer, the vibrating plate 15m and the gap-insulating layer 143 of the third level layer are tightly joined. Similarly, when the back electrode 17m is an Al film, which is deposited on the polymer film 13m, the polymer film 13m and the back electrode 17m are tightly joined. When the shielding-conductor film 32 is an Al film, which is deposited on the spacer film 31, the spacer film 31 and the shielding-conductor film 32 are tightly joined.

In the film-shaped electro-mechanical converter according to the tenth embodiment illustrated in FIG. 37, a portion between the element $M_{ij-1}$ and the element $M_b$ and a portion between the element $M_b$ and the element $M_{ij+1}$ are tightly joined by a thermal compression bonding and the like. Thus, they are thinner in thickness than the portions of the elements $M_{ij-1}$, $M_{ij}$ and $M_{ij+1}$ .... In the polymer film 13m, above the regions corresponding to the elements $M_{ij-1}$, $M_{ij}$ and $M_{ij+1}$, ..., corona discharges resulting from needle electrodes are generated respectively, thereby electrifying the polymer film 13m, and electret regions are formed in the elements $M_{ij-1}$, $M_{ij}$ and $M_{ij+1}$ respectively.

Also, in the configuration of the film-shaped electro-mechanical converter according to the tenth embodiment, it is possible to use ferroelectric material such as PZT, LiNbO$_3$ as the polymer film 13m of the elements $M_{ij-1}$, $M_{ij}$ and $M_{ij+1}$, .... However, in using the ferroelectric material, since the flexibility is decreased, the deformation is possible only between the elements, such as between the element $M_{ij-1}$ and the element $M_{ij}$, between the element $M_{ij}$ and the element $M_{ij+1}$, and the like.

Eleventh Embodiment

Figure 38:
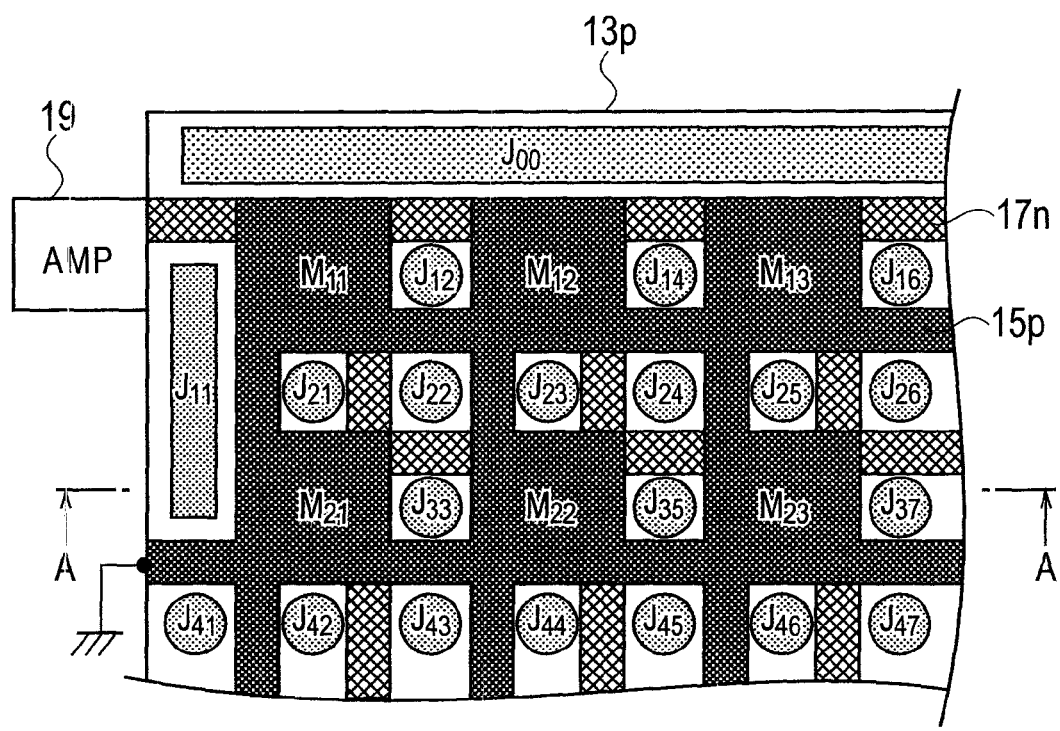
FIG. 38 is a plan view illustrating outline of a interconnection structure of a film-shaped electro-mechanical converter according to an eleventh embodiment of the present invention, in which the sensing area is divided into the many elements.
Figure 39:
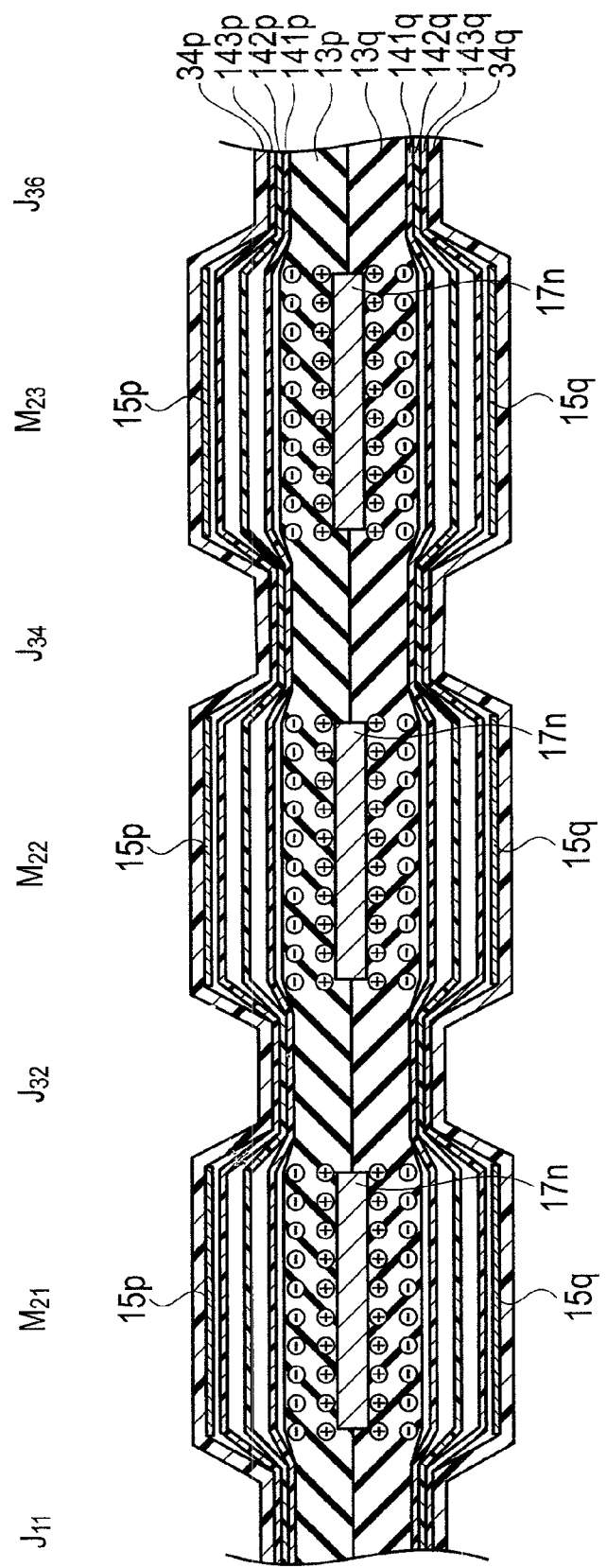
FIG. 39 is a sectional view taken from A-A direction in FIG. 38.

As illustrated in FIGS. 38 to 40, when a pattern in which L-shaped empty areas are arrayed in a shape of a matrix is delineated on each of inner electrode films 17n for delivering signals and outer electrode films 15p, 15q serving as shields, element isolation regions $J_{rs-1}$, $J_{rs}$, $J_{rs+1}$, ... (each of the r and the s is integer determined by a wiring topology) are formed between the two-dimensionally arranged elements $M_{ij-1}$, $M_{ij}$, $M_{ij+1}$ .... As illustrated in FIG. 40, between the pattern of the inner electrode films 17n and the patterns of the outer electrode films 15p, 15q, the directions and positions of the L-shaped empty areas differ from each other. However, the amplifying circuit 19 is connected to the inner electrode films 17n for delivering the signal, and the outer electrode films 15p, 15q serving as the shields are grounded.

With the arrangement of the element isolation regions $J_{rs-1}$, $J_{rs}$, $J_{rs+1}$, ..., the stray capacitance between the metallic wirings arrayed in a vertical direction can be decreased in each of the elements $M_{ij-1}$, $M_{ij}$, $M_{ij+1}$ ..., when the thin films are laminated. Also, at the locations of the element isolation regions $J_{rs-1}$, $J_{rs}$, $J_{rs+1}$, ..., where each of the element isolation regions $J_{rs-1}$, $J_{rs}$, $J_{rs+1}$, ... is only implemented by the plurality of polymer films, it becomes easy to join the plurality of thin films which implement each of the elements $M_{ij-1}$, $M_{ij}$, $M_{ij+1}$ ... into the stacked structures, respectively.

FIG. 39 is a sectional view taken from A-A direction and illustrates the elements $M_{21}$, $M_{22}$, $M_{23}$, as an example, and the element isolation region $J_{11}$ implemented only by polymer films on the left side of the element $M_{21}$, the element isolation region $J_{32}$ implemented only by polymer films between the element $M_{21}$ and the element $M_{22}$, the element isolation region $J_{34}$ implemented only by polymer films between the element $M_{22}$ and the element $M_{23}$, and the element isolation region $J_{36}$ implemented only by polymer films on the right side of the element $M_{23}$ can be tightly joined by the thermal press bonding and the like. Thus, the element isolation regions $J_{rs-1}$, $J_{rs}$, $J_{rs+1}$, ... are thinner in thickness than the portions of the elements $M_{21}$, $M_{22}$, $M_{23}$, ....

As shown in the sectional view in FIG. 39, in the film-shaped electro-mechanical converter according to the eleventh embodiment of the present invention, the structure of each of the elements $M_{21}$, $M_{22}$, $M_{23}$, is similar to that of the film-shaped electro-mechanical converter according to the seventh embodiment illustrated in FIG. 32 or the film-shaped electro-mechanical converter according to the ninth embodiment illustrated in FIG. 35. Then, an upper element of each of the elements $M_{ij-1}$, $M_{ij}$, $M_{ij+1}$, ... disposed on inner electrode films 17n serving as a common back electrode encompasses an upper vibrating plate 15p having a flat vibration surface under no load condition; an upper polymer film 13p which is defined by a flat first principal surface facing to the vibration surface of the upper vibrating plate 15p, through a gap space, the thickness of the gap space is measured in a stacked structure implemented by an upper insulating layer 141p of the first level layer, an upper gap-insulating layer 142p of the second level layer and an upper gap-insulating layer 143p of the third level layer, and the second principal surface facing in parallel to the first principal surface, the polarization directions are aligned in the upper polymer film 13p; and the inner electrode films 17n serves as the back electrode in contact with the second principal surface of the upper polymer film 13p. An upper vibrating-plate-protection film 34p for protecting the upper vibrating plate 15p is laminated on the upper vibrating plate 15p.

Meanwhile, a lower element of each of the elements $M_{21}$, $M_{22}$, $M_{23}$, ... arranged under the inner electrode films 17n encompasses a lower vibrating plate 15q having a flat vibration surface under no load condition; a lower polymer film 13q which is defined by a flat first principal surface facing to the vibration surface of the lower vibrating plate 15q, through a gap space, the thickness of the gap space is measured in a stacked structure implemented by a lower insulating layer 141q of the first level layer, a lower gap-insulating layer 142q of the second level layer and a lower gap-insulating layer 143q of the third level layer, and the second principal surface facing in parallel to the first principal surface, the polarization directions are aligned in the lower polymer film 13q, and the inner electrode films 17n serves as the back electrode in contact with the second principal surface of the lower polymer film 13q. A lower vibrating-plate-protection film 34q for protecting a lower vibrating plate 15q is laminated under the lower vibrating plate 15q. Each thickness of the upper gap-insulating layer 141p of the first level layer, the upper gap-insulating layer 142p of the second level layer, the upper gap-insulating layer 143p of the third level layer and the upper polymer film 13p may be set to about one micrometer to 50 micrometers, preferably about one micrometer to 25 micrometers, more preferably five micrometers to 25 micrometers. Each thickness of the lower gap-insulating layer $141q$ of the first level layer, the lower gap-insulating layer $142q$ of the second level layer, the lower gap-insulating layer $143q$ of the third level layer and the lower polymer film $13q$ may be set to about one micrometer to 50 micrometers, preferably about one micrometer to 25 micrometers, more preferably five micrometers to 25 micrometers.

Focusing to the central element $M_{22}$ in FIG. 37 and describing the element $M_{22}$, in the element $M_{22}$ implementing the film-shaped electro-mechanical converter according to the eleventh embodiment of the present invention, first spacers (illustration is omitted) implemented by particles of insulators having a particle diameter between ten nanometers and 40 micrometers are inserted between an upper gap-insulating layer $141p_{22}$ of the first level layer and the upper polymer film $13p$, and second spacers (illustration is omitted) implemented by particles of insulators having a particle diameter between ten nanometers and 40 micrometers are inserted between an upper gap-insulating layer $141p_{22}$ (having the relation similar to FIG. 37, although the suffix 22 indicating the inner structure of the element $M_{22}$, in FIG. 39) of the first level layer and an upper gap-insulating layer $142p_{22}$ of the second level layer, and third spacers (illustration is omitted) implemented by particles of insulators having a particle diameter between ten nanometers and 40 micrometers are inserted between an upper gap-insulating layer $142p_{22}$ of the second level layer and an upper gap-insulating layer $143p_{22}$ of the third level layer, and interval of the gap defined between the upper vibrating plate $15p$ and the upper polymer film $13m$ is controlled. The upper gap-insulating layer $143p_{22}$ of the third level layer and the upper vibrating plate $15p$ are tightly joined, and the upper gap-insulating layer $143p_{22}$ of the third level layer carries out the function equivalent to that of the vibrating-electrode-insulating film of the film-shaped electro-mechanical converter pertaining to the fifth embodiment. In this way, between the upper vibrating plate $15p$ and the upper polymer film $13p$, the plurality of upper gap-insulating layers $141p_{22}$, $144p_{22}$, $143p_{22}$, are laminated and inserted through the spacers (illustration is omitted) implemented by particles of insulators each having the particle diameter between ten nanometers and 40 micrometers. Consequently, the microgaps are defined between the upper gap-insulating layer $143p_{22}$ of the third level layer and the upper gap-insulating layer $142p_{22}$ of the second level layer, between the upper gap-insulating layer $142p_{22}$ of the second level layer and the upper gap-insulating layer $141p_{22}$ of the first level layer, and between the upper gap-insulating layer $141p_{22}$ of the first level layer and the upper polymer film $13p$, respectively, and respective intervals in the elements $M_{22}$ are controlled.

When each diameter of the particles serving as the first to third spacers is elected to be 100 micrometers or less, the effective surface roughness $Ra_{eff}$ of the surfaces establishing each of the microgaps can be $1/10$ or less of the gap width of the element-install cavity, which is defined for each element, between the bottom surface of the upper gap-insulating layer $143p_{22}$ of the third level layer and top surface of the upper polymer film $13p$ (the effective surface roughness $Ra_{eff}$ includes the bending under a loaded condition). However, in order to achieve the film-shaped electro-mechanical converter that is flexible and has a high degree of freedom in geometrical deformations, the diameter of the particles serving as each of the first to third spacers is elected to be ten nanometers to ten micrometers, which is preferable because the entire thickness becomes further thin. Moreover, in the range between ten nanometers and five micrometers, the particle diameter closer to ten nanometers is naturally desirable.

Similarly, first spacers (illustration is omitted) implemented by particles of insulators having a particle diameter between ten nanometers and 40 micrometers are inserted between the lower gap-insulating layer $141q_{22}$ of the first level layer and the lower polymer film $13q$, second spacers (illustration is omitted) implemented by particles of insulators having a particle diameter between ten nanometers and 40 micrometers are inserted between the lower gap-insulating layer $141q_{22}$ of the first level layer and the lower gap-insulating layer $142q_{22}$ of the second level layer, and third spacers (illustration is omitted) implemented by particles of insulators having a particle diameter between ten nanometers and 40 micrometers are inserted between the lower gap-insulating layer $142q_{22}$ of the second level layer and the lower gap-insulating layer $143q_{22}$ of the third level layer, and the interval of the gap defined between the lower vibrating plate $15q$ and the lower polymer film $13q$ is controlled. The lower gap-insulating layer $143q_{22}$ of the third level layer and the lower vibrating plate $15q$ are tightly joined, and the lower gap-insulating layer $143q_{22}$ of the third level layer carries out the function equivalent to that of the vibrating-electrode-insulating film of the film-shaped electro-mechanical converter pertaining to the fifth embodiment. In this way, between the lower vibrating plate $15q$ and the lower polymer film $13q$, the plurality of lower gap-insulating layers $141q_{22}$, $142q_{22}$, $143q_{22}$, ... are laminated and inserted through the spacers (illustration is omitted) implemented by particles of insulators each having the particle diameter between ten nanometers and 40 micrometers. Consequently, the microgaps are defined between the lower gap-insulating layer $143q_{22}$ of the third level layer and the lower gap-insulating layer $142q_{22}$ of the second level layer, between the lower gap-insulating layer $142q_{22}$ of the second level layer and the lower gap-insulating layer $141q_{22}$ of the first level layer, and between the lower gap-insulating layer $141q_{22}$ of the first level layer and the upper polymer film $13q$, respectively, and respective intervals in the element $M_{22}$ are controlled.

When each diameter of the particles serving as the first to third spacers is elected to be 100 micrometers or less, the effective surface roughness $Ra_{eff}$ of the surfaces establishing each of the microgaps can be $1/10$ or less of the gap width of the element-install cavity, which is defined for each element, between the bottom surface of the lower polymer film $13q$ and top surface of the lower gap-insulating layer $143q_{22}$ of the third level layer (the effective surface roughness $Ra_{eff}$ includes the bending under a loaded condition). However, in order to achieve the film-shaped electro-mechanical converter that is flexible and has a high degree of freedom in geometrical deformations, the diameter of the particles serving as each of the first to third spacers is elected to be ten nanometers to ten micrometers, which is preferable because the entire thickness becomes further thin. Moreover, in the range between ten nanometers and five micrometers, the particle diameter closer to ten nanometers is naturally desirable. The inner electrode films $17n$ and the upper polymer film $13p$, or the inner electrode films $17n$ and the lower polymer film $13q$ may be metallurgically joined or may be adhered by adhesive agent and the like, or alternatively, may be merely brought into contact by the mechanical pressure.

In the film-shaped electro-mechanical converter according to the eleventh embodiment, when the film-shaped electro-mechanical converter is used in a flat surface state without any deformation, there is no fear that the film implementing the film-shaped electro-mechanical converter is displaced. For this reason, the joining of the elements $M_{22-1}$, $M_{22}$, $M_{22+1}$, ... can be omitted, and in the element isolation regions $J_{rs-1}$, $J_{rs}$, $J_{rs+1}$, ... implemented by only the polymer films, the films can be adsorbed only by the electrostatic force between the polymer films 13p, 13q, and can be used.

Figure 41:
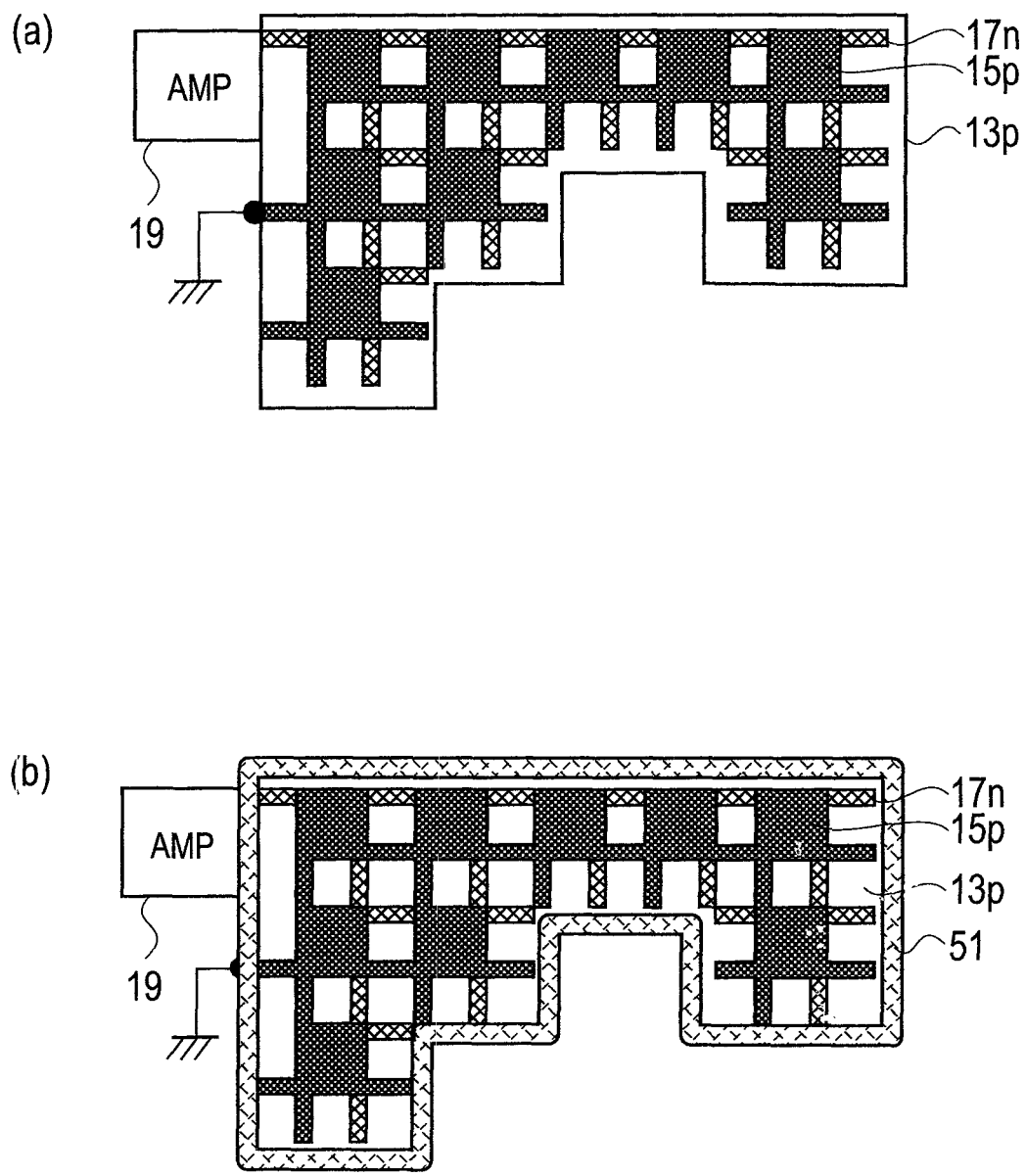
FIG. 41 is a schematic plan view illustrating a situation, in which a planer shape is changed, when a part of the film-shaped electro-mechanical converter according to the eleventh embodiment is cut away, in response to a status of use (shape of a target to be measured)

The film-shaped electro-mechanical converter according to the eleventh embodiment illustrated in FIGS. 38 to 40 can be operated as a single film-shaped electro-mechanical converter, even if a part of the film-shaped electro-mechanical converter is cut, when the respective electrode layers 15p, 15q and 17n of the elements $M_{22-1}$, $M_{22}$, $M_{22+1}$ are electrically connected in any topology in a two-dimensional direction, respectively. Thus, after the film-shaped electro-mechanical converter film that has the structure illustrated in FIGS. 38 to 40 and has a large area is manufactured, it is possible to change the planer shape by cutting a selected portion between the elements, as illustrated in FIG. 41(a), in view of the status of use (the shape of target to be measured). Then, when the film-shaped electro-mechanical converter film is attached to a service allocation (target to be measured), by sealing the cutting edge with an insulating adhesive agent 51 as illustrated in FIG. 41(b), the film-shaped electro-mechanical converter film can be delineated to any planer shape corresponding to the shape of the target to be measured, and can be used as the film-shaped electro-mechanical converter.

Twelfth Embodiment

When the inner electrode films 17n of the elements $M_{ij-1}$, $M_{ij}$, $M_{ij+1}$, that are two-dimensionally arrayed as illustrated in FIG. 38 to FIG. 40 are divided for facilitating random access, and a large number of separated film-shaped electro-mechanical converters are integrated, it is possible to produce the film-shaped electro-mechanical converter as a two-dimensional sensor (acoustic image sensor) that can measure a sound-pressure distribution.

Figure 42:
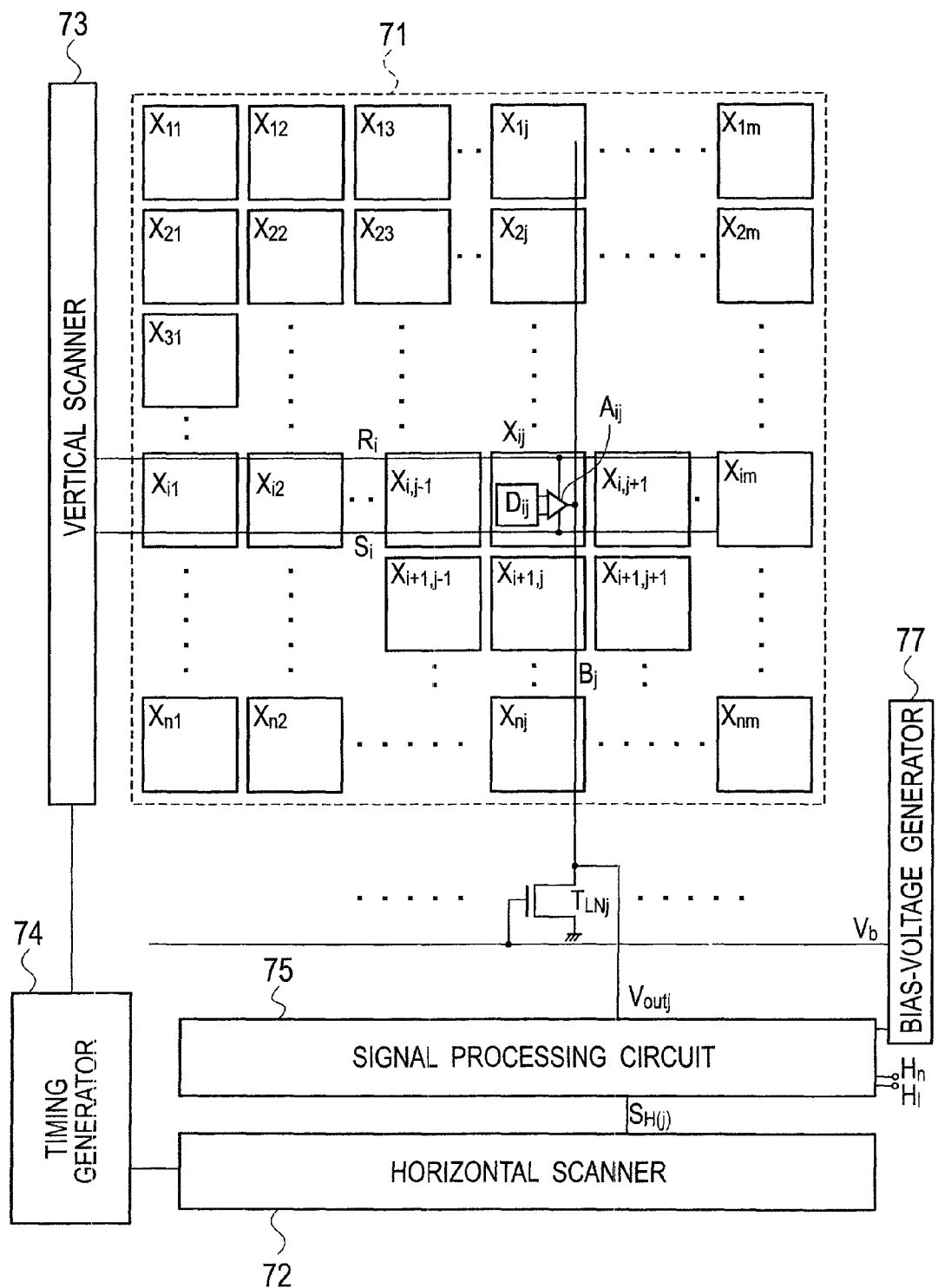
FIG. 42 is a schematic plan view illustrating the whole of a film-shaped electro-mechanical converter according to a twelfth embodiment of the present invention.
Figure 43:
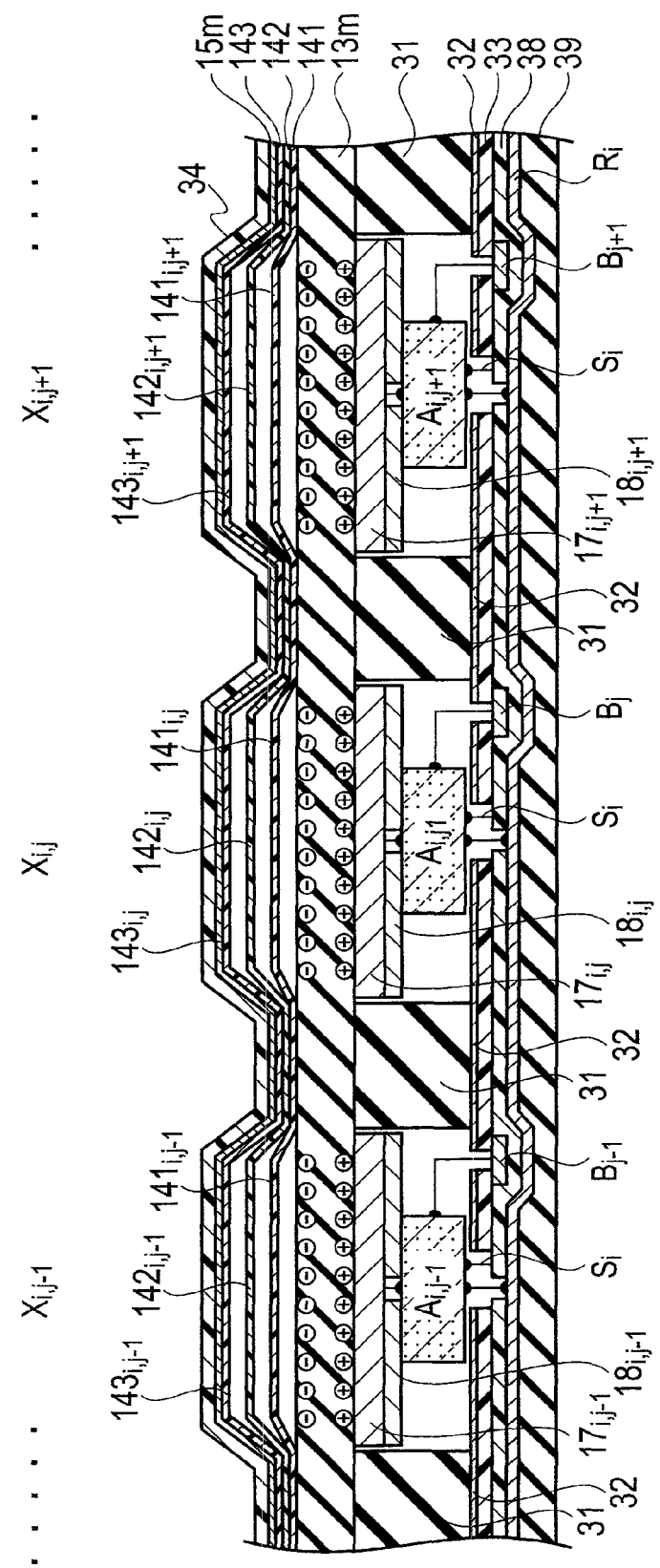
FIG. 43 is a schematic sectional view illustrating a structure of a part of elements of the film-shaped electro-mechanical converter according to the twelfth embodiment illustrated in FIG. 42.

In a film-shaped electro-mechanical converter (acoustic image sensor) according to a twelfth embodiment of the present invention, as illustrated in FIG. 42, a sensor array area 71 and peripheral circuit portions (72, 73, 74, 75 and 77) are integrated on the same polymer film. In the sensor array area 71, many elements $X_{ij}$ (i=1 to m; j=1 to n: each of the m and n is integer) are arrayed in a shape of a two-dimensional matrix and implement a rectangular sound-pressure distribution measurement area. Then, the vertical shift register (vertical scanner) 73 is merged through the timing generator 74 on the left side of the sensor array area 71, and horizontal shift register (horizontal scanner) 72 is merged on the lower side, and a bias-voltage generator 77 is merged on the lower right side of the sensor array area 71. In FIG. 42, its inner structure is exemplified only in the elements $X_{ij}$ on an i-th row and j-th column. However, the elements $X_{1l}$ to $X_{1m}$; $X_{2l}$ to $X_{2m}$; . . . ; $X_{i1}$ to $X_{im}$; . . . ; $X_{n1}$ to $X_{nm}$ contain sound pressure detecting devices $D_{1l}$ to $D_{1m}$; $D_{21}$ to $D_{2m}$; . . . $D_{i1}$ to $D_{im}$; . . . ; $D_{n1}$ to $D_{nm}$ and amplifiers (charge reading buffer amplifiers) $A_{1l}$ to $A_{1m}$; $A_{21}$ to $A_{2m}$; . . . ; $A_{il}$ to $A_{im}$; . . . ; $A_{n1}$ to $A_{nm}$, respectively, similarly to the elements $X_{ij}$ on the i-th row and j-th column. As illustrated in FIG. 43, The sound pressure detecting device $D_{ij}$ (i=1 to m; j=1 to n: each of the m and n is integer) encompasses a vibrating plate 15m; a polymer film 13m which is defined by a flat first principal surface facing to the vibration surface of the vibrating plate 15m, through a gap space, the thickness of the gap space is measured in a stacked structure implemented by a gap-insulating layer 141 of the first level layer, a gap-insulating layer 142 of the second level layer and a gap-insulating layer 143 of the third level layer, and a second principal surface facing in parallel to the first principal surface, the polarization directions are aligned in the polymer film 13m; and back electrodes $17_{ij-1}$, $17_{ij}$, $17_{ij+1}$, which are individually arranged correspondingly to the array of the $X_{ij-1}$, $X_{ij}$, $X_{ij+1}$, on the second principal surface of the polymer film 13m. A vibrating-plate-protection film 34 for protecting the vibrating plate 15m is laminated on the vibrating plate 15m.

As illustrated in FIG. 42, the elements $X_{ij}$ in the inside of the sensor array area 71 are sequentially scanned by the vertical shift register (vertical scanner) 73 driven by the timing generator 74, and horizontal shift register (horizontal scanner) 72 driven by the timing generator 74, and reading out operation of element signals is executed. That is, the film-shaped electro-mechanical converter according to the twelfth embodiment of the present invention is designed such that the sensor array area 71 is vertically scanned at the units of the respective element rows $X_{11}$ to $X_{1m}$; $X_{21}$ to $X_{2m}$; . . . ; $X_{i1}$ to $X_{im}$; . . . ; $X_{n1}$ to $X_{nm}$, and element signals of the respective element rows $X_{1l}$ to $X_{1m}$; $X_{2l}$ to $X_{2m}$; . . . ; $X_{i1}$ to $X_{im}$; . . . ; $X_{n1}$ to $X_{nm}$ are consequently read out by vertical signal lines $B_{j-1}$, $B_j$, $B_{j+1}$, . . . , which are provided on each of the element columns $X_{11}$ to $X_{n1}$; $X_{12}$ to $X_{n2}$; . . . ; $X_{1j}$ to $X_{nj}$; . . . ; $X_{1m}$ to $X_{nm}$, respectively (for simplicity, FIG. 42 illustrates only a vertical signal line A on the j-th column of the sensor array area 71 and the others are omitted).

As illustrated in FIG. 42, a constant current transistor $T_{LNj}$ serving as a common load is connected to the vertical signal line $B_j$ on the j-th column of the sensor array area 71. For example, a source follower circuit is implemented by an amplifier $A_{ij}$ on the ith row j-th column and the constant current transistor $T_{LNj}$, and an output $V_{outj}$ of the source follower circuit is read out to a column processing circuit on the j-th column. Although the illustration is omitted, other constant current transistors $T_{LN1}$, $T_{LN2}$, . . . $T_{LNj-1}$, $T_{LNj+1}$, . . . , $T_{LNm}$ serving as the common loads are similarly connected to the vertical signal lines $B_1$, $B_2$, . . . -, $B_{j-1}$, $B_{j+1}$, . . . $B_m$ on the other columns, respectively, and the source follower circuits are constituted. Then, the outputs $V_{out1}$, $V_{out2}$, . . . , $V_{outj-1}$, $V_{outj+1}$, . . . , $V_{outm}$ of the source follower circuits are read out to the column processing circuits on the respective columns.

So as to read out the signals from the respective elements $X_{11}$ to $X_{1m}$; $X_{21}$ to $X_{2m}$; . . . ; $X_{i1}$ to $X_{im}$; . . . ; $X_{n1}$ to $X_{nm}$, a signal processing circuit 75 is merged on the lower stage (output side) of the sensor array area 71. The element signals of the element column. $X_{11}$ to $X_{n1}$, which are read out through the vertical signal lines $B_1$ from the sensor array area 71, are sequentially supplied to the column processing circuit on the first column in the signal processing circuit 75, and a signal process is performed by the column processing circuit. Similarly, the element signals of the element column $X_{12}$ to $X_{n2}$ are sequentially supplied to the column processing circuit on the second ID column in the signal processing circuit 75, and a process for removing noises unique to the element is performed by the column processing circuit. The element signals of the element column $X_{1m}$ to $X_{nj}$ are sequentially supplied to the column processing circuit on the j-th column in the signal processing circuit 75, and signal process is performed by the column processing circuit. Also, the element signals of the element column $X_{1m}$ to $X_{nm}$ are sequentially supplied to the column processing circuit on the m-th column in the signal processing circuit 75, and signal process is performed by the column processing circuit.

In FIG. 43, focusing to the central element $X_{ij}$ (sound pressure detecting device $D_{ij}$), and explaining a cross section structure, in the sound pressure detecting device $D_{ij}$ implementing the film-shaped electro-mechanical converter (acoustic image sensor) according to the twelfth embodiment of the present invention, first spacers (illustration is omitted) implemented by particles of insulators having a particle diameter between ten nanometers and 40 micrometers are inserted between a gap-insulating layer $141_{ij}$ of the first level layer and a polymer film $13m$, and second spacers (illustration is omitted) implemented by particles of insulators having a particle diameter between ten nanometers and 40 micrometers are inserted between the gap-insulating layer $141_{ij}$ of the first level layer and a gap-insulating layer $142_{ij}$ of the second level layer, and third spacers (illustration is omitted) implemented by particles of insulators having a particle diameter between ten nanometers and 40 micrometers are inserted between the gap-insulating layer $142_{ij}$ of the second level layer and a gap-insulating layer $143_{ij}$ of the third level layer, and the interval of a gap defined between the vibrating electrode $15m$ and polymer film $13m$ is controlled. The gap-insulating layer $143_{ij}$ of the third level layer and vibrating electrode $15m$ are tightly joined, and the gap-insulating layer $143_{ij}$ of the third level layer carries out the function equivalent to that of the vibrating-electrode-insulating film of the film-shaped electro-mechanical converter (acoustic image sensor) according to the fifth embodiment. In this way, between the vibrating electrode $15m$ and the polymer film $13m$, the plurality of gap-insulating layers $141_{ij}$, $142_{ij}$, $143_{ij}$, . . . are laminated and inserted through the spacers (illustration is omitted) implemented by particles of insulators each having the particle diameter between ten nanometers and 40 micrometers. Consequently, microgaps are defined between the gap-insulating layer $143_{ij}$ of the third level layer and the gap-insulating layer $142_{ij}$ of the second level layer, between the gap-insulating layer $142_{ij}$ of the second level layer and the gap-insulating layer $141$; of the first level layer, and between the gap-insulating layer $141_{ij}$ of the first level layer and the polymer film $13m$, respectively, and respective intervals between the sound pressure detecting devices $D_{ij}$ are controlled.

When each diameter of the particles serving as the first to third spacers is elected to be 100 micrometers or less, the effective surface roughness $Ra_{eff}$ of the surfaces establishing each of the microgaps can be 1/10 or less of a gap width of the element-install cavity, which is defined for each element, between the bottom surface of the gap-insulating layer $143_{ij}$ of the third level layer and top surface of the polymer film $13m$ (the effective surface roughness $Ra_{eff}$ includes the bending under a loaded condition). However, in order to achieve the film-shaped electro-mechanical converter that is flexible and has a high degree of freedom in geometrical deformations, the diameter of the particles serving as each of the first to third spacers is elected to be ten nanometers to ten micrometers, which is preferable because the entire thickness becomes further thin. Moreover, in the range between ten nanometers and five micrometers, the particle diameter closer to ten nanometers is naturally desirable. Each of the back electrodes $17_{ij-1}$, $17_{ij}$, $17_{ij+1}$, . . . arranged separately from each other and the polymer film $13m$ may be metallurgically joined or may be adhered by adhesive agent and the like, or alternatively, may be merely brought into contact by the mechanical pressure.

The spacer film $31$ made of insulating material is bonded to at the bottom surface of the polymer film $13m$. Correspondingly to the array of the elements $X_{ij-1}$, $X_{ij}$, $X_{ij+1}$, . . . , hollow cavities are sequentially arranged in the spacer film $31$. Amplifiers (charge reading buffer amplifiers) $A_{ij-1}$, $A_{ij}$, $A_{ij+1}$, . . . are accommodated in the hollow cavities, respectively. The amplifiers $A_{ij-1}$, $A_{ij}$, $A_{ij+1}$, . . . are merged (mounted) on the circuit boards $18_{ij-1}$, $18_{ij}$, $18_{ij+1}$, . . . joined (merged) at the bottom surfaces of the back electrodes $17_{ij-1}$, $17_{ij}$, $17_{ij+1}$, . . . of the elements $X_{ij-1}$, $X_{ij}$, $X_{ij+1}$, . . . , respectively. The through holes (vias) are made in the circuit boards $18_{ij-1}$, $18_{ij}$, $18_{ij+1}$, . . . , , respectively. Through the respective through holes (vias), the amplifiers $A_{ij-1}$, $A_{ij}$, $A_{ij+1}$, . . . are electrically connected to the back electrodes $17_{ij-1}$, $17_{ij}$, $17_{ij+1}$ . . . through the connecting means such as solder balls that are fused ID and connected to the back electrodes $17_{ij-1}$, $17_{ij}$, $17_{ij+1}$, . . . , independently of each other.

A conductive (metallic) shielding-conductor film $32$ is laminated at the bottom surface of the spacer film $31$, and a shielding-conductor-protection film $33$ is laminated at the bottom surface of the shielding-conductor film $32$. Through the shielding-conductor-protection film $33$, the vertical signal lines $B_{j-1}$, $B_j$, $B_{j+1}$, . . . run in a direction vertical to a plane of paper. The vertical signal lines $B_{j-1}$, $B_j$, $B_{j+1}$, are connected to the amplifiers $41$, $A_{ij-1}$, $A_{ij}$, $A_{ij+1}$, . . . , of the corresponding columns, respectively. So as to cover the vertical signal lines $B_{j-1}$, $B_j$, $B_{j+1}$, . . . an inter-layer insulation film $38$ is laminated at the bottom surface of the shielding-conductor-protection film $33$. Through the inter-layer insulation film $38$, a reset signal wiring $R_i$ is arranged orthogonally to the amplifiers $A_{ij-1}$, $A_{ij}$, $A_{ij+1}$, . . . . Although the illustration is omitted on the sectional view, a vertical selection signal wiring Si runs orthogonally to the amplifiers $A_{ij-1}$, $A_{ij}$, $A_{ij+1}$, . . . at the deep rearward portion of the plane of paper (see FIG. 42). So as to cover the reset signal wiring $R_i$ and a vertical selection signal lines $S_i$ whose illustration is omitted, a passivation film $39$ is laminated on the inter-layer insulation film $38$.

Figure 44:
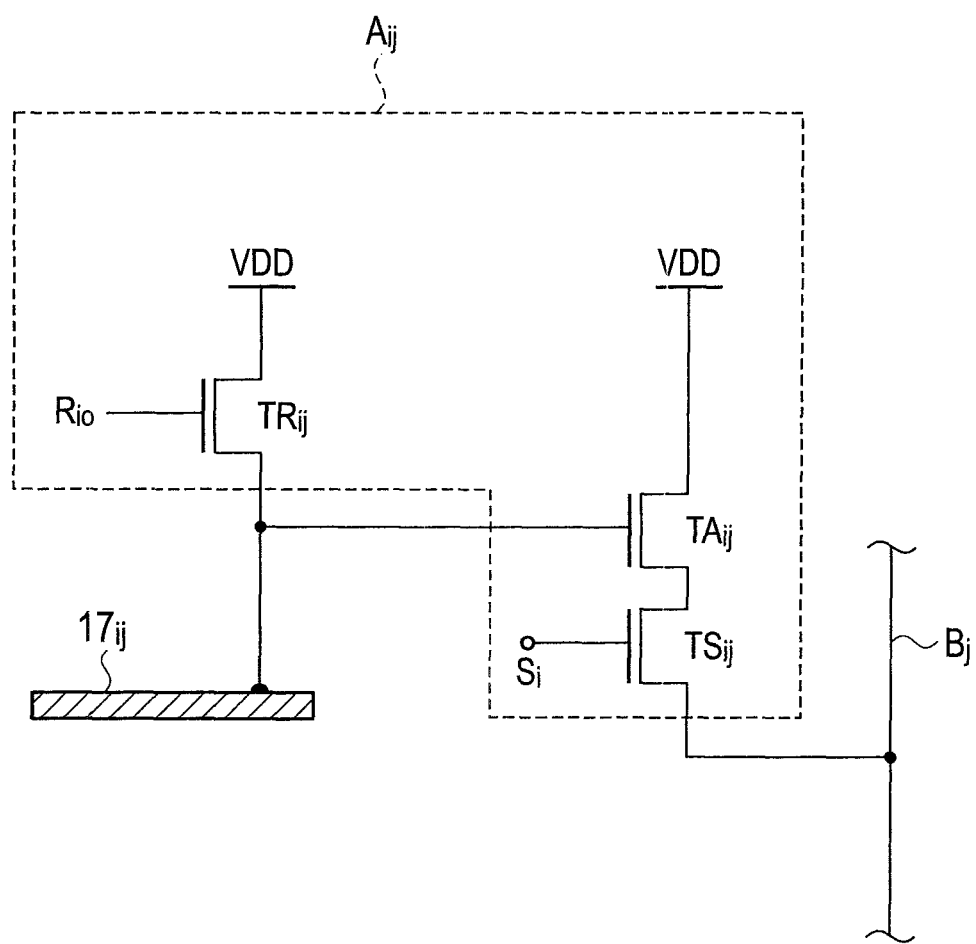
FIG. 44 is a circuit diagram illustrating a rough configuration of an amplifying circuit, which is assigned in each of the elements in the film-shaped electro-mechanical converter according to the twelfth embodiment.

FIG. 44 illustrates an example of the amplifier $A_{ij}$ arranged in the hollow cavity of the spacer film $31$, correspondingly to the array of the elements $X_{ij-1}$, $X_{ij}$, $X_{ij+1}$, . . . . As illustrated in FIG. 44, a gate electrode of a signal reading transistor (amplifying transistor) $TA_{ij}$ and a source electrode of a reset transistor $TR_{ij}$ are connected through the metallic wiring, which is fused with solder ball and the like, to the back electrode $17_{ij}$. Each of a drain electrode of the reset transistor $TR_{ij}$ and a drain electrode of the signal reading transistor (amplifying transistor) $TA_{ij}$ is connected to a power supply $V_{DD}$. A source electrode of the signal reading transistor (amplifying transistor) $TA_{ij}$ is connected to a drain electrode of a switching transistor $TS_{ij}$ for an element selection. With respect to a reset gate electrode of the reset transistor $TR_{ij}$, a potential of the reset signal wiring $R_i$ is set to a high (H) level (Ri="1"), and charges accumulated in the back electrode $17_{ij}$ are discharged respectively, and charges accumulated in the back electrode $17_{ij}$ are reset A source electrode of the switching transistor $TS_{ij}$ for the element selection is connected to the vertical signal line $B_j$ on j-th column. Selection signal is given to a gate electrode of the switching transistor $TS_{ij}$ from the vertical shift register (vertical scanner) $73$, when driven by the signal timing generator $74$, through the vertical selection signal wiring $S_i$ on the horizontal line of i-th row.

In the topology of the vertical signal line $B_j$ illustrated in FIG. 44, a signal for setting the vertical selection signal wiring Si on i-th row to the high level ($S_i$="1") is applied to the gate electrode of the switching transistor $TS_{ij}$ for the element selection in the amplifier Aij, and switching transistor $TS_{ij}$ is turned on. Also, a constant voltage Vb is applied from the bias-voltage generator $77$ to the gate electrode of the constant current transistor $T_{LNj}$. Consequently, the charges that are amplified by the signal reading transistor (amplifying transistor) $TA_{ij}$ and accumulated in the back electrode $17_{ij}$ are read out as the output $V_{outj}$ of the source follower circuit to outside the sensor array area $71$.

As illustrated in FIG. 43, when the amplifiers $A_{ij-1}$, $A_{ij}$, $A_{ij+1}$, . . . , are arranged under the independent elements $X_{ij-1}$, $X_{ij}$, $X_{ij+1}$, . . . and outputs are extracted, separate outputs from the sound pressure detecting devices $D_{ij-1}$, $D_{ij}$, $D_{ij+1}$, . . . in the respective elements $X_{ij-1}$, $X_{ij}$, $X_{ij+1}$, . . . can be obtained, thereby knowing the sound-pressure distribution.

Also, when the film-shaped electro-mechanical converter according to the twelfth embodiment is used as a pressure sensor, it is possible to measure a pressure fluctuation distribution of 10 Hz or more. The film-shaped electro-mechanical converter according to the twelfth embodiment becomes a helpful inspection tool, because the reflection and propagation of the vibrations can be made into a visible image, when the vibration characteristics of the target material having a material-quality distribution, for example, such as wood, are measured.

By the way, although the explanation of the twelfth embodiment exemplified the two-dimensional array (area sensor), in the two-dimensional matrix illustrated in FIG. 42, with j=m=1, a plurality of elements may be one-dimensionally arrayed, as easily understood from the content of the above disclosure.

Thirteenth Embodiment

As illustrated in FIG. 45(b), a microgap of a film-shaped electro-mechanical converter according to a thirteenth embodiment of the present invention is so established that a polymer film 61b (see FIG. 46) including a plurality of independent bubbles 62 is inserted into an element-install cavity defined between a vibrating electrode 15b and an electret layer 13.

Figure 45:
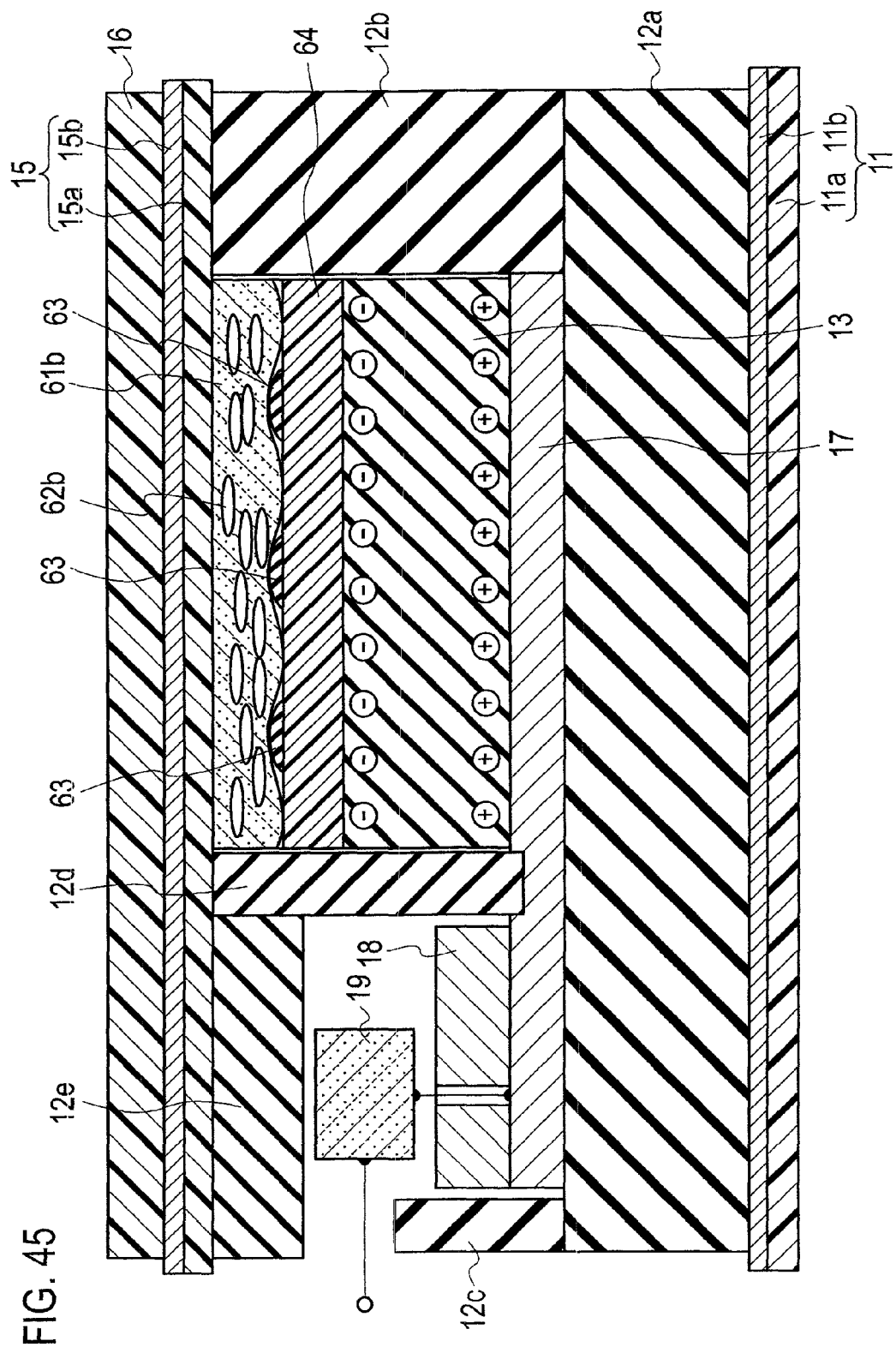
FIG. 45 is a schematic sectional view illustrating a rough configuration of a film-shaped electro-mechanical converter according to a thirteenth embodiment of the present invention.

Namely, as illustrated in FIG. 45, the film-shaped electro-mechanical converter according to the thirteenth embodiment of the present invention encompasses the vibrating electrode 15b; the electret layer 13 facing to the vibrating electrode 15b with an element-install cavity provided in between the vibrating electrode 15b and the electret layer 13; a back electrode 17 in contact with the bottom surface of the electret layer 13; an electret-insulating layer 64 laminated on the top surface of the electret layer 13; the polymer film 61b provided with the plurality of independent bubbles 62b that is provided between the vibrating-electrode-insulating film 15a and electret-insulating layer 64; and an amplifying circuit (semiconductor chip) 19 electrically connected between the vibrating electrode 15b and back electrode 17. The vibrating plate 15 has the flat vibration surface under no load condition. A plurality of protrusions 63 are provided at the top surface of the electret-insulating film 64. The polymer film 61b is laminated on the top surface of electret-insulating layer 64 through the plurality of protrusions 63. The interval between the plurality of protrusions 63 may be, for example, about one to three millimeters. Each height of the plurality of protrusions 63 may be, for example, five to 20 micrometers. Each curvature of the plurality of protrusions 63 may be, for example, about 15 to 35 millimeters. Alternatively, another polymer film 61a including independent bubbles 62a as illustrated in FIG. 47 may be inserted between the vibrating-electrode-insulating film 15a and electret-insulating layer 64.

As illustrated in FIG. 45, the polymer film 61b provided with the plurality of independent bubbles 62b is accommodated in the inside of a box-shaped inner insulation container (12b, 12d), and the vibrating plate 15 serves as the cover of the inner insulation container (12b, 12d), and the back electrode 17 serves as the bottom plate of the inner insulation container (12b, 12d). Moreover, the structure in which the polymer film 61b provided with the plurality of independent bubbles 62b, which is accommodated in the inside of the inner insulation container (12b, 12d), is further accommodated in the inside of an outer insulation container (12a, 12b, and 12c) together with the amplifying circuit 19, and the spacer film 12a made of insulating material can be used as a bottom plate of the outer insulation container (12a, 12b, and 12c). The vibrating plate 15 serves as the cover of the outer insulation container (12a, 12b and 12c). A conductive (metallic) shielding-conductor film 11b is laminated on the bottom of the outer insulation container (12a, 12b and 12c), and a shielding-conductor-protection film 11a is laminated on the bottom of the shielding-conductor film 11b. The shielding-conductor-protection film 11a and the shielding-conductor film 11b implement a shield plate 11. Each thickness of the spacer film 12a and the shielding-conductor-protection film 11a can be set to the value of about five to 150 micrometers, preferably about 50 to 100 micrometers. The amplifying circuit 19 is merged (mounted) on a circuit board 18, in the vicinity of the left end of the back electrode 17. A through hole (via) is provided in the circuit board 18, and through the through hole (via), the amplifying circuit 19 is electrically connected to the back electrode 17 through a solder that is fused and connected to the vicinity of the left end of the back electrode 17. Although the illustration is omitted, a ground wiring being extended from the amplifying circuit 19 is connected to the shielding-conductor film 11b of the shield plate 11 through solder.

Figure 46:
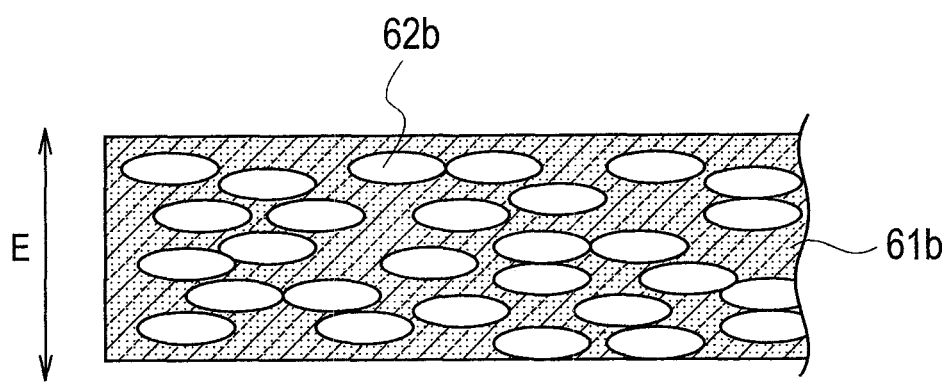
FIG. 46 is a schematic sectional view illustrating a structure of a microgap used in the film-shaped electro-mechanical converter according to the thirteenth embodiment of the present invention.
Figure 47:
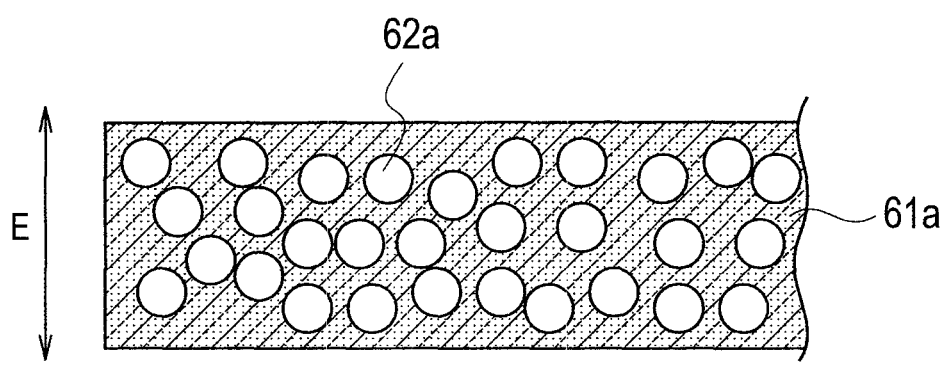
FIG. 47 is a schematic sectional view illustrating another structure of the microgap used in the film-shaped electro-mechanical converter according to the thirteenth embodiment of the present invention.

As for the sizes of the polymer films 61b, 61a, which are respectively provided with the plurality of independent bubbles 62b, 62a as illustrated in FIGS. 46 and 47, it is preferable to employ the dimension and topology that can establish air gaps separated at the length between ten nanometers and 40 micrometers in the direction of electric field E, similarly to the particle diameter of the particles and height of the protrusions. In particular, as for the configuration illustrated in FIG. 46, a PP film as the polymer film 61b is stretched so that independent bubbles 62b, having sizes in which the vertical direction as the direction of the electric field E is about one micrometer and horizontal direction is between about ten nanometers and 40 micrometers, are foamed, thereby producing a porous film. As far as air gaps that are separated at the length between ten nanometers and 40 micrometers in the direction of the electric field E can be established, it is allowable to use a topology such that the plurality of independent bubbles are mated together along the horizontal direction (the direction vertical to the electric field E from the electret) so as to establish a continuous space.

Usually, when a film is stacked on the protrusions 63 and the electrostatic force is applied to the film surface, the film will bent. However, as illustrated in FIGS. 46 and 47, in the porous substance such as the polymer films 61b, 61a provided with the many independent bubbles 62b, 62a, although planes in contact with the protrusions 63 is largely bent, the bending is absorbed in the inside of the polymer films 61b, 61a, and the other planes that are not in contact with the protrusions 63 are little bent. Using this phenomenon, the deformation of the microphone resulting from the protrusions 63 can be enlarged, while the central line average roughness Ra of the vibrating electrode 15b is being suppressed to be 1/10 or less of the gap width defined between the bottom surface of the vibrating electrode 15b and top surface of the electret layer 13. The above porous substance provided with the plurality of independent bubbles 62b, 62a can be fabricated by adding a foaming agent to a thermo plastic such as polypropylene (PP) and the like, and thereafter, melting, foaming, and stretching the thermo plastic.

The manufacturing method of the film-shaped electro-mechanical converter according to the thirteenth embodiment is basically similar to the manufacturing method of the film-shaped electro-mechanical converter pertaining to the fifth embodiment illustrated in FIG. 23 to FIG. 28.

(a) At first, on a shielding-conductor-protection film 11a such as PVC film and the like, an aluminum (Al) film serving as a shielding-conductor film 11b is deposited so as to implement a shield plate 11. The shield plate 11 is bonded to the rear surface of a spacer film 12a made of insulating material. Moreover, after the Al film is bonded to the top surface of the spacer film 12a, the Al film is delineated so as to form a back electrode 17. On a part of the back electrode 17, a shallow groove 17g is cut as illustrated in FIG. 23. Then, as illustrated in FIG. 23, a PTFE film with a thickness of 25 micrometers is bonded to a part of the back electrode 17. After the PTFE film is bonded to the back electrode 17, as illustrated in FIG. 24, the PTFE film is electrified by corona discharge.

(b) Then, as illustrated in FIG. 25, while the spacer film 12a made of insulating material can be used as the bottom plate, the side-wall films 12b, 12d serving as the side-plate blocks of a box are arranged around the PTFE film, and a box-shaped insulation container (12a, 12b, 12d and 12e) is assembled. At this time, the insulating layer 12d attached with a canopy top 12e is fitted into the shallow groove 17g formed in a part of the back electrode 17.

(c) In the inside of the box-shaped insulation container (12a, 12b, 12d and 12e), another PTFE film with a thickness of 25 micrometers is laminated as the electret-insulating layer 64 on the electret layer 13. Then, the plurality of protrusions 63 implemented by particles made of boron nitride are formed on the top surface of the electret-insulating layer 64 by spray coating. The interval between the plurality of protrusions 63 may be set to, for example, about two millimeters, each height of the plurality of protrusions 63 may be set to, for example, about ten micrometers, and each curvature of the plurality of protrusions 63 may be set to, for example, about 25 millimeters. Then, similarly to the configuration illustrated in FIG. 26, a stacked structure in which a PTFE film 61b having a thickness of about 50 micrometers is stacked is accommodated via the plurality of protrusions 63 on the electret-insulating layer 64.

(d) Meanwhile, on the PFA film as the vibrating-electrode-insulating film 15a, an Al film as a vibrating electrode 15b is deposited so as to form a vibrating plate 15. Moreover, on the vibrating electrode 15b, a vibrating-plate-protection film 16 made of a PVC film is bonded as the top cover of the Insulation container (12a, 12b, 12d and 12e), similarly to the configuration illustrated in FIG. 27.

(e) Separately, such as ball grid array and the like, on a circuit board 18 that has connectors at the bottom of the board, an amplifying circuit 19 in which an amplifier (FET) is integrated is merged (mounted), thereby preparing a mounted structure (package) of the amplifier. The electrodes of the amplifier integrated in the amplifying circuit 19 are electrically connected to the connection electrodes, such as the solder ball and the like, on the rear surface of the circuit board 18, through the inner wirings and through holes (vias) provided in the circuit board 18 and surface wiring delineated on the surface of the circuit board 18. The mounted structure (package) of the amplifier is accommodated under the canopy top 12e of the box-shaped insulation container (12a, 12b, 12d and 12e), similarly to the configuration illustrated in FIG. 28. When the mounted structure (package) is accommodated under the canopy top 12e of the box-shaped insulation container (12a, 12b, 12d and 12e), similarly to the configuration illustrated in FIG. 20, the insulating block 12c is inserted under the canopy top 12e. Then, when the cover is put on the portion for storing the mounted structure (package), the film-shaped electro-mechanical converter according to the thirteenth embodiment is completed.

Alternatively, a foamed PP film can be used, substantially similar to the above (a) to (c), as the polymer film 61b provided with the plurality of independent bubbles 62b. That is, with biaxially-stretching work, the foamed PP film (having a thickness of 50 micrometers) may be prepared, and an Al film is deposited on the foamed PP film as a vibrating electrode 15b. Meanwhile, negative charges are generated on a PTFE film (having a thickness of 25 micrometers) by corona discharge so as to implement an electret layer 13, and a different PTFE film (having a thickness of 25 micrometers) may be laminated as an electret-insulating layer 64 on the electret layer 13. Thereafter, when the separately prepared polymer film 61b is laminated on the electret-insulating layer 64, the film-shaped electro-mechanical converter having no protrusion can be manufactured as illustrated in FIG. 48.

Figure 48:
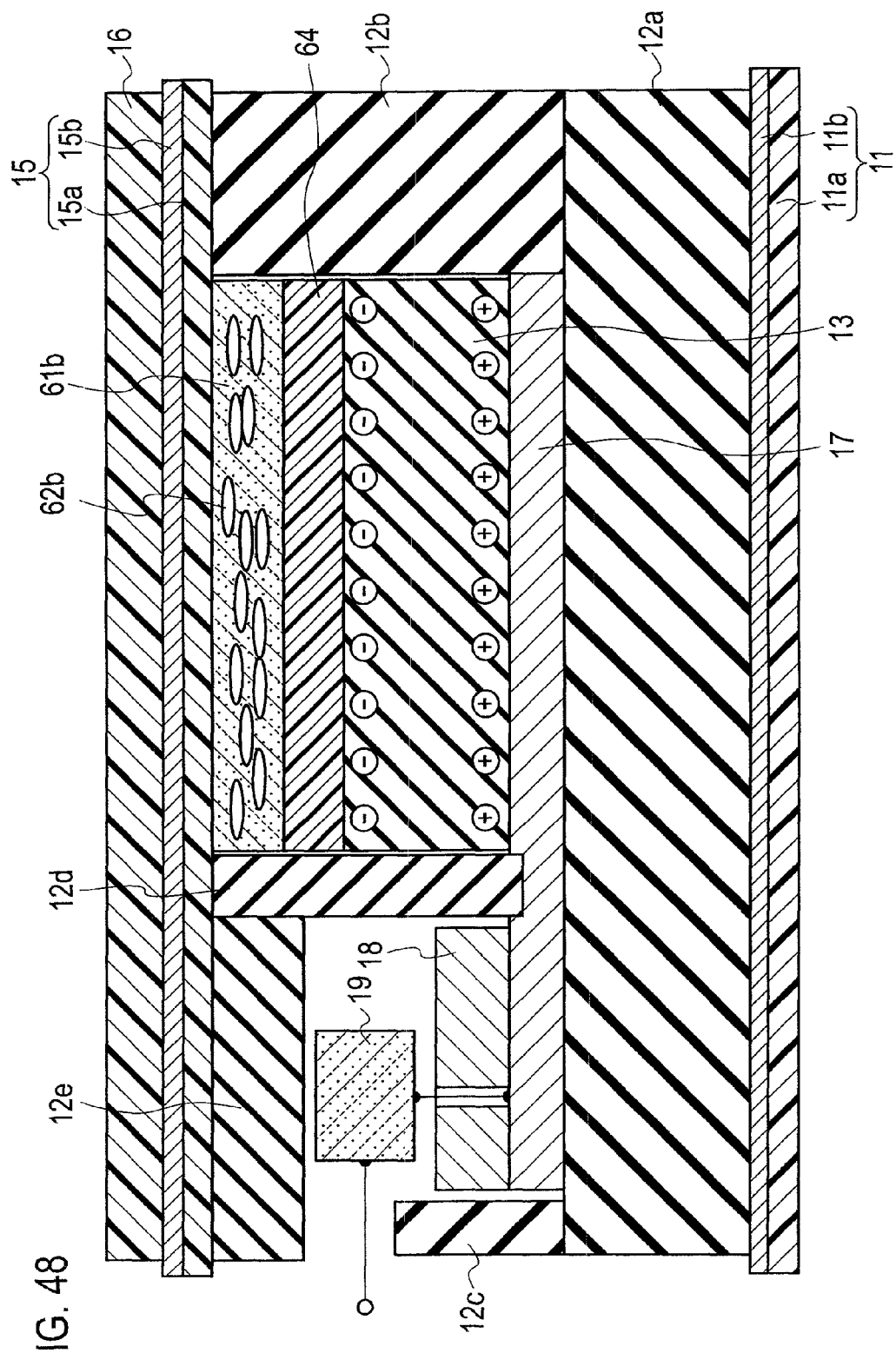
FIG. 48 is a schematic sectional view illustrating a rough configuration of the film-shaped electro-mechanical converter according to the thirteenth embodiment of the present invention, in a scheme such that there is no protrusion.
Figure 49:
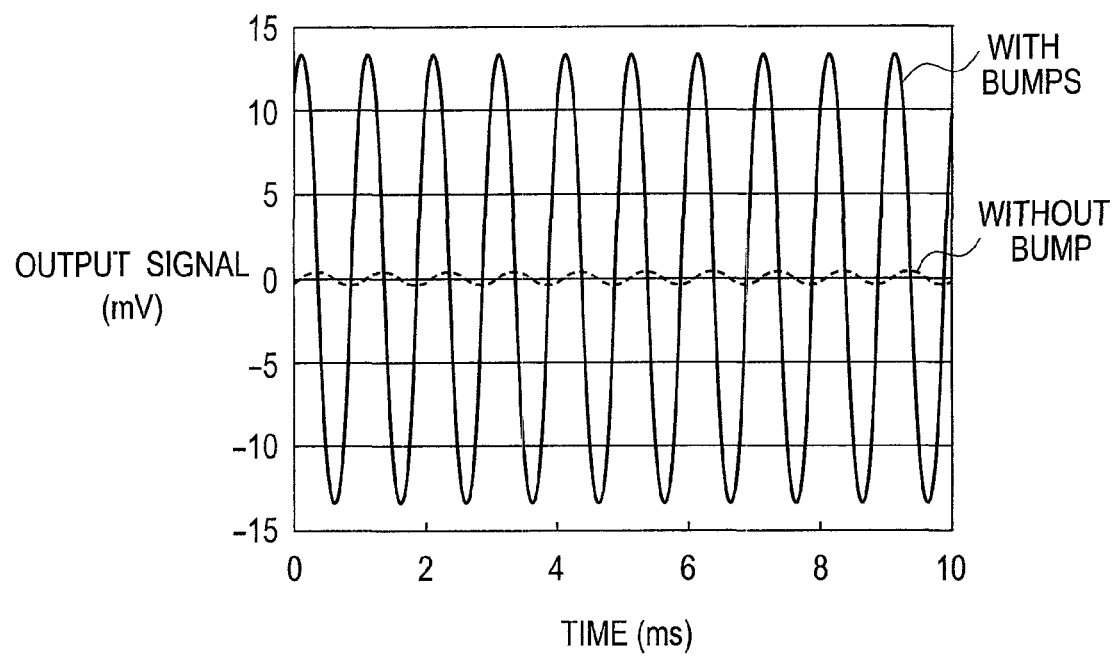
FIG. 49 is a view illustrating output voltages when an acoustic wave of 1 kHz is irradiated to the film-shaped electro-mechanical converter according to the thirteenth embodiment of the present invention, in which protrusions are provide, comparing with a case, in which no protrusion is provided.

The dashed line in FIG. 49 illustrates an output voltage from the configuration of the film-shaped electro-mechanical converter having no protrusion as illustrated in FIG. 48, and solid line in FIG. 49 illustrates an output voltage from the configuration of the film-shaped electro-mechanical converter having the plurality of protrusions 63 as illustrated in FIG. 45 (protrusion interval is two millimeters, protrusion height is ten micrometers, and protrusion curvature is 25 millimeters), when an acoustic wave of 1 kHz is irradiated to each of the above film-shaped electro-mechanical converters. In the film-shaped electro-mechanical converter having the plurality of protrusions 63 as illustrated in FIG. 45, it can be understood that the output voltage is largely improved and deformation caused by the plurality of protrusions 63 contributes to a large improvement of the output voltage.

In the film-shaped electro-mechanical converter according to the thirteenth embodiment, the gap width is 75 micrometers, and when each height of the plurality of protrusions 63 is assumed to be ten micrometers, the height exceeds 1/10 of the gap width. However, since the bending caused by the protrusions 63 is absorbed in the inside of the polymer film 61b, the central line average roughness Ra of the vibrating electrode 15b is suppressed to be 1/10 or less of the gap width.

Other Embodiments

As mentioned above, the present invention has been described by using the first to thirteenth embodiments. However, the discussions and drawings that constitute a part of this disclosure should not be understood to limit the present invention. From this disclosure, the various implementations, variations, embodiments and operational techniques may be evident for one skilled in the art.

Figure 50:
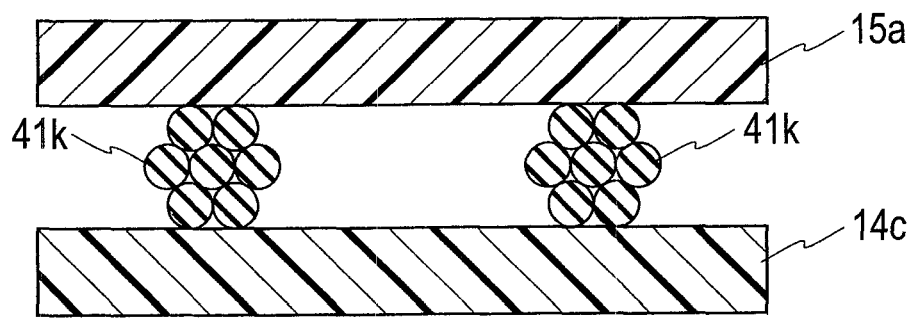
FIG. 50 is a schematic sectional view illustrating a structure of a microgap of a film-shaped electro-mechanical converter according to another embodiment of the present invention.
Figure 51:
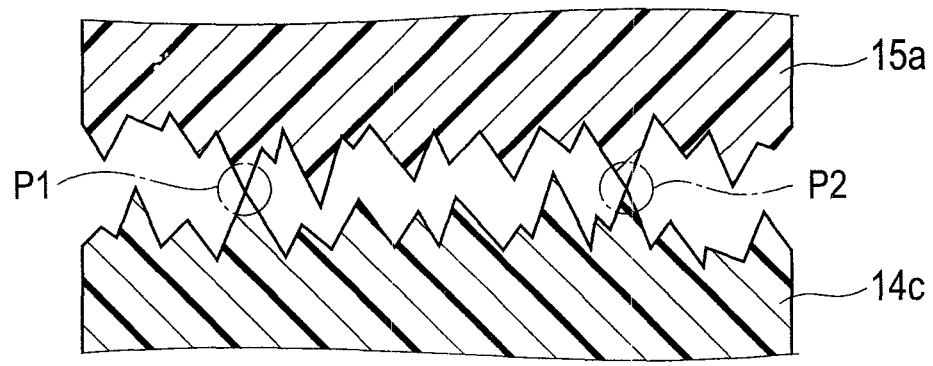
FIG. 51 is a schematic sectional view illustrating another structure of microgap of a film-shaped electro-mechanical converter according to still another embodiment of the present invention.

For example, as configurations of the microgaps, in addition to those described in the first to thirteenth embodiments, it is possible to employ those configurations illustrated in FIGS. 50 to 54. That is, as illustrated in FIG. 50, it is possible to employ a structure in which minute nano-particles are aggregated. When the structure illustrated in FIG. 50 is used, the diameter of the contact point can be reduced to a very small value. Also, as illustrated in FIG. 51, it is possible to employ a structure in which the surface roughness of the film is used to form the microgap. When the structure illustrated in FIG. 51 is used, the microgap can be formed easier than other methodologies. However, in the case of the structure illustrated in FIG. 51, it is difficult to control the average interval between the contact points.

Figure 52:
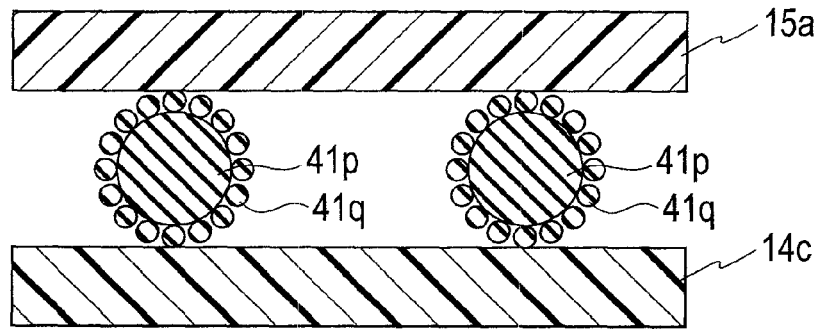
FIG. 52 is a schematic sectional view illustrating still another structure of microgap of a film-shaped electro-mechanical converter according to still another embodiment of the present invention.

Moreover, as illustrated in FIG. 52, it is possible to employ a structure in which nano-particles are aggregated on the surface of the particle of a micron size. When the structure illustrated in FIG. 52 is used, it is possible to expect the same effect as the effect of FIG. 50 while the gap width is enlarged to the micron size. Moreover, as illustrated in FIG. 53, it is possible to employ a structure in which the surface roughness is periodically changed by polishing, etching and the like.

Figure 53:
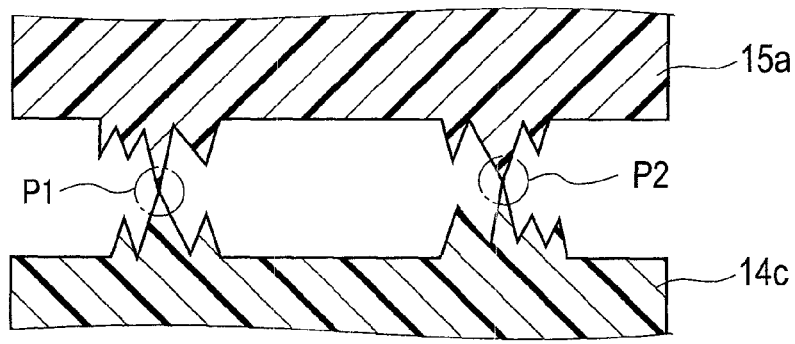
FIG. 53 is a schematic sectional view illustrating yet still another structure of microgap of a film-shaped electro-mechanical converter according to yet still another embodiment of the present invention.

When the structure illustrated in FIG. 53 is used, the control of the average interval between the contact points becomes easier than that of FIG. 51.

Figure 54:
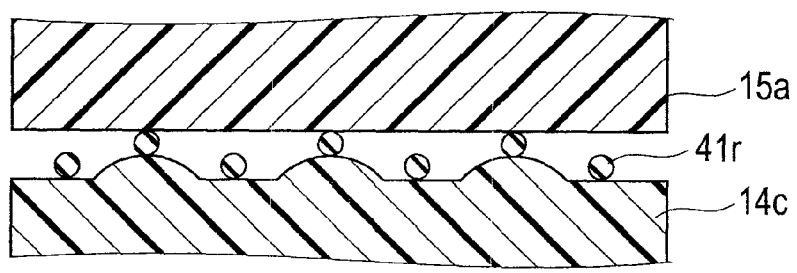
FIG. 54 is a schematic sectional view illustrating further another structure of microgap of a film-shaped electro-mechanical converter according to further another embodiment of the present invention.

Moreover, as illustrated in FIG. 54, it is possible to employ a structure in which by pressing work, a plurality of protrusions are formed at a surface of a film at an interval between ten micrometers and one millimeter, and thereafter, particles are coated the surface of the film. According to the structure illustrated in FIG. 54, it is possible to enlarge the interval between the contact points easily.

In the film-shaped electro-mechanical converters, which are illustrated in FIG. 20 in the fifth embodiment or in FIG. 32 in the seventh embodiment, a transparent electrode and a transparent polymer film can be used to manufacture a transparent film-shaped electro-mechanical converter. For example, as the vibrating-plate-protection film 16, the vibrating-electrode-insulating film 15a and the spacer film 12a, widely used transparent resin such as polyethylene resin and the like can be used. As the polymer film and the gap-insulating layers 14a, 14b and 14c, the fluorine transparent resin such as PFA and the like can be used. And as the vibrating electrode 15b and the back electrode 17, transparent electrode material, such as tin doped indium oxide ($In_2O_3$) film (ITO), indium (In) doped zinc oxide (ZnO) film (IZO), gallium (Ga) doped zinc oxide film (GZO), tin oxide film ($SnO_2$), conductive polymer films and the like can be used. Consequently, the transparent film-shaped electro-mechanical converter can be provided. Also, although the flexibility is poor, as the polymer film, it is possible to use the transparent ferroelectric material such as $LiNbO_3$, $LiTaO_3$, PLZT and the like.

Similarly, when the transparent electrode and the transparent polymer film are applied to the film-shaped electro-mechanical converter (acoustic image sensor) according to the twelfth embodiment, whose sectional structure is illustrated in FIG. 43, a transparent film-shaped electro-mechanical converter (acoustic image sensor) can be provided. In order to achieve the transparent film-shaped electro-mechanical converter (acoustic image sensor), it is required that the amplifiers $A_{ij-1}, A_{ij}, A_{ij+1}, \ldots$ shall be located in the outer edge of the film-shaped electro-mechanical converter (acoustic image sensor), and a wiring pattern shall be formed so as to electrically conduct with the inner electrode films (back electrodes) $17_{ij-1}, 17_{ij}, 17_{ij+1}$, and with the corresponding amplifiers $A_{ij-1}, A_{ij}, A_{ij+1}, \ldots$.

In addition, as described already, because the film-shaped electro-mechanical converter according to the twelfth embodiment can transmit and receive the acoustic wave, the film-shaped electro-mechanical converter according to the twelfth embodiment can be applied to a touch panel for example. As to the touch panels, although there are various configurations, in a next generation touch panel, such operations that, when a finger is brought into contact with the panel, not only its position is detected, but also the contact of the finger can be transmitted to human by using the vibration and the like are required. When the film-shaped electro-mechanical converter according to the twelfth embodiment illustrated in FIG. 43 is used as the touch panel, electric pulse signals are sent to the respective elements $X_{ij-1}$, $X_{ij}$, $X_{ij+1}, \ldots$, and minute vibrations are generated in the respective elements $X_{ij-1}$, $X_{ij}$, $X_{ij+1}, \ldots$, and the vibration of the panel caused thereby is again measured by the film-shaped electro-mechanical converter (acoustic image sensor). Consequently, when the finger is brought into contact, the change in the local vibration distribution of the panel can be detected, thereby detecting the contact. Moreover, at that time, when different electric pulse signals are sent to the respective elements $X_{ij-1}$, $X_{ij}$, $X_{ij+1}, \ldots$ so that vibration having a magnitude that can be sensed by the finger can be excited, the contact of the finger can be transmitted to human. As a method of transmitting the contact of the finger, there is a method of using a piezoelectric device and generating a surface acoustic wave on the panel. However, when a droplet and a dust and the like are adhered on the touch panel, the propagation state is changed, which disables the vibration to be accurately transmitted. Also, even depending on the assembled condition of the panel, because the propagation state of the surface acoustic wave will change, careful attention shall be paid when the panel is assembled into a product, at the time of manufacturing. By contrast, the film-shaped electro-mechanical converter according to the twelfth embodiment illustrated in FIG. 43 will not suffer from the influences of the droplet, the dust and the assembled condition, because only the place at which the finger is brought into contact can be selectively vibrated.

By the way, in the first to thirteenth embodiments, the diameter of the particles of insulators and the height of the protrusions, the particles and serving the protrusions serve as the spacers, are preferred to be ten nanometers and 40 micrometers. However, for an object in which the flexibility and degrees of freedom in geometrical deformations are not required, such as a situation when the electro-mechanical converter is bonded to a window glass, the diameter of the particles of insulators or the height of the protrusions may be about ten nanometers to 100 micrometers.

In this way, the present invention may naturally include the various implementations and embodiments that are not described herein. Therefore, the technical scope of the present invention should be defined only by subject matters for specifying the invention prescribed by appended Claims, which can be construed appropriate according to the above description.

INDUSTRIAL APPLICABILITY

Because the electro-mechanical transducers of the present invention and the electro-mechanical converters using the electro-mechanical transducers are flexible, have a high degree of freedom in geometrical deformations, have a high sensitivity, can endure a strong sound pressure and can convert mechanical vibrations into electric signals in a wide frequency band, they can be applied in various technical fields of mobile telephones, acoustic equipments, hydrophones, electric power generation devices and the like.

The invention claimed is:

1. An electro-mechanical transducer comprising:
   a vibrating electrode having a flat vibration surface under no load condition;
   a vibrating-plate-insulating layer disposed at a bottom surface of said vibrating electrode;
   an electret layer facing to the vibrating electrode; and
   a back electrode in contact with a bottom surface of the electret layer,
   wherein a microgap between ten nanometers and 100 micrometers is established between the vibrating-plate-insulating layer and the electret layer, and a central line average roughness Ra of the vibrating electrode, including a bending under a loaded condition, is 1/10 or less of a gap width measured between the bottom surface of the vibrating electrode and a top surface of the electret layer.

2. An electro-mechanical transducer comprising:
   a vibrating electrode having a flat vibration surface under no load condition;
   an electret layer facing to the vibrating electrode;
   an electret-insulating layer joined to a top surface of the electret layer; and a back electrode in contact with a bottom surface of the electret layer, wherein a microgap between ten nanometers and 100 micrometers is established between the vibrating electrode and the electret-insulating layer, and a central line average roughness Ra of the vibrating electrode, including a bending under a loaded condition, is 1/10 or less of a gap width measured between a bottom surface of the vibrating electrode and the top surface of the electret layer.

3. An electro-mechanical transducer comprising:

a vibrating electrode having a flat vibration surface under no load condition;

a vibrating-plate-insulating layer disposed at a bottom surface of the vibrating electrode;

an electret layer facing to the vibrating electrode;

an electret-insulating layer joined to a top surface of the electret layer; and a back electrode in contact with a bottom surface of the electret layer, wherein a microgap between ten nanometers and 100 micrometers is established between the vibrating-plate-insulating layer and the electret-insulating layer, and a central line average roughness Ra of the vibrating electrode, including a bending under a loaded condition, is 1/10 or less of a gap width measured between the bottom surface of the vibrating electrode and the top surface of the electret layer.

4. The electro-mechanical transducer according to claim 1, wherein the microgap is controlled by a height of a protrusion, which is provided as a spacer at a bottom surface of the vibrating-plate-insulating layer.

5. The electro-mechanical transducer according to claim 2, wherein the microgap is controlled by a height of a protrusion, which is provided as a spacer at a top surface of the electret-insulating layer.

6. The electro-mechanical transducer according to claim 1, wherein the microgap is controlled by a diameter of a particle, which is provided as a spacer between the vibrating-plate-insulating layer and the electret layer.

7. The electro-mechanical transducer according to claim 2, wherein the microgap is controlled by a diameter of a particle, which is provided as a spacer between the vibrating electrode and the electret-insulating layer.

8. The electro-mechanical transducer according to claim 3, wherein the microgap is controlled by a diameter of a particle, which is provided as a spacer between the vibrating-plate-insulating layer and the electret-insulating layer.

9. The electro-mechanical transducer according to claim 3, wherein the microgap is controlled by a thickness of a spacer layer that has a plurality of penetration holes, the spacer layer is inserted between the vibrating-plate-insulating layer and the electret-insulating layer.

10. The electro-mechanical transducer according to claim 1, further comprising a spacer ring that surrounds the microgap, the spacer ring is inserted between the vibrating-plate-insulating layer and the electret layer in a periphery of the microgap.

11. The electro-mechanical transducer according to claim 2, further comprising a spacer ring that surrounds the microgap, the spacer ring is inserted between the vibrating electrode and the electret-insulating layer in a periphery of the microgap.

12. The electro-mechanical transducer according to claim 3, further comprising a spacer ring that surrounds the microgap, the spacer ring is inserted between the vibrating-plate-insulating layer and the electret-insulating layer in a periphery of the microgap.

13. The electro-mechanical transducer according to claim 1, further comprising a matching layer configured to increase matching characteristics of acoustic impedance, the matching layer is provided on a top surface of the vibrating electrode.

14. The electro-mechanical transducer according to claim 1, wherein the electret layer is a single crystalline ferroelectric material, a polycrystalline ferroelectric material or a crystalline polymer film.

* * * * *